United States Patent
Trikha et al.

(10) Patent No.: US 11,454,854 B2
(45) Date of Patent: *Sep. 27, 2022

(54) DISPLAYS FOR TINTABLE WINDOWS

(71) Applicant: View, Inc., Milpitas, CA (US)

(72) Inventors: Nitesh Trikha, Pleasanton, CA (US);
Stephen Clark Brown, San Mateo, CA (US); Dhairya Shrivastava, Los Altos, CA (US); Robert T. Rozbicki, Saratoga, CA (US)

(73) Assignee: View, Inc., Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/578,218

(22) Filed: Jan. 18, 2022

(65) Prior Publication Data
US 2022/0179274 A1 Jun. 9, 2022

Related U.S. Application Data

(63) Continuation of application No. 17/338,562, filed on Jun. 3, 2021, now Pat. No. 11,231,633, which is a
(Continued)

(51) Int. Cl.
*G02F 1/15* (2019.01)
*G02F 1/163* (2006.01)
(Continued)

(52) U.S. Cl.
CPC ........ *G02F 1/163* (2013.01); *B32B 17/10513* (2013.01); *E06B 9/24* (2013.01);
(Continued)

(58) Field of Classification Search
CPC . G02F 1/163; G02F 1/15; G02F 1/155; B32B 17/10513; B32B 2419/00;
(Continued)

(56) References Cited

U.S. PATENT DOCUMENTS

| 2,756,467 A | 7/1956 | Oliver et al. |
| 3,971,178 A | 7/1976 | Mazzoni et al. |

(Continued)

FOREIGN PATENT DOCUMENTS

| CN | 2590732 Y | 12/2003 |
| CN | 101501757 A | 8/2009 |

(Continued)

OTHER PUBLICATIONS

"SageGlass helps Solar Decathlon-and AIA award-winning home achieve net-zero energy efficiency" in MarketWatch.com, http://www.marketwatch.com/story/sageglass-helps-solar-decathlon-and-aia-award-winning-home-achieve-net-zero-energy-efficiency-2012-06-07, Jun. 7, 2012.

(Continued)

*Primary Examiner* — William Choi
(74) *Attorney, Agent, or Firm* — Weaver Austin Villeneuve & Sampson LLP; Ryan Otis

(57) ABSTRACT

A tintable window is described having a tintable coating, e.g., an electrochromic device coating, for regulating light transmitted through the window. In some embodiments, the window has a transparent display in the window's viewable region. Transparent displays may be substantially transparent when not in use, or when the window is viewed in a direction facing away from the transparent display. Windows may have sensors for receiving user commands and/or for monitoring environmental conditions. Transparent displays can display graphical user interfaces to, e.g., control window functions. Windows, as described herein, offer an alternative display to conventional projectors, TVs, and monitors. Windows may also be configured to receive, transmit, or block wireless communications from passing through the window. A window control system may share computational resources between controllers (e.g., at differ- (Continued)

ent windows). In some cases, the computational resources of the window control system are utilized by other building systems and devices.

29 Claims, 35 Drawing Sheets

Related U.S. Application Data continuation of application No. 16/950,774, filed on Nov. 17, 2020, which is a continuation of application No. 16/608,157, filed as application No. PCT/US2018/029476 on Apr. 25, 2018.

(60) Provisional application No. 62/607,618, filed on Dec. 19, 2017, provisional application No. 62/523,606, filed on Jun. 22, 2017, provisional application No. 62/507,704, filed on May 17, 2017, provisional application No. 62/506,514, filed on May 15, 2017, provisional application No. 62/490,457, filed on Apr. 26, 2017.

(51) Int. Cl.
| | |
|---|---|
| *G05B 19/042* | (2006.01) |
| *G06F 3/044* | (2006.01) |
| *G05B 15/02* | (2006.01) |
| *H01L 27/32* | (2006.01) |
| *B32B 17/10* | (2006.01) |
| *E06B 9/24* | (2006.01) |
| *G02F 1/155* | (2006.01) |
| *G06F 3/041* | (2006.01) |
| *H01L 51/52* | (2006.01) |
| *H04K 3/00* | (2006.01) |

(52) U.S. Cl.
CPC ............... *G02F 1/15* (2013.01); *G02F 1/155* (2013.01); *G05B 15/02* (2013.01); *G05B 19/0426* (2013.01); *G06F 3/044* (2013.01); *G06F 3/0412* (2013.01); *H01L 27/3234* (2013.01); *H01L 51/52* (2013.01); *B32B 2419/00* (2013.01); *E06B 2009/2464* (2013.01); *G05B 2219/2628* (2013.01); *G05B 2219/2642* (2013.01); *H04K 3/45* (2013.01)

(58) Field of Classification Search
CPC ... E06B 9/24; E06B 2009/2464; G05B 15/02; G05B 19/0426; G05B 2219/2628; G05B 2219/2642; G06F 3/0412; G06F 3/044; H01L 27/3234; H01L 51/52; H04K 3/45
USPC .................................................. 359/265–275
See application file for complete search history.

(56) References Cited

U.S. PATENT DOCUMENTS

| | | | |
|---|---|---|---|
| 3,971,668 A | 7/1976 | Pickard et al. | |
| 4,129,861 A | 12/1978 | Giglia | |
| 5,027,574 A | 7/1991 | Phillip | |
| 5,124,833 A | 6/1992 | Barton et al. | |
| 5,170,108 A | 12/1992 | Peterson et al. | |
| 5,204,778 A | 4/1993 | Bechtel | |
| 5,220,317 A | 6/1993 | Lynam et al. | |
| 5,290,986 A | 3/1994 | Colon et al. | |
| 5,353,148 A | 10/1994 | Eid et al. | |
| 5,365,365 A | 11/1994 | Ripoche et al. | |
| 5,379,146 A | 1/1995 | Defendini | |
| 5,384,578 A | 1/1995 | Lynam et al. | |
| 5,402,144 A | 3/1995 | Ripoche | |
| 5,416,617 A | 5/1995 | Loiseaux et al. | |
| 5,451,822 A | 9/1995 | Bechtel et al. | |
| 5,598,000 A | 1/1997 | Popat | |
| 5,621,526 A | 4/1997 | Kuze | |
| 5,673,028 A | 9/1997 | Levy | |
| 5,684,619 A * | 11/1997 | Shabrang | G02F 1/1533 359/273 |
| 5,694,144 A | 12/1997 | Lefrou et al. | |
| 5,754,329 A | 5/1998 | Coleman | |
| 5,764,402 A | 6/1998 | Thomas et al. | |
| 5,822,107 A | 10/1998 | Lefrou et al. | |
| 5,847,858 A | 12/1998 | Krings et al. | |
| 5,900,720 A | 5/1999 | Kallman et al. | |
| 5,956,012 A | 9/1999 | Turnbull et al. | |
| 5,973,818 A | 10/1999 | Sjursen et al. | |
| 5,973,819 A | 10/1999 | Pletcher et al. | |
| 5,978,126 A | 11/1999 | Sjursen | |
| 6,002,511 A | 12/1999 | Varaprasad et al. | |
| 6,039,850 A | 3/2000 | Schulz | |
| 6,055,089 A | 4/2000 | Schulz et al. | |
| 6,084,700 A | 7/2000 | Knapp et al. | |
| 6,130,448 A | 10/2000 | Bauer et al. | |
| 6,130,772 A | 10/2000 | Cava | |
| 6,222,177 B1 | 4/2001 | Bechtel et al. | |
| 6,262,831 B1 | 7/2001 | Bauer et al. | |
| 6,386,713 B1 | 5/2002 | Turnbull et al. | |
| 6,407,468 B1 | 6/2002 | LeVesque et al. | |
| 6,407,847 B1 | 6/2002 | Poll et al. | |
| 6,429,961 B1 | 8/2002 | Harary et al. | |
| 6,449,082 B1 | 9/2002 | Agrawal et al. | |
| 6,471,360 B2 | 10/2002 | Rukavina et al. | |
| 6,493,128 B1 | 12/2002 | Agrawal et al. | |
| 6,535,126 B2 | 3/2003 | Lin et al. | |
| 6,567,708 B1 | 5/2003 | Bechtel et al. | |
| 6,588,250 B2 | 7/2003 | Schell | |
| 6,614,577 B1 | 9/2003 | Yu et al. | |
| 6,795,226 B2 | 9/2004 | Agrawal et al. | |
| 6,829,511 B2 | 12/2004 | Bechtel et al. | |
| 6,856,444 B2 | 2/2005 | Ingalls et al. | |
| 6,897,936 B1 | 5/2005 | Li et al. | |
| 6,940,627 B2 | 9/2005 | Freeman et al. | |
| 6,946,171 B1 | 9/2005 | Aggas | |
| 7,085,609 B2 | 8/2006 | Bechtel et al. | |
| 7,133,181 B2 | 11/2006 | Greer | |
| 7,215,318 B2 | 5/2007 | Turnbull et al. | |
| 7,277,215 B2 | 10/2007 | Greer | |
| 7,304,787 B2 | 12/2007 | Whitesides et al. | |
| 7,347,608 B2 | 3/2008 | Emde | |
| 7,417,397 B2 | 8/2008 | Berman et al. | |
| 7,542,809 B2 | 6/2009 | Bechtel et al. | |
| 7,548,833 B2 | 6/2009 | Ahmed | |
| 7,567,183 B2 | 7/2009 | Schwenke | |
| 7,610,910 B2 | 11/2009 | Ahmed | |
| 7,763,334 B2 | 7/2010 | Berkowitz | |
| 7,817,326 B1 | 10/2010 | Rennig et al. | |
| 7,822,490 B2 | 10/2010 | Bechtel et al. | |
| 7,873,490 B2 | 1/2011 | MacDonald | |
| 7,941,245 B1 | 5/2011 | Popat | |
| 7,941,982 B2 | 5/2011 | Merica | |
| 7,972,021 B2 | 7/2011 | Scherer | |
| 7,977,904 B2 | 7/2011 | Berman et al. | |
| 7,990,603 B2 | 8/2011 | Ash et al. | |
| 8,004,739 B2 | 8/2011 | Letocart | |
| 8,018,644 B2 | 9/2011 | Gustavsson et al. | |
| 8,022,977 B2 | 9/2011 | Kanade et al. | |
| 8,102,586 B2 | 1/2012 | Albahri | |
| 8,120,292 B2 | 2/2012 | Berman et al. | |
| 8,125,172 B2 | 2/2012 | Berman et al. | |
| 8,213,074 B1 | 7/2012 | Shrivastava et al. | |
| 8,248,014 B2 | 8/2012 | Berman et al. | |
| 8,254,013 B2 | 8/2012 | Mehtani et al. | |
| 8,292,228 B2 | 10/2012 | Mitchell et al. | |
| 8,363,178 B2 | 1/2013 | Chung et al. | |
| 8,456,729 B2 | 6/2013 | Brown et al. | |
| 8,547,624 B2 | 10/2013 | Ash et al. | |
| 8,686,984 B2 | 4/2014 | Hummel et al. | |
| 8,705,162 B2 | 4/2014 | Brown et al. | |
| 8,723,467 B2 | 5/2014 | Berman et al. | |
| 8,800,221 B1 | 8/2014 | Header | |
| 8,836,263 B2 | 9/2014 | Berman et al. | |

(56) References Cited

U.S. PATENT DOCUMENTS

| | | |
|---|---|---|
| 8,864,321 B2 | 10/2014 | Mehtani et al. |
| 8,902,486 B1 | 12/2014 | Chandrasekhar |
| 8,976,440 B2 | 3/2015 | Berland et al. |
| 9,030,725 B2 | 5/2015 | Pradhan et al. |
| 9,081,247 B1 | 7/2015 | Pradhan et al. |
| 9,341,912 B2 | 5/2016 | Shrivastava et al. |
| 9,412,290 B2 | 8/2016 | Jack et al. |
| 9,442,338 B2 | 9/2016 | Uhm et al. |
| 9,454,055 B2 | 9/2016 | Brown et al. |
| 9,470,947 B2 | 10/2016 | Nagel et al. |
| 9,523,902 B2 | 12/2016 | Parker |
| 9,551,913 B2 | 1/2017 | Kim et al. |
| 9,690,174 B2 | 6/2017 | Wang |
| 9,709,869 B2 | 7/2017 | Baumann et al. |
| 9,740,074 B2 | 8/2017 | Agrawal et al. |
| 9,778,533 B2 | 10/2017 | Bertolini |
| 9,791,701 B2 | 10/2017 | Ato et al. |
| 9,898,912 B1 | 2/2018 | Jordan, II et al. |
| 9,917,867 B2 | 3/2018 | Sallam |
| 9,965,865 B1 | 5/2018 | Agrawal et al. |
| 10,048,561 B2 | 8/2018 | Brown |
| 10,049,402 B1 | 8/2018 | Miranda |
| 10,067,344 B2 | 9/2018 | Kilcher et al. |
| 10,191,318 B2 | 1/2019 | Park et al. |
| 10,221,612 B2 | 3/2019 | Purdy et al. |
| 10,254,618 B2 | 4/2019 | Parker |
| 10,288,971 B2 | 5/2019 | Phillips et al. |
| 10,322,680 B2 | 6/2019 | Terashima et al. |
| 10,379,265 B2 | 8/2019 | Brown |
| 10,394,070 B2 | 8/2019 | Park et al. |
| 10,400,509 B2 | 9/2019 | Fasi et al. |
| 10,416,520 B2 | 9/2019 | Jovanovic |
| 10,460,636 B2 | 10/2019 | Salmimaa et al. |
| 10,488,837 B2 | 11/2019 | Cirino |
| 10,591,798 B1 | 3/2020 | Nagel et al. |
| 10,699,604 B2 | 6/2020 | Hicks et al. |
| 10,917,259 B1 | 2/2021 | Chein et al. |
| 10,921,675 B2 | 2/2021 | Barnum et al. |
| 10,923,226 B2 | 2/2021 | Macary et al. |
| 10,954,677 B1 | 3/2021 | Scanlin |
| 10,982,487 B2 | 4/2021 | Ramirez |
| 11,231,633 B2 | 1/2022 | Trikha et al. |
| 11,300,849 B2 | 4/2022 | Trikha et al. |
| 11,335,232 B2 | 5/2022 | Huang et al. |
| 2002/0075472 A1 | 6/2002 | Holton |
| 2002/0149829 A1 | 10/2002 | Mochizuka et al. |
| 2002/0152298 A1 | 10/2002 | Kikta et al. |
| 2003/0210449 A1 | 11/2003 | Ingalls et al. |
| 2003/0210450 A1 | 11/2003 | Yu et al. |
| 2003/0227663 A1 | 12/2003 | Agrawal et al. |
| 2003/0227664 A1 | 12/2003 | Agrawal et al. |
| 2004/0001056 A1 | 1/2004 | Atherton et al. |
| 2004/0135989 A1 | 7/2004 | Klebe |
| 2004/0160322 A1 | 8/2004 | Stilp |
| 2005/0200934 A1 | 9/2005 | Callahan et al. |
| 2005/0225830 A1 | 10/2005 | Huang et al. |
| 2005/0268629 A1 | 12/2005 | Ahmed |
| 2005/0270620 A1 | 12/2005 | Bauer et al. |
| 2005/0278047 A1 | 12/2005 | Ahmed |
| 2006/0018000 A1 | 1/2006 | Greer |
| 2006/0107616 A1 | 5/2006 | Ratti et al. |
| 2006/0170376 A1 | 8/2006 | Piepgras et al. |
| 2006/0179922 A1 | 8/2006 | Sacca |
| 2006/0187608 A1 | 8/2006 | Stark |
| 2006/0209007 A1 | 9/2006 | Pyo et al. |
| 2006/0245024 A1 | 11/2006 | Greer |
| 2006/0279518 A1 | 12/2006 | Jang et al. |
| 2007/0002007 A1 | 1/2007 | Tam |
| 2007/0067048 A1 | 3/2007 | Bechtel et al. |
| 2007/0162233 A1 | 7/2007 | Schwenke |
| 2007/0188676 A1 | 8/2007 | Choi et al. |
| 2007/0285759 A1 | 12/2007 | Ash et al. |
| 2008/0018979 A1 | 1/2008 | Mahe et al. |
| 2008/0092456 A1 | 4/2008 | Millett et al. |
| 2008/0198584 A1 | 8/2008 | Fouraux et al. |
| 2009/0027759 A1 | 1/2009 | Albahri |
| 2009/0066157 A1 | 3/2009 | Tarng et al. |
| 2009/0143141 A1 | 6/2009 | Wells et al. |
| 2009/0243732 A1 | 10/2009 | Tarng et al. |
| 2009/0243802 A1 | 10/2009 | Wolf et al. |
| 2009/0254222 A1 | 10/2009 | Berman et al. |
| 2010/0039410 A1 | 2/2010 | Becker et al. |
| 2010/0066484 A1 | 3/2010 | Hanwright et al. |
| 2010/0082081 A1 | 4/2010 | Niessen et al. |
| 2010/0172009 A1 | 7/2010 | Matthews |
| 2010/0172010 A1 | 7/2010 | Gustavsson et al. |
| 2010/0188057 A1 | 7/2010 | Tarng |
| 2010/0193067 A1 | 8/2010 | Coignet et al. |
| 2010/0208326 A1 | 8/2010 | Kwak et al. |
| 2010/0235206 A1 | 9/2010 | Miller et al. |
| 2010/0243427 A1 | 9/2010 | Kozlowski et al. |
| 2010/0245972 A1 | 9/2010 | Wright |
| 2010/0245973 A1 | 9/2010 | Wang et al. |
| 2010/0315693 A1 | 12/2010 | Lam et al. |
| 2011/0026091 A1 | 2/2011 | Brown et al. |
| 2011/0038030 A1 | 2/2011 | Roosendaal et al. |
| 2011/0046810 A1 | 2/2011 | Bechtel et al. |
| 2011/0063708 A1 | 3/2011 | Letocart |
| 2011/0148218 A1 | 6/2011 | Rozbicki |
| 2011/0164304 A1 | 7/2011 | Brown et al. |
| 2011/0164317 A1 | 7/2011 | Vergohl et al. |
| 2011/0167617 A1 | 7/2011 | Letocart |
| 2011/0167741 A1 | 7/2011 | Surace et al. |
| 2011/0235152 A1 | 9/2011 | Letocart |
| 2011/0249313 A1 | 10/2011 | Letocart |
| 2011/0255142 A1 | 10/2011 | Ash et al. |
| 2011/0266419 A1 | 11/2011 | Jones et al. |
| 2011/0292488 A1 | 12/2011 | McCarthy et al. |
| 2011/0296771 A1 | 12/2011 | Miller et al. |
| 2011/0304898 A1 | 12/2011 | Letocart |
| 2012/0026573 A1 | 2/2012 | Collins et al. |
| 2012/0062975 A1 | 3/2012 | Mehtani et al. |
| 2012/0133315 A1 | 5/2012 | Berman et al. |
| 2012/0190386 A1 | 7/2012 | Anderson |
| 2012/0194895 A1 | 8/2012 | Podbelski et al. |
| 2012/0200908 A1 | 8/2012 | Bergh et al. |
| 2012/0236386 A1 | 9/2012 | Mehtani et al. |
| 2012/0239209 A1 | 9/2012 | Brown et al. |
| 2012/0268369 A1 | 10/2012 | Kikkeri |
| 2012/0268803 A1 | 10/2012 | Greer et al. |
| 2012/0275008 A1 | 11/2012 | Pradhan et al. |
| 2012/0285630 A1 | 11/2012 | Berman et al. |
| 2012/0293855 A1 | 11/2012 | Shrivastava et al. |
| 2013/0057937 A1 | 3/2013 | Berman et al. |
| 2013/0158790 A1 | 6/2013 | McIntyre, Jr. et al. |
| 2013/0242370 A1 | 9/2013 | Wang |
| 2013/0263510 A1 | 10/2013 | Gassion |
| 2013/0271812 A1 | 10/2013 | Brown et al. |
| 2013/0271813 A1 | 10/2013 | Brown |
| 2013/0271814 A1 | 10/2013 | Brown |
| 2013/0271815 A1 | 10/2013 | Pradhan et al. |
| 2013/0278989 A1 | 10/2013 | Lam et al. |
| 2014/0067733 A1 | 3/2014 | Humann |
| 2014/0098007 A1 | 4/2014 | Delpier et al. |
| 2014/0116516 A1 | 5/2014 | Jones |
| 2014/0160550 A1 | 6/2014 | Brown et al. |
| 2014/0236323 A1 | 8/2014 | Brown et al. |
| 2014/0247475 A1 | 9/2014 | Parker et al. |
| 2014/0259931 A1 | 9/2014 | Plummer |
| 2014/0267384 A1 | 9/2014 | Kwon et al. |
| 2014/0268287 A1 | 9/2014 | Brown et al. |
| 2014/0300945 A1 | 10/2014 | Parker |
| 2014/0330538 A1 | 11/2014 | Conklin et al. |
| 2014/0333899 A1 | 11/2014 | Smithwick |
| 2014/0371931 A1 | 12/2014 | Lin et al. |
| 2015/0002919 A1 | 1/2015 | Jack et al. |
| 2015/0049378 A1 | 2/2015 | Shrivastava et al. |
| 2015/0060648 A1 | 3/2015 | Brown et al. |
| 2015/0070745 A1 | 3/2015 | Pradhan |
| 2015/0077832 A1 | 3/2015 | Berland et al. |
| 2015/0092259 A1 | 4/2015 | Greer et al. |
| 2015/0116811 A1 | 4/2015 | Shrivastava et al. |
| 2015/0122474 A1 | 5/2015 | Petersen |
| 2015/0160525 A1 | 6/2015 | Shi |

(56) References Cited

U.S. PATENT DOCUMENTS

| | | |
|---|---|---|
| 2015/0185581 A1 | 7/2015 | Pradhan et al. |
| 2015/0338713 A1 | 11/2015 | Brown |
| 2015/0368967 A1 | 12/2015 | Lundy et al. |
| 2016/0026060 A1 | 1/2016 | Koo et al. |
| 2016/0054633 A1 | 2/2016 | Brown et al. |
| 2016/0054634 A1 | 2/2016 | Brown et al. |
| 2016/0109778 A1 | 4/2016 | Shrivastava et al. |
| 2016/0154290 A1 | 6/2016 | Brown et al. |
| 2016/0203403 A1 | 7/2016 | Nagel et al. |
| 2016/0225832 A1 | 8/2016 | Kwon et al. |
| 2016/0255279 A1 | 9/2016 | Sudo |
| 2016/0330042 A1 | 11/2016 | Andersen |
| 2016/0372083 A1 | 12/2016 | Taite et al. |
| 2017/0044057 A1 | 2/2017 | Rozbicki et al. |
| 2017/0052289 A1 | 2/2017 | Boissevain et al. |
| 2017/0075183 A1 | 3/2017 | Brown |
| 2017/0082903 A1 | 3/2017 | Vigano et al. |
| 2017/0123286 A1 | 5/2017 | Parker |
| 2017/0139301 A1 | 5/2017 | Messere et al. |
| 2017/0146884 A1 | 5/2017 | Vigano et al. |
| 2017/0191304 A1 | 7/2017 | Petit |
| 2017/0197494 A1 | 7/2017 | Li |
| 2017/0200424 A1 | 7/2017 | Xu et al. |
| 2017/0234067 A1 | 8/2017 | Fasi et al. |
| 2017/0248564 A1 | 8/2017 | Miyajima |
| 2017/0253801 A1 | 9/2017 | Bae et al. |
| 2017/0277342 A1 | 9/2017 | Hong et al. |
| 2017/0328121 A1 | 11/2017 | Purdy et al. |
| 2017/0347129 A1 | 11/2017 | Levi et al. |
| 2018/0106098 A1* | 4/2018 | Unveren ............... H05B 47/11 |
| 2018/0129172 A1 | 5/2018 | Shrivastava et al. |
| 2018/0130455 A1 | 5/2018 | Plummer et al. |
| 2018/0144712 A1 | 5/2018 | Threlkel et al. |
| 2018/0157141 A1 | 6/2018 | Brown et al. |
| 2018/0188627 A1 | 7/2018 | Vigano et al. |
| 2018/0259804 A1 | 9/2018 | Bae et al. |
| 2018/0270542 A1 | 9/2018 | Ramalingam et al. |
| 2018/0284555 A1 | 10/2018 | Klawuhn et al. |
| 2019/0011798 A9 | 1/2019 | Brown et al. |
| 2019/0025661 A9 | 1/2019 | Brown et al. |
| 2019/0356508 A1 | 11/2019 | Trikha et al. |
| 2020/0057421 A1 | 2/2020 | Trikha et al. |
| 2020/0096775 A1 | 3/2020 | Franklin et al. |
| 2020/0103841 A1 | 4/2020 | Pillai et al. |
| 2020/0150508 A1 | 5/2020 | Patterson et al. |
| 2020/0150602 A1 | 5/2020 | Trikha et al. |
| 2020/0260556 A1 | 8/2020 | Rozbicki et al. |
| 2021/0041759 A1 | 2/2021 | Trikha et al. |
| 2021/0063836 A1 | 3/2021 | Patterson et al. |
| 2021/0126063 A1 | 4/2021 | Vanderveen et al. |
| 2021/0132458 A1 | 5/2021 | Trikha et al. |
| 2022/0137474 A1 | 5/2022 | Trikha et al. |
| 2022/0137475 A1 | 5/2022 | Trikha et al. |
| 2022/0137476 A1 | 5/2022 | Trikha et al. |
| 2022/0179275 A1 | 6/2022 | Patterson et al. |

FOREIGN PATENT DOCUMENTS

| | | |
|---|---|---|
| CN | 101969207 A | 2/2011 |
| CN | 102203370 A | 9/2011 |
| CN | 102388340 A | 3/2012 |
| CN | 103003739 A | 3/2013 |
| CN | 103168269 A | 6/2013 |
| CN | 103207493 A | 7/2013 |
| CN | 103701694 A | 4/2014 |
| CN | 104885002 A | 9/2015 |
| CN | 105676556 A | 6/2016 |
| CN | 106575064 A | 4/2017 |
| CN | 207409225 U | 5/2018 |
| DE | 10124673 A1 | 11/2002 |
| EP | 0445314 A1 | 9/1991 |
| EP | 0869032 A2 | 10/1998 |
| EP | 0920210 A1 | 6/1999 |
| EP | 0835475 B1 | 9/2004 |
| EP | 1510854 A1 | 3/2005 |
| EP | 1417535 B1 | 11/2005 |
| EP | 1619546 A2 | 1/2006 |
| EP | 2161615 A1 | 3/2010 |
| EP | 2357544 A2 | 8/2011 |
| EP | 2764998 A1 | 8/2014 |
| EP | 2837205 A1 | 2/2015 |
| EP | 3015915 A1 | 5/2016 |
| EP | 2837205 B1 | 2/2017 |
| EP | 3352053 A1 | 7/2018 |
| JP | S63208830 A | 8/1988 |
| JP | H02132420 A | 5/1990 |
| JP | H05178645 A | 7/1993 |
| JP | H0611477 A | 1/1994 |
| JP | H06242044 A | 9/1994 |
| JP | H06308073 A | 11/1994 |
| JP | H1063216 A | 3/1998 |
| JP | 2004245985 A | 9/2004 |
| JP | 2008293024 A | 12/2008 |
| JP | 4694816 B2 | 6/2011 |
| JP | 4799113 B2 | 10/2011 |
| JP | 2013057975 A | 3/2013 |
| KR | 200412640 Y1 | 3/2006 |
| KR | 20060069742 A | 6/2006 |
| KR | 100752041 B1 | 8/2007 |
| KR | 20080022319 A | 3/2008 |
| KR | 20090026181 A | 3/2009 |
| KR | 100904847 B1 | 6/2009 |
| KR | 100931183 B1 | 12/2009 |
| KR | 20100034361 A | 4/2010 |
| KR | 20110003698 A | 1/2011 |
| KR | 20110094672 A | 8/2011 |
| KR | 101346862 B1 | 1/2014 |
| KR | 20140004175 A | 1/2014 |
| KR | 101471443 B1 | 12/2014 |
| KR | 20150060051 A | 6/2015 |
| KR | 20160012564 A | 2/2016 |
| KR | 20160105005 A | 9/2016 |
| KR | 20170022132 A | 3/2017 |
| KR | 101799323 B1 | 12/2017 |
| WO | WO-9816870 A1 | 4/1998 |
| WO | WO-0209338 A2 | 1/2002 |
| WO | WO-0213052 A2 | 2/2002 |
| WO | WO-02054086 A1 | 7/2002 |
| WO | WO-2004003649 A1 | 1/2004 |
| WO | WO-2005098811 A1 | 10/2005 |
| WO | WO-2005103807 A2 | 11/2005 |
| WO | WO-2007016546 A2 | 2/2007 |
| WO | WO-2007146862 A2 | 12/2007 |
| WO | WO-2008030018 A1 | 3/2008 |
| WO | WO-2008147322 A1 | 12/2008 |
| WO | WO-2009124647 A1 | 10/2009 |
| WO | WO-2010024966 A1 | 3/2010 |
| WO | WO-2010120771 A1 | 10/2010 |
| WO | WO-2011020478 A1 | 2/2011 |
| WO | WO-2011087684 A1 | 7/2011 |
| WO | WO-2011087687 A1 | 7/2011 |
| WO | WO-2011124720 A2 | 10/2011 |
| WO | WO-2011127015 A1 | 10/2011 |
| WO | WO-2012079159 A1 | 6/2012 |
| WO | WO-2012080618 A1 | 6/2012 |
| WO | WO-2012080656 A1 | 6/2012 |
| WO | WO-2012080657 A1 | 6/2012 |
| WO | WO-2012145155 A1 | 10/2012 |
| WO | WO-2013059674 A1 | 4/2013 |
| WO | WO-2013109881 A2 | 7/2013 |
| WO | WO-2013155467 A1 | 10/2013 |
| WO | WO-2013159778 A1 | 10/2013 |
| WO | WO-2014121863 A1 | 8/2014 |
| WO | WO-2014130471 A1 | 8/2014 |
| WO | WO-2014134451 A2 | 9/2014 |
| WO | WO-2014209812 A1 | 12/2014 |
| WO | WO-2015077097 A1 | 5/2015 |
| WO | WO-2015134789 A1 | 9/2015 |
| WO | WO-2016086017 A1 | 6/2016 |
| WO | WO-2016086062 A1 | 6/2016 |
| WO | WO-2016094139 A1 | 6/2016 |
| WO | WO-2016183059 A1 | 11/2016 |
| WO | WO-2016191406 A1 | 12/2016 |
| WO | WO-2017007841 A1 | 1/2017 |

(56) References Cited

FOREIGN PATENT DOCUMENTS

| | | |
|---|---|---|
| WO | WO-2017035650 A1 | 3/2017 |
| WO | WO-2017062592 A1 | 4/2017 |
| WO | WO-2017075059 A1 | 5/2017 |
| WO | WO-2017137904 A1 | 8/2017 |
| WO | WO-2017155833 A1 | 9/2017 |
| WO | WO-2017180734 A1 | 10/2017 |
| WO | WO-2017189618 A1 | 11/2017 |
| WO | WO-2017192881 A1 | 11/2017 |
| WO | WO-2018063919 A1 | 4/2018 |
| WO | WO-2018098089 A1 | 5/2018 |
| WO | WO-2018102103 A1 | 6/2018 |
| WO | WO-2018200702 A1 | 11/2018 |
| WO | WO-2018200740 A2 | 11/2018 |
| WO | WO-2018200752 A1 | 11/2018 |
| WO | WO-2019040809 A1 | 2/2019 |
| WO | WO-2021067505 A1 | 4/2021 |
| WO | WO-2021154915 A1 | 8/2021 |

OTHER PUBLICATIONS

APC by Schneider Electric, Smart-UPS 120V Product Brochure, 2013, 8 pp.

Cardinal IG Technical Service Bulletin #IG13-05/08, "Capillary Tubes & Breather Tubes", May 2008, 2 pp.

Chinese Office Action dated Dec. 25, 2018 in CN Application No. 201710111979.3.

Chinese Office Action dated Jul. 2, 2018 in Chinese Application No. 201710111979.3.

Chinese Office Action dated Mar. 26, 2015 in CN Application No. 201280060910.8.

Chinese Office Action dated Nov. 27, 2015 in Chinese Application No. 2015032301101560.

Communication re Third-Party Observation dated Dec. 4, 2014 and Third-Party Observation dated Dec. 3, 2014 in PCT/US2014/016974.

Duchon, Claude E. et al., "Estimating Cloud Type from Pyranometer Observations," Journal of Applied Meteorology, vol. 38, Jan. 1999, pp. 132-141.

European Extended Search Report dated Nov. 11, 2020 in EP Application No. 18791268.8.

European Extended Search Report dated Nov. 12, 2020 in EP Application No. 18791669.7.

European Office Action dated Dec. 2, 2015 in EP Application No. 12841714.4.

European Office Action dated May 15, 2017 in EP Application No. EP 12841714.4.

European Search Report dated Aug. 11, 2014 in European Application No. 12757877.1.

European Search Report dated Jul. 23, 2014 in European Application No. 12756917.6.

European Search Report dated Jul. 29, 2014 in European Application No. 12758250.0.

European Search Report dated Mar. 5, 2015 in European Application No. 12841714.4.

Final Office Action dated Jun. 5, 2015 in U.S. Appl. No. 13/968,258.

Graham, Steve, "Clouds & Radiation," Mar. 1, 1999. [http://earthobservatory.nasa.gov/Features/Clouds/].

Haby, Jeff, "Cloud Detection (IR v. VIS)," (known as of Sep. 3, 2014) [http://theweatherprediction.com/habyhints2/512/].

"Halio Rooftop Sensor Kit (Model SR500)," Product Data Sheet, Kinestral Technologies, 2020, 4 pp.

Hoosier Energy, "How do they do that? Measuring Real-Time Cloud Activity" Hoosier Energy Current Connections, (known as of Sep. 3, 2014). (http://members.questline.com/Article.aspx?articleID=18550&accountID=196000&nl=11774).

"How Cleantech wants to make a 2012 comeback" http://mountainview.patch.com/articles/how-cleantech-wants-to-make-a-2012-comeback, Jan. 23, 2012.

IN Office Action dated Jan. 24, 2022 in Application No. IN201937044699.

IN Office action dated Sep. 28, 2021, in IN Application No. IN201937045203.

International Preliminary Report on Patentability dated Feb. 19, 2015 issued in PCT/US2013/053625.

International Preliminary Report on Patentability dated Jun. 8, 2017 in Application No. PCT/US2015/062530.

International Preliminary Report on Patentability dated May 1, 2014 in PCT/US2012/061137.

International Preliminary Report on Patentability dated Nov. 7, 2019 in PCT Application No. PCT/US2018/029406.

International Preliminary Report on Patentability dated Nov. 7, 2019 in PCT Application No. PCT/US2018/029476.

International Preliminary Report on Patentability dated Oct. 23, 2014 issued in PCT/US2013/036456.

International Preliminary Report on Patentability dated Oct. 30, 2014 issued in PCT/US2013/034998.

International Preliminary Report on Patentability dated Oct. 30, 2014 issued in PCT/US2013/036235.

International Preliminary Report on Patentability dated Sep. 26, 2013, issued in PCT/US2012/027742.

International Preliminary Report on Patentability dated Sep. 26, 2013, issued in PCT/US2012/027828.

International Preliminary Report on Patentability dated Sep. 26, 2013, issued in PCT/US2012/027909.

International Search Report and Written Opinion dated Dec. 26, 2013, issued in PCT/US2013/053625.

International Search Report and Written Opinion dated Feb. 23, 2016, issued in PCT/US2015/062530.

International Search Report and Written Opinion dated Jul. 11, 2013, issued in PCT/US2013/034998.

International Search Report and Written Opinion dated Jul. 23, 2013, issued in PCT/US2013/036235.

International Search Report and Written Opinion dated Jul. 26, 2013, issued in PCT/US2013/036456.

International Search Report and Written Opinion dated Jun. 23, 2021 in PCT Application No. PCT/US2021/015378.

International Search Report and Written Opinion dated Mar. 15, 2021 in PCT Application No. PCT/US2020/053641.

International Search Report and Written Opinion dated Mar. 28, 2013 in PCT/US2012/061137.

International Search Report and Written Opinion dated May 26, 2014 in PCT/US2014/016974.

International Search Report and Written Opinion dated Oct. 15, 2018 in PCT Application No. PCT/US2018/029406.

International Search Report and Written Opinion dated Oct. 16, 2014, issued in PCT/US2014/043514.

International Search Report and Written Opinion dated Sep. 24, 2012, issued in PCT/US2012/027742.

International Search Report and Written Opinion dated Sep. 24, 2012, issued in PCT/US2012/027909.

International Search Report and Written Opinion dated Sep. 26, 2012, issued in PCT/US2012/027828.

Joseph, J., "Xiaomi shows off near perfect Under Screen Camera Technology," Gizchina.com, Aug. 28, 2020, 7 pp., https://www.gizmochina.com/2020/08/28/xiaomi-perfected-third-gen-under-screen-camera-technology-prototype/, retrieved Apr. 21, 2021.

Kipp & Zonen, "Solar Radiation" (known as of Sep. 3, 2014) [http://www.kippzonen.com/Knowledge-Center/Theoretical-info/Solar-Radiation].

Kleissl, Jan et al., "Recent Advances in Solar Variability Modeling and Solar Forecasting at UC San Diego," Proceedings, American Solar Energy Society, 2013 Solar Conference, Apr. 16-20, 2013, Baltimore, MD.

Letter dated Dec. 1, 2014 re Prior Art re U.S. Appl. No. 13/772,969 from Ryan D. Ricks representing MechoShade Systems, Inc.

Lim, Sunnie H.N. et al., "Modeling of optical and energy performance of tungsten-oxide-based electrochromic windows including their intermediate states," Solar Energy Materials & Solar Cells, vol. 108, Oct. 16, 2012, pp. 129-135.

Lululemon athletica, "Mirror", The Mirror Gym product brochure, known Dec. 8, 2020, 9 pp, https://shop.lululemon.com/story/mirror-home-gym, retrieved Jan. 29, 2021.

(56) References Cited

OTHER PUBLICATIONS

National Aeronautics & Space Administration, "Cloud Radar System (CRS)," (known as of Sep. 3, 2014), published date of Jun. 16, 2014, [http://har.gsfc.nasa.gov/index.php?section=12].
National Aeronautics & Space Administration, "Cloud Remote Sensing and Modeling," (known as of Sep. 3, 2014), published date of Sep. 15, 2014, [http://atmospheres.gsfc.nasa.gov/climate/index.php?section=134].
"New from Pella: Windows with Smartphone-run blinds", Pella Corp., http://www.desmoinesregister.com/article/20120114/BUSINESS/301140031/0/biggame/7odyssey=nav%7Chead, Jan. 13, 2012.
Office Action dated Oct. 6, 2014 in U.S. Appl. No. 13/968,258.
PCT Application No. PCT/US2020/053641 filed Sep. 30, 2020.
PCT Application No. PCT/US2021/052587 filed Sep. 29, 2021.
PCT Application No. PCT/US2021/052595 filed Sep. 29, 2021.
PCT Application No. PCT/US2021/052597 filed Sep. 29, 2021.
PCT International Search Report and Written Opinion (ISA:KIPO) dated Aug. 13, 2018 for PCT Application No. PCT/US2018/029476.
Porter, J., "LG developing sliding doors made of transparent OLED displays," The Verge, Dec. 7, 2020, 2 pp, https://www.theverge.eom/2020/12/7/22158335/lg-assa-abloy-automatic-sliding-doors-transparent-oled-displays, retrieved Dec. 8, 2020.
Preliminary Amendment dated Feb. 2, 2017 for U.S. Appl. No. 15/349,860.
Preliminary Amendment filed Oct. 7, 2014 for U.S. Appl. No. 14/391,122.
"Remote Sensing: Clouds," Department of Atmospheric and Ocean Science, University of Maryland, (known as of Sep. 3, 2014) [http://www.atmos.umd.edu/~pinker/remote_sensing_clouds.htm].
Renovate by Berkowitz advertisement for "Glass Retrofit System", www.RbBwindow.com, 1 page [undated].
Russian Office Action dated Dec. 11, 2014 in Russian Application No. 2014145565.
Science and Technology Facilities Council. "Cloud Radar: Predicting The Weather More Accurately." ScienceDaily, Oct. 1, 2008. [www.sciencedaily.com/releases/2008/09/080924085200.htm].
Science News, "New technique could help spot snooping drones", Jan. 23, 2018, 2 pp, https://www.sciencenews.org/article/new-technique-could-help-spot-snooping-drones retrieved Jan. 24, 2018.
Third-Party Submission dated Feb. 2, 2015 and Feb. 18, 2015 PTO Notice re Third-Party Submission for U.S. Appl. No. 13/772,969.
U.S Advisory Action dated Jan. 14, 2022 in U.S. Appl. No. 16/608,159.
U.S. Appl. No. 63/057,120, Inventors Gupta et al., filed Jul. 27, 2020.
U.S. Appl. No. 63/078,805, Inventors Gupta et al., filed Sep. 15, 2020.
US Corrected Notice of Allowability dated Sep. 22, 2021, in U.S. Appl. No. 17/338,562.
US Final Office Action dated Apr. 30, 2012 in U.S. Appl. No. 13/049,750.
U.S. Final Office Action dated Aug. 19, 2013 in U.S. Appl. No. 13/049,756.
US Final Office Action dated Aug. 19, 2021 in U.S. Appl. No. 16/608,159.
US Final Office Action dated Feb. 26, 2015 in U.S. Appl. No. 13/479,137.
US Final Office Action dated Jan. 27, 2014 in U.S. Appl. No. 13/479,137.
U.S. Final Office Action dated Jul. 2, 2015 in U.S. Appl. No. 13/049,756.
US Final Office Action dated May 15, 2014 in U.S. Appl. No. 13/449,251.
US Final Office Action dated May 16, 2014 in U.S. Appl. No. 13/449,248.
US Notice of Allowance dated Apr. 13, 2015 in U.S. Appl. No. 14/657,380.
US Notice of Allowance dated Aug. 12, 2016 in U.S. Appl. No. 14/352,973.
US Notice of Allowance dated Aug. 16, 2018 in U.S. Appl. No. 15/349,860.
U.S. Notice of Allowance dated Feb. 14, 2022 in U.S. Appl. No. 16/608,159.
US Notice of Allowance dated Jan. 10, 2014 in U.S. Appl. No. 13/449,235.
US Notice of Allowance dated Jan. 22, 2015 in U.S. Appl. No. 13/682,618.
US Notice of Allowance dated Jul. 20, 2012 in U.S. Appl. No. 13/049,623.
US Notice of Allowance dated Jun. 17, 2014 in U.S. Appl. No. 13/309,990.
US Notice of Allowance dated May 14, 2015 in U.S. Appl. No. 13/479,137.
US Notice of Allowance dated May 8, 2012 in U.S. Appl. No. 13/049,750.
US Notice of Allowance dated Nov. 16, 2018 in U.S. Appl. No. 15/349,860.
US Notice of Allowance dated Oct. 9, 2018 in U.S. Appl. No. 15/528,071.
US Notice of Allowance dated Sep. 3, 2021, in U.S. Appl. No. 17/338,562.
US Notice of Allowance (supplemental) dated Jun. 12, 2015 in U.S. Appl. No. 13/479,137.
US Office Action dated Dec. 24, 2013 in U.S. Appl. No. 13/309,990.
US Office Action dated Feb. 24, 2015 in U.S. Appl. No. 14/163,026.
US Office Action dated Feb. 3, 2012 in U.S. Appl. No. 13/049,750.
US Office Action dated Jan. 16, 2015 in U.S. Appl. No. 14/468,778.
U.S. Office Action dated Jan. 18, 2013 in U.S. Appl. No. 13/049,756.
US Office Action dated Jan. 19, 2021 in U.S. Appl. No. 16/608,159.
US Office Action dated Jul. 3, 2014 in U.S. Appl. No. 13/479,137.
US Office Action dated Jun. 3, 2015 in U.S. Appl. No. 13/449,251.
US Office Action dated Mar. 27, 2012 in U.S. Appl. No. 13/049,623.
US Office Action dated Mar. 9, 2018 in U.S. Appl. No. 15/528,071.
US Office Action dated Nov. 2, 2017 in U.S. Appl. No. 15/349,860.
US Office Action dated Nov. 27, 2015 in U.S. Appl. No. 14/352,973.
US Office Action dated Nov. 29, 2013 in U.S. Appl. No. 13/449,248.
US Office Action dated Nov. 29, 2013 in U.S. Appl. No. 13/449,251.
US Office Action dated Oct. 11, 2013 in U.S. Appl. No. 13/449,235.
US Office Action dated Oct. 28, 2014 in U.S. Appl. No. 13/449,251.
U.S. Office Action dated Oct. 6, 2014 in U.S. Appl. No. 13/049,756.
US Office Action dated Sep. 15, 2014 in U.S. Appl. No. 13/682,618.
US Office Action dated Sep. 23, 2013 in U.S. Appl. No. 13/479,137.
US Office Action dated Sep. 29, 2014 in U.S. Appl. No. 13/449,248.
U.S. Appl. No. 16/950,774, inventors Trikha et al., filed Nov. 17, 2020.
U.S. Appl. No. 17/338,562, inventors Trikha et al., filed Jun. 3, 2021.
U.S. Appl. No. 63/135,021, inventors Martinson et al., filed Jan. 8, 2021.
U.S. Appl. No. 63/181,648, inventors Makker et al., filed Apr. 29, 2021.
U.S. Appl. No. 63/211,400, inventors Martinson et al., filed Jun. 16, 2021.
U.S. Appl. No. 63/085,254, Inventors Young et al., filed Sep. 30, 2020.
U.S. Appl. No. 63/115,842, Inventors Martinson et al., filed Nov. 19, 2020.
U.S. Appl. No. 63/154,352, Inventors Martinson et al., filed Feb. 26, 2021.
U.S. Appl. No. 63/170,245, Inventors Martinson et al., filed Apr. 2, 2021.
U.S. Appl. No. 63/212,483, inventors Martinson et al., filed Jun. 18, 2021.
U.S. Appl. No. 63/246,770, Inventors Martinson et al., filed Sep. 21, 2021.
U.S. Appl. No. 63/247,684, Inventors Martinson et al., filed Sep. 23, 2021.
U.S. Appl. No. 63/214,741, inventors Marquez et al., filed Jun. 24, 2021.
U.S. Appl. No. 13/049,756, filed Mar. 16, 2011.
U.S. Appl. No. 13/309,990, filed Dec. 2, 2011.
U.S. Appl. No. 13/449,235, filed Apr. 17, 2012.

(56) References Cited

OTHER PUBLICATIONS

U.S. Appl. No. 13/449,248, filed Apr. 17, 2012.
U.S. Appl. No. 13/449,251, filed Apr. 17, 2012.
U.S. Appl. No. 13/479,137, filed May 23, 2012.
U.S. Appl. No. 13/682,616, filed Nov. 20, 2012.
U.S. Appl. No. 13/772,969, filed Feb. 21, 2013.
U.S. Appl. No. 13/931,459, filed Jun. 28, 2013.
U.S. Appl. No. 13/968,258, filed Aug. 15, 2013, entitled "Multi-purpose Controller for Multistate Windows".
U.S. Appl. No. 14/163,026, filed Jan. 24, 2014.
U.S. Appl. No. 14/468,778, filed Aug. 26, 2014.
U.S. Appl. No. 14/489,414, filed Sep. 17, 2014.
U.S. Appl. No. 14/535,080, filed Nov. 6, 2014 + preliminary amendment filed Nov. 7, 2014.
U.S. Appl. No. 14/657,380 filed Mar. 13, 2015 + preliminary amendment filed Mar. 16, 2015.
U.S. Appl. No. 14/735,043 filed Jun. 9, 2015 and Preliminary Amendment filed Jul. 2, 2015.
U.S. Appl. No. 15/349,860, filed Nov. 11, 2016.
US Preliminary Amendment dated Dec. 31, 2019 in U.S. Appl. No. 16/608,159.
US Preliminary Amendment dated Mar. 31, 2020 in U.S. Appl. No. 16/608,157.
U.S. Non-Final Office Action dated Jul. 15, 2022, in U.S. Appl. No. 16/608,157.
CN Office Action dated Mar. 8, 2022, in Application No. CN201880035614.X with English translation.
TW Office Action dated Feb. 24, 2022, in Application No. TW107114102 with English Translation.
U.S. Restriction Requirement dated May 12, 2022 in U.S. Appl. No. 16/950,774.
U.S. Non Final office action dated Mar. 28, 2022, in U.S. Appl. No. 17/578,196.
U.S. Non Final office action dated Mar. 28, 2022, in U.S. Appl. No. 17/578,226.
U.S. Non-Final Office Action dated Mar. 29, 2022, in U.S. Appl. No. 17/578,234.
U.S. Notice of Allowance dated Jun. 13, 2022, in U.S. Appl. No. 17/081,809.
U.S. Notice of Allowance dated May 18, 2022, in U.S. Appl. No. 17/081,809.
U.S. Office Action dated Apr. 4, 2022, in U.S. Appl. No. 16/608,157.

* cited by examiner

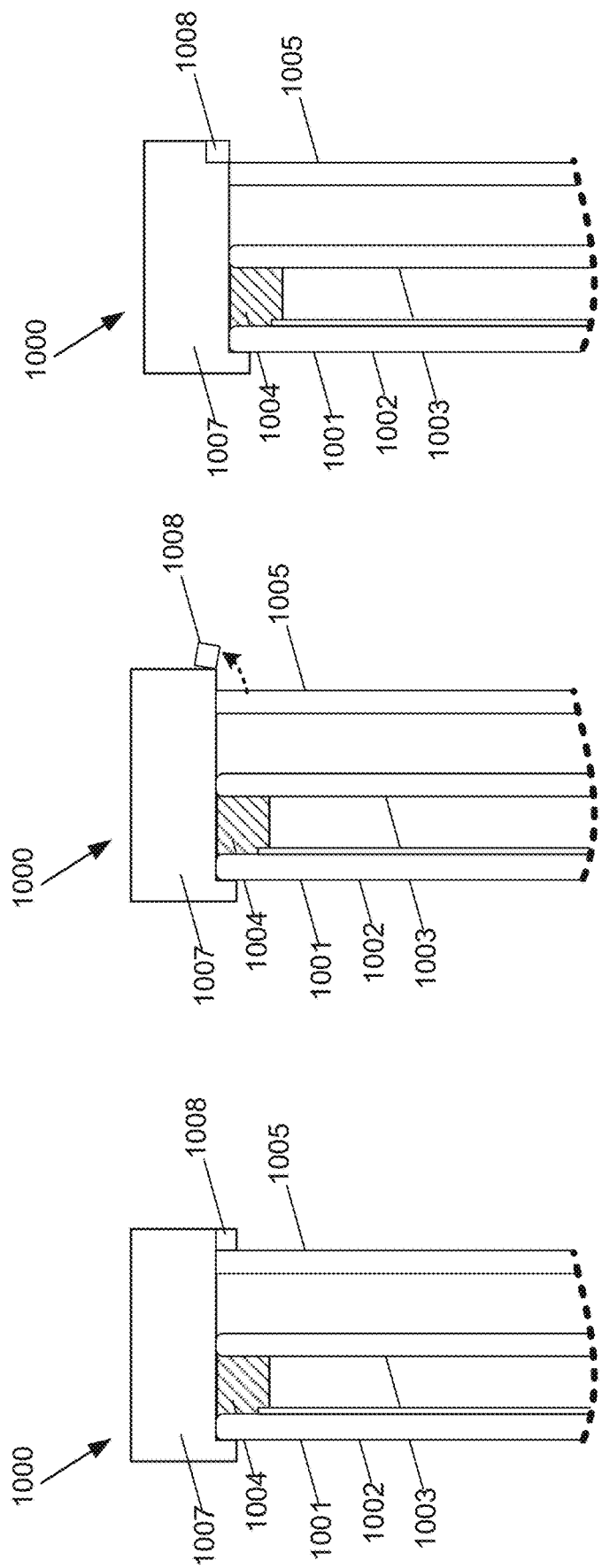

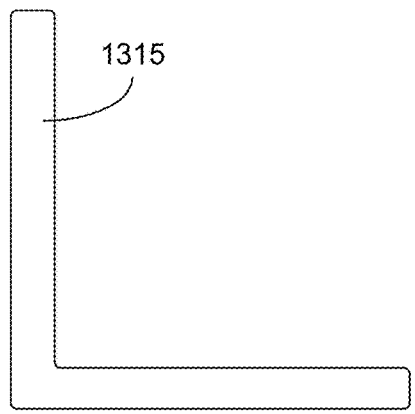
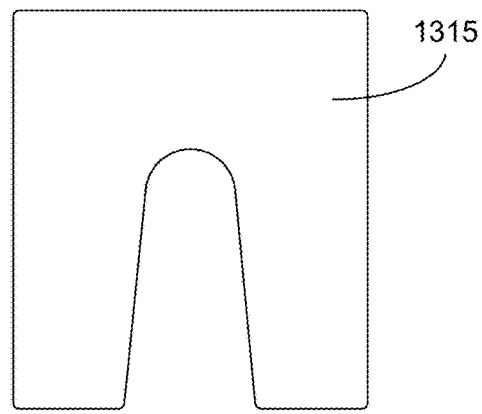
First View
(without fastener)
Second View
(without fastener)
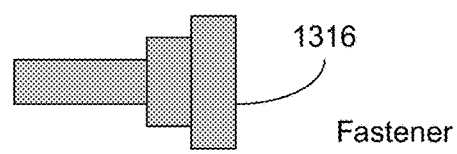
Fastener
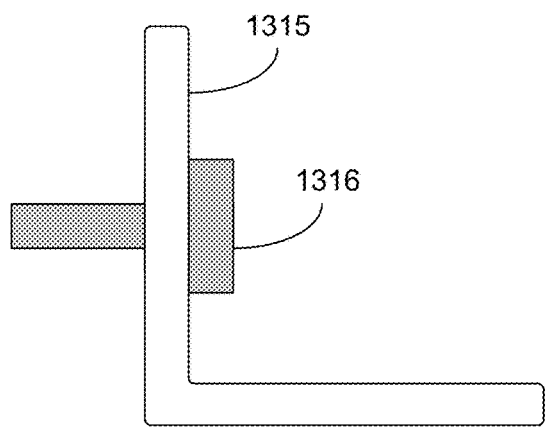
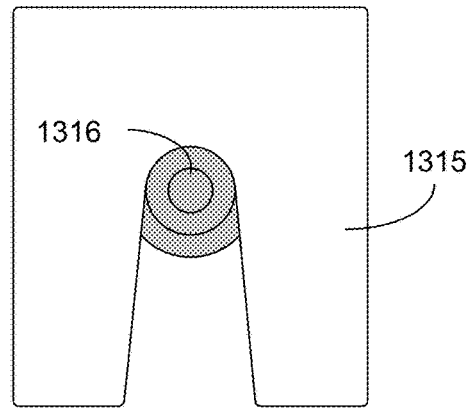
First View
(with fastener)
Second View
(with fastener)
*FIGURE 13a*

| Function | Outer Lite | | Inner Lite | | Window Controller | Mullion [Window Frame] | Implementation |
|---|---|---|---|---|---|---|---|
| | S1 | S2 | S3 | S4 | | | |
| Anti Jammer | GP* | EC | GP | GP* | | RF gasket from the frame to the IGU to complete the shield | RF blocking transparent film deposited on S1, S3, or S4 of an IGU. One embodiment is S3. Another embodiment is a film on both S3 and S4 (two films for higher performance). |
| Wi-Fi Repeater | | EC | Antenna | | X | | Omni directional antenna (for interior and exterior coverage) patterned on S3, with Wi-Fi signal processing on window controller. |
| | | EC | Antenna | GP | X | | Exterior radiating antenna patterned on S3, with Wi-Fi signal processing on window controller. |
| | | EC | GP | Antenna | X | | Interior radiating antenna patterned on S4, with Wi-Fi signal processing on window controller. |
| | Antenna | EC | GP | Antenna | X | | Selective exterior and interior radiating antennas patterned on S1 and S4, with Wi-Fi signal processing on window controller. |
| | | EC | | | X | Antenna | Omni directional Wi-Fi embedded antenna(s) on mullions' inside surface, Wi-Fi signal processing on window controller. |
| | Antenna | EC | | | X | | Omni directional embedded antenna on S1 wired through the pigtail wire, Wi-Fi signal processing on Window Controller. |

FIGURE 27

DISPLAYS FOR TINTABLE WINDOWS

CROSS-REFERENCES TO RELATED APPLICATIONS

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance.

Electrochromic materials may be incorporated into, for example, windows for home, commercial and other uses as thin film coatings on the window glass. The color, transmittance, absorbance, and/or reflectance of such windows may be changed by inducing a change in the electrochromic material, for example, electrochromic windows are windows that can be darkened or lightened electronically. A small voltage applied to an electrochromic device of the window will cause them to darken; reversing the voltage polarity causes them to lighten. This capability allows control of the amount of light that passes through the windows, and presents an opportunity for electrochromic windows to be used as energy-saving devices.

While electrochromic devices, and particularly electrochromic windows, are finding acceptance in building designs and construction, they have not begun to realize their full commercial potential.

SUMMARY

Certain aspects of this disclosure pertain to a window having (1) at least two lites, (2) an electrochromic device disposed or couples with on one of the lites (3) a transparent display disposed on one of the lites, and (4) a controller configured to control an optical state of the electrochromic device and an optical state of the transparent display. The window may be in the form of an insulated glass unit ("IGU").

In some embodiments, the electrochromic and the transparent display are disposed on the same lite. In some embodiments, the controller is configured to adjust the transparent display between substantially transparent and substantially opaque optical states.

In some embodiments, the controller is configured to adjust the transparent display to a translucent optical state. In some embodiments, the display is a pixelated display, and the controller is also configured to display an image or a graphical user interface on the pixelated display. For example, a graphical user interface displaying options for controlling the optical state of the window or another window can be displayed. In some embodiments, the transparent display is an organic light emitting diode (OLED) display. An OLED display in some embodiments can be used to provide lighting to an interior or exterior environment.

In some embodiments, the transparent display is an electrowetting display having a plurality of pixels where each pixel has at least one cell that can be oscillated between a transparent state and an opaque state. In some cases, the cells are configured to oscillate at a frequency of at least about 30 Hertz, and in some cases, at a frequency of at least about 60 Hertz. In some embodiments, each pixel has a cell that is substantially white (or substantially black) in its opaque state. When the pixels of an electrowetting display can be turned white (or an otherwise light color), the window may include a projector that projects an image onto the electrowetting display. Some of the pixels of an electrowetting display may include cells that provide different colors from one another in their opaque state.

In some embodiments, the transparent display is a passive coating that is substantially transparent to an observer but reflects projected light to form an image. The window may include a projector that projects an image onto the transparent display. A projector may, in some cases, be located on or within a frame configured to hold the window. In some embodiments, the window includes a light guide that directs the image from the projector to the transparent display.

In some embodiments, the window may include a touch-sensitive screen, e.g., associated with the transparent display. This is one type of sensor, tactile, but embodiments may include other sensing capabilities.

In some embodiments, the window also includes an environmental sensor configured to detect at least one chemical. The environmental sensor may include multiple gas sensors that react differently to different gases. The window controller may be configured to receive data from the environmental sensor and have logic for determining a gas based on reactions to the gas by the at least two gas sensors.

In some embodiments, the lite having the disposed or coupled transparent display is configured to be removed from the window. In some embodiments, the controller is configured to control the optical state of the electrochromic device based on the current optical state of the transparent display.

In some embodiments, the controller is configured to control the optical state of the transparent display based on received user instructions. User instructions can be provided, e.g., from a mobile device in communication with the controller or from a web-based application. The window in some cases may include a microphone in communication with the controller so that the controller can receive audible user instructions. In some case, the window includes a camera in communication with the controller and the user instructions are received detecting user motion (e.g., gestures provided by a user). In some case, the window includes a touch sensor (in some cases located on the same lite as a transparent display) disposed on a lite and in communication with the controller, wherein the controller is configured to receive user instructions provided by user interaction with the touch sensor.

Another aspect of this disclosure pertains to a window having (1) at least two lites; (2) an electrochromic device disposed on one of the at least two lites; (3) an environmental sensor disposed on one of the lites; and (4) a controller configured to control the optical state of the electrochromic device and detect and/or quantify the presence of at least one chemical.

The environmental sensor may be disposed on or coupled to one of the lites. In some cases, it is configured to determine a concentration of carbon monoxide, lead, ground-level ozone, particulate matter, nitrogen dioxide, and/or sulfur dioxide. In some cases, the environmental sensor is further configured to detect a dust level on a surface of at least one of the two lites.

Another aspect of this disclosure pertains to a building having: (A) a plurality of windows between the interior and the exterior of the building, where each window has an electrochromic device and a transparent display in the window's viewable region, and where the display is substantially transparent when viewed in at least one direction for at least one optical state; (B) a communications interface configured to receive instructions for controlling the optical state of the display for each of the plurality of widows; and (C) a plurality of controllers connected via a network that are configured to control the optical state of the electrochromic device and the display for each of the plurality of widows, wherein the controllers are configured to control the display for at least one window based on the received instructions.

In some cases, the communications interface is also configured to receive instructions for controlling the optical state of the electrochromic device for at least one of the plurality of windows.

In some cases, at least one of the displays in the building is pixelated and configured to display an image. The controllers may be configured to display images on pixelated display(s) based on the received instructions. In some cases, e.g., signage applications, the controllers can be configured to display an image such that the image is partitioned across multiple displays (e.g., a subset of displays on, e.g., one side of a building) based on received instructions. An image displayed by the at least one pixelated display is visible from the exterior of the building and/or from the exterior of the building depending on the configuration.

In some cases, window displays in a building include organic light emitting diode (OLED) displays or electrowetting displays. Electrowetting displays can, in some embodiments, be adjusted between substantially transparent and substantially opaque optical states. This can allow for the display to act as a privacy curtain. In some cases, a transparent window display may be a passive coating that reflects projected light.

In some cases, the communications interface in the building is configured to receive instructions via the internet or via a mobile device. The communications interface, in some embodiments, includes one or more sensors in communication with the plurality of controllers that are configured to receive audible instructions, touch-based instructions, and/or gesture-based instructions.

These and other features of the disclosure will be described in more detail below.

BRIEF DESCRIPTION OF THE DRAWINGS

FIGS. 10a-10c depict an electrochromic window with a removable display lite.

FIGS. 13a and 13b depict a retainer and faster which may be used to secure a display lite.

FIG. 27 provides a table showing a number of configurations where an electrochromic window can enable RF communications and/or serve as a signal blocking device.

DETAILED DESCRIPTION

Introduction

Figure 1:
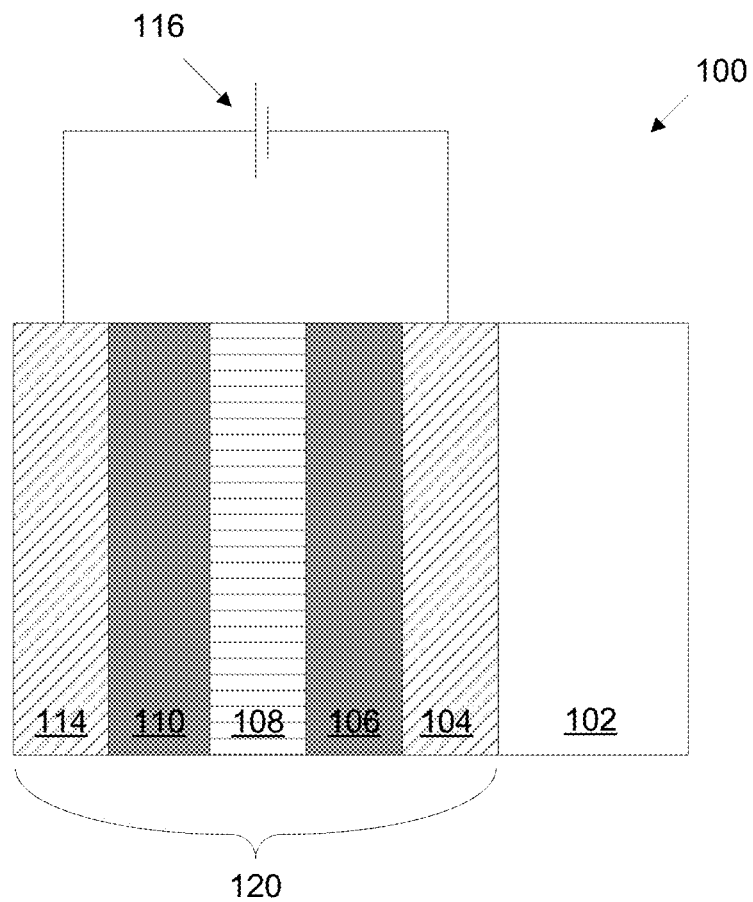
FIG. 1 shows a cross-sectional view of an electrochromic device coating that may be used in a tintable window

The following detailed description is directed to certain embodiments or implementations for the purposes of describing the disclosed aspects. However, the teachings herein can be applied and implemented in a multitude of different ways. In the following detailed description, references are made to the accompanying drawings. Although the disclosed implementations are described in sufficient detail to enable one skilled in the art to practice the implementations, it is to be understood that these examples are not limiting; other implementations may be used and changes may be made to the disclosed implementations without departing from their spirit and scope. Furthermore, while the disclosed embodiments focus on electrochromic windows (also referred to as optically switchable windows, tintable and smart windows), the concepts disclosed herein may apply to other types of switchable optical devices including, for example, liquid crystal devices and suspended particle devices, among others. For example, a liquid crystal device or a suspended particle device, rather than an electrochromic device, could be incorporated into some or all of the disclosed implementations. Additionally, the conjunction "or" is intended herein in the inclusive sense where appropriate unless otherwise indicated; for example, the phrase "A, B or C" is intended to include the possibilities of "A," "B," "C," "A and B," "B and C," "A and C" and "A, B, and C."

Tintable windows—A tintable window (sometimes referred to as an optically switchable window) is a window that exhibits a controllable and reversible change in an optical property when a stimulus is applied, e.g., an electric voltage. Tintable windows can be used to control lighting conditions and the temperature within a building by regulating the transmission of solar energy and thus heat load imposed on the interior of the building. The control may be manual or automatic and may be used for maintaining occupant comfort while reducing the energy consumption of heating, air conditioning and/or lighting systems. In some cases, tintable windows may be responsive to environmental sensors and user control. In this application, tintable windows are most frequently described with reference to electrochromic windows located between the interior and the exterior of a building or structure. However, this need not be the case. Tintable windows may operate using liquid crystal devices, suspended particle devices, microelectromechanical systems (MEMS) devices (such as microshutters), or any technology known now, or later developed, that is configured to control light transmission through a window. Windows with MEMS devices for tinting are further described in U.S. patent application Ser. No. 14/443,353, filed May 15, 2015, and titled "MULTI-PANE WINDOWS INCLUDING ELECTROCHROMIC DEVICES AND ELECTROMECHANICAL SYSTEMS DEVICES," which is herein incorporated by reference in its entirety. In some cases, tintable windows can be located within the interior of a building, e.g., between a conference room and a hallway. In some cases, tintable windows can be used in automobiles, trains, aircraft, and other vehicles in lieu of a passive or non-tinting window.

Electrochromic (EC) device coatings—An EC device coating (sometimes referred to as an EC device (ECD) is a coating comprising at least one layer of electrochromic material that exhibits a change from one optical state to another when an electric potential is applied across the EC device. The transition of the electrochromic layer from one optical state to another optical state can be caused by reversible ion insertion into the electrochromic material (for example, by way of intercalation) and a corresponding injection of charge-balancing electrons. In some instances, some fraction of the ions responsible for the optical transition is irreversibly bound up in the electrochromic material. In many EC devices, some or all of the irreversibly bound ions can be used to compensate for "blind charge" in the material. In some implementations, suitable ions include lithium ions (Li+) and hydrogen ions (H+) (i.e., protons). In some other implementations, other ions can be suitable. Intercalation of lithium ions, for example, into tungsten oxide ($WO_{3-y}$ ($0 < y \leq \sim 0.3$)) causes the tungsten oxide to change from a transparent state to a blue state. EC device coatings as described herein are located within the viewable portion of the tintable window such that the tinting of the EC device coating can be used to control the optical state of the tintable window.

A schematic cross-section of an electrochromic device 100 in accordance with some embodiments is shown in FIG. 1. The EC device coating is attached to a substrate 102, a transparent conductive layer (TCL) 104, an electrochromic layer (EC) 106 (sometimes also referred to as a cathodically coloring layer or a cathodically tinting layer), an ion conducting layer or region (IC) 108, a counter electrode layer (CE) 110 (sometimes also referred to as an anodically coloring layer or anodically tinting layer), and a second TCL 114. Elements 104, 106, 108, 110, and 114 are collectively referred to as an electrochromic stack 120. A voltage source 116 operable to apply an electric potential across the electrochromic stack 120 effects the transition of the electrochromic coating from, e.g., a clear state to a tinted state. In other embodiments, the order of layers is reversed with respect to the substrate. That is, the layers are in the following order: substrate, TCL, counter electrode layer, ion conducting layer, electrochromic material layer, TCL.

In various embodiments, the ion conductor region 108 may form from a portion of the EC layer 106 and/or from a portion of the CE layer 110. In such embodiments, the electrochromic stack 120 may be deposited to include cathodically coloring electrochromic material (the EC layer) in direct physical contact with an anodically coloring counter electrode material (the CE layer). The ion conductor region 108 (sometimes referred to as an interfacial region, or as an ion conducting substantially electronically insulating layer or region) may then form where the EC layer 106 and the CE layer 110 meet, for example through heating and/or other processing steps. Electrochromic devices fabricated without depositing a distinct ion conductor material are further discussed in U.S. patent application Ser. No. 13/462,725, filed May 2, 2012, and titled "ELECTROCHROMIC DEVICES," which is herein incorporated by reference in its entirety. In some embodiments, an EC device coating may also include one or more additional layers such as one or more passive layers. For example, passive layers can be used to improve certain optical properties, to provide moisture or to provide scratch resistance. These or other passive layers also can serve to hermetically seal the EC stack 120. Additionally, various layers, including transparent conducting layers (such as 104 and 114), can be treated with anti-reflective or protective oxide or nitride layers.

In certain embodiments, the electrochromic device reversibly cycles between a clear state and a tinted state. In the clear state, a potential is applied to the electrochromic stack 120 such that available ions in the stack that can cause the electrochromic material 106 to be in the tinted state reside primarily in the counter electrode 110. When the potential applied to the electrochromic stack is reversed, the ions are transported across the ion conducting layer 108 to the electrochromic material 106 and cause the material to enter the tinted state.

It should be understood that the reference to a transition between a clear state and tinted state is non-limiting and suggests only one example, among many, of an electrochromic transition that may be implemented. Unless otherwise specified herein, whenever reference is made to a clear-tinted transition, the corresponding device or process encompasses other optical state transitions such as non-reflective-reflective, transparent-opaque, etc. Further, the terms "clear" and "bleached" refer to an optically neutral state, e.g., untinted, transparent or translucent. Still further, unless specified otherwise herein, the "color" or "tint" of an electrochromic transition is not limited to any particular wavelength or range of wavelengths. As understood by those of skill in the art, the choice of appropriate electrochromic and counter electrode materials governs the relevant optical transition.

In certain embodiments, all of the materials making up electrochromic stack 120 are inorganic, solid (i.e., in the solid state), or both inorganic and solid. Because organic materials tend to degrade over time, particularly when exposed to heat and UV light as tinted building windows are, inorganic materials offer the advantage of a reliable electrochromic stack that can function for extended periods of time. Materials in the solid state also offer the advantage of not having containment and leakage issues, as materials in the liquid state often do. It should be understood that any one or more of the layers in the stack may contain some amount of organic material, but in many implementations, one or more of the layers contain little or no organic matter. The same can be said for liquids that may be present in one or more layers in small amounts. It should also be understood that solid state material may be deposited or otherwise formed by processes employing liquid components such as certain processes employing sol-gels or chemical vapor deposition.

Figure 2:
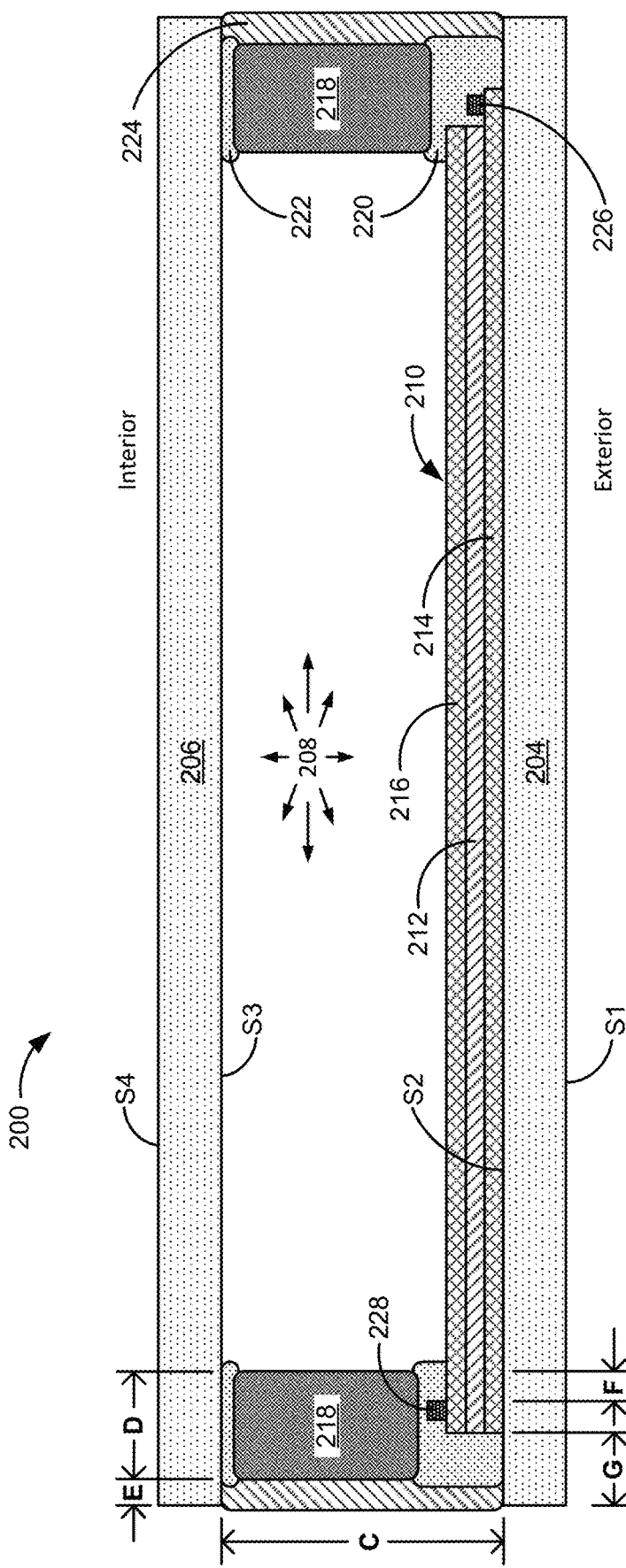
FIG. 2 shows a cross-sectional side view of a tintable window constructed as an IGU.

FIG. 2 shows a cross-sectional view of an example tintable window taking the form of an insulated glass unit ("IGU") 200 in accordance with some implementations. Generally speaking, unless stated otherwise, the terms "IGU," "tintable window," and "optically switchable window" are used interchangeably. This depicted convention is generally used, for example, because it is common and because it can be desirable to have IGUs serve as the fundamental constructs for holding electrochromic panes (also referred to as "lites") when provided for installation in a building. An IGU lite or pane may be a single substrate or a multi-substrate construct, such as a laminate of two substrates. IGUs, especially those having double- or triple-pane configurations, can provide a number of advantages over single pane configurations; for example, multi-pane configurations can provide enhanced thermal insulation, noise insulation, environmental protection and/or durability when compared with single-pane configurations. A multi-pane configuration also can provide increased protection for an ECD, for example, because the electrochromic films, as well as associated layers and conductive interconnects, can be formed on an interior surface of the multi-pane IGU and be protected by an inert gas fill in the interior volume, 208, of the IGU. The inert gas fill provides at least some of the (heat) insulating function of an IGU. Electrochromic IGU's have added heat blocking capability by virtue of a tintable coating that absorbs (or reflects) heat and light.

FIG. 2 more particularly shows an example implementation of an IGU 200 that includes a first pane 204 having a first surface S1 and a second surface S2. In some implementations, the first surface S1 of the first pane 204 faces an exterior environment, such as an outdoors or outside environment. The IGU 200 also includes a second pane 206 having a first surface S3 and a second surface S4. In some implementations, the second surface S4 of the second pane 206 faces an interior environment, such as an inside environment of a home, building or vehicle, or a room or compartment within a home, building or vehicle.

In some implementations, each of the first and the second panes 204 and 206 are transparent or translucent—at least to light in the visible spectrum. For example, each of the panes 204 and 206 can be formed of a glass material and especially an architectural glass or other shatter-resistant glass material such as, for example, a silicon oxide ($SO_x$)-based glass material. As a more specific example, each of the first and the second panes 204 and 206 can be a soda-lime glass substrate or float glass substrate. Such glass substrates can be composed of, for example, approximately 75% silica ($SiO_2$) as well as $Na_2O$, CaO, and several minor additives. However, each of the first and the second panes 204 and 206 can be formed of any material having suitable optical, electrical, thermal, and mechanical properties. For example, other suitable substrates that can be used as one or both of the first and the second panes 204 and 206 can include other glass materials as well as plastic, semi-plastic and thermoplastic materials (for example, poly(methyl methacrylate), polystyrene, polycarbonate, allyl diglycol carbonate, SAN (styrene acrylonitrile copolymer), poly(4-methyl-1-pentene), polyester, polyamide), or mirror materials. In some implementations, each of the first and the second panes 204 and 206 can be strengthened, for example, by tempering, heating, or chemically strengthening.

Generally, each of the first and the second panes 204 and 206, as well as the IGU 200 as a whole, is a rectangular solid. However, in some other implementations other shapes are possible and may be desired (for example, circular, elliptical, triangular, curvilinear, convex or concave shapes). In some specific implementations, a length "L" of each of the first and the second panes 204 and 206 can be in the range of approximately 20 inches (in.) to approximately 10 feet (ft.), a width "W" of each of the first and the second panes 204 and 206 can be in the range of approximately 20 in. to approximately 10 ft., and a thickness "T" of each of the first and the second panes 204 and 206 can be in the range of approximately 0.3 millimeters (mm) to approximately 10 mm (although other lengths, widths or thicknesses, both smaller and larger, are possible and may be desirable based on the needs of a particular user, manager, administrator, builder, architect or owner). In examples where thickness T of substrate 204 is less than 3 mm, typically the substrate is laminated to an additional substrate which is thicker and thus protects the thin substrate 204. Additionally, while the IGU 200 includes two panes (204 and 206), in some other implementations, an IGU can include three or more panes. Furthermore, in some implementations, one or more of the panes can itself be a laminate structure of two, three, or more layers or sub-panes.

The first and second panes 204 and 206 are spaced apart from one another by a spacer 218, which is typically a frame structure, to form an interior volume 208. In some implementations, the interior volume is filled with Argon (Ar), although in some other implementations, the interior volume 108 can be filled with another gas, such as another noble gas (for example, krypton (Kr) or xenon (Xn)), another (non-noble) gas, or a mixture of gases (for example, air). Filling the interior volume 208 with a gas such as Ar, Kr, or Xn can reduce conductive heat transfer through the IGU 200 because of the low thermal conductivity of these gases as well as improve acoustic insulation due to their increased atomic weights. In some other implementations, the interior volume 208 can be evacuated of air or other gas. Spacer 218 generally determines the height "C" of the interior volume 208; that is, the spacing between the first and the second panes 204 and 206. In FIG. 2, the thickness of the ECD, sealant 220/222 and bus bars 226/228 is not to scale; these components are generally very thin but are exaggerated here for ease of illustration only. In some implementations, the spacing "C" between the first and the second panes 204 and 206 is in the range of approximately 6 mm to approximately 30 mm. The width "D" of spacer 218 can be in the range of approximately 5 mm to approximately 25 mm (although other widths are possible and may be desirable).

Although not shown in the cross-sectional view, spacer 218 is generally a frame structure formed around all sides of the IGU 200 (for example, top, bottom, left and right sides of the IGU 200). For example, spacer 218 can be formed of a foam or plastic material. However, in some other implementations, spacers can be formed of metal or other conductive material, for example, a metal tube or channel structure having at least 3 sides, two sides for sealing to each of the substrates and one side to support and separate the lites and as a surface on which to apply a sealant, 224. A first primary seal 220 adheres and hermetically seals spacer 218 and the second surface S2 of the first pane 204. A second primary seal 222 adheres and hermetically seals spacer 218 and the first surface S3 of the second pane 206. In some implementations, each of the primary seals 220 and 222 can be formed of an adhesive sealant such as, for example, polyisobutylene (PIB). In some implementations, IGU 200 further includes secondary seal 224 that hermetically seals a border around the entire IGU 200 outside of spacer 218. To this end, spacer 218 can be inset from the edges of the first and the second panes 204 and 206 by a distance "E." The distance "E" can be in the range of approximately 4 mm to approximately 8 mm (although other distances are possible and may be desirable). In some implementations, secondary seal 224 can be formed of an adhesive sealant such as, for example, a polymeric material that resists water and that adds structural support to the assembly, such as silicone, polyurethane and similar structural sealants that form a watertight seal.

In the implementation shown in FIG. 2, an ECD 210 is formed on the second surface S2 of the first pane 204. In some other implementations, ECD 210 can be formed on another suitable surface, for example, the first surface S1 of the first pane 204, the first surface S3 of the second pane 206 or the second surface S4 of the second pane 206. The ECD 210 includes an electrochromic ("EC") stack 212, which itself may include one or more layers as described with reference to FIG. 1.

Window Controllers—Window controllers are associated with one or more tintable windows and are configured to control a window's optical state by applying a stimulus to the window—e.g., by applying a voltage or a current to an EC device coating. Window controllers as described herein may have many sizes, formats, and locations with respect to the optically switchable windows they control. Typically, the controller will be attached to a lite of an IGU or laminate but it can also be in a frame that houses the IGU or laminate or even in a separate location. As previously mentioned, a tintable window may include one, two, three or more individual electrochromic panes (an electrochromic device on a transparent substrate). Also, an individual pane of an electrochromic window may have an electrochromic coating that has independently tintable zones. A controller as described herein can control all electrochromic coatings associated with such windows, whether the electrochromic coating is monolithic or zoned.

If not directly, attached to a tintable window, IGU, or frame, the window controller is generally located in proximity to the tintable window. For example, a window controller may be adjacent to the window, on the surface of one of the window's lites, within a wall next to a window, or within a frame of a self-contained window assembly. In some embodiments, the window controller is an "in situ" controller; that is, the controller is part of a window assembly, an IGU or a laminate, and may not have to be matched with the electrochromic window, and installed, in the field, e.g., the controller travels with the window as part of the assembly from the factory. The controller may be installed in the window frame of a window assembly, or be part of an IGU or laminate assembly, for example, mounted on or between panes of the IGU or on a pane of a laminate. In cases where a controller is located on the visible portion of an IGU, at least a portion of the controller may be substantially transparent. Further examples of on glass controllers are provided in U.S. patent application Ser. No. 14/951,410, filed Nov. 14, 2015, and titled "SELF CONTAINED EC IGU," which is herein incorporated by reference in its entirety. In some embodiments, a localized controller may be provided as more than one part, with at least one part (e.g., including a memory component storing information about the associated electrochromic window) being provided as a part of the window assembly and at least one other part being separate and configured to mate with the at least one part that is part of the window assembly, IGU or laminate. In certain embodiments, a controller may be an assembly of interconnected parts that are not in a single housing, but rather spaced apart, e.g., in the secondary seal of an IGU. In other embodiments the controller is a compact unit, e.g., in a single housing or in two or more components that combine, e.g., a dock and housing assembly, that is proximate the glass, not in the viewable area, or mounted on the glass in the viewable area.

In one embodiment, the window controller is incorporated into or onto the IGU and/or the window frame prior to installation of the tintable window, or at least in the same building as the window. In one embodiment, the controller is incorporated into or onto the IGU and/or the window frame prior to leaving the manufacturing facility. In one embodiment, the controller is incorporated into the IGU, substantially within the secondary seal. In another embodiment, the controller is incorporated into or onto the IGU, partially, substantially, or wholly within a perimeter defined by the primary seal between the sealing separator and the substrate.

Having the controller as part of an IGU and/or a window assembly, the IGU can possess logic and features of the controller that, e.g., travels with the IGU or window unit. For example, when a controller is part of the IGU assembly, in the event the characteristics of the electrochromic device(s) change over time (e.g., through degradation), a characterization function can be used, for example, to update control parameters used to drive tint state transitions. In another example, if already installed in an electrochromic window unit, the logic and features of the controller can be used to calibrate the control parameters to match the intended installation, and for example if already installed, the control parameters can be recalibrated to match the performance characteristics of the electrochromic pane(s).

In other embodiments, a controller is not pre-associated with a window, but rather a dock component, e.g., having parts generic to any electrochromic window, is associated with each window at the factory. After window installation, or otherwise in the field, a second component of the controller is combined with the dock component to complete the electrochromic window controller assembly. The dock component may include a chip which is programmed at the factory with the physical characteristics and parameters of the particular window to which the dock is attached (e.g., on the surface which will face the building's interior after installation, sometimes referred to as surface 4 or "S4"). The second component (sometimes called a "carrier," "casing," "housing," or "controller") is mated with the dock, and when powered, the second component can read the chip and configure itself to power the window according to the particular characteristics and parameters stored on the chip. In this way, the shipped window need only have its associated parameters stored on a chip, which is integral with the window, while the more sophisticated circuitry and components can be combined later (e.g., shipped separately and installed by the window manufacturer after the glazier has installed the windows, followed by commissioning by the window manufacturer). Various embodiments will be described in more detail below. In some embodiments, the chip is included in a wire or wire connector attached to the window controller. Such wires with connectors are sometimes referred to as pigtails.

As discussed, an "IGU" includes two (or more) substantially transparent substrates, for example, two panes of glass, where at least one substrate includes an electrochromic device disposed thereon, and the panes have a separator disposed between them. An IGU is typically hermetically sealed, having an interior region that is isolated from the ambient environment. A "window assembly" may include an IGU or for example a stand-alone laminate, and includes electrical leads for connecting the IGUs or laminates one or more electrochromic devices to a voltage source, switches and the like, and may include a frame that supports the IGU or laminate. A window assembly may include a window controller as described herein, and/or components of a window controller (e.g., a dock).

As used herein, the term outboard means closer to the outside environment, while the term inboard means closer to the interior of a building. For example, in the case of an IGU having two panes, the pane located closer to the outside environment is referred to as the outboard pane or outer pane, while the pane located closer to the inside of the building is referred to as the inboard pane or inner pane. As labeled in FIG. 2, the different surfaces of the IGU may be referred to as S1, S2, S3, and S4 (assuming a two-pane IGU). S1 refers to the exterior-facing surface of the outboard lite (i.e., the surface that can be physically touched by someone standing outside). S2 refers to the interior-facing surface of the outboard lite. S3 refers to the exterior-facing surface of the inboard lite. S4 refers to the interior-facing surface of the inboard lite (i.e., the surface that can be physically touched by someone standing inside the building). In other words, the surfaces are labeled S1-S4, starting from the outermost surface of the IGU and counting inwards. In cases where an IGU includes three panes, this same trend holds (with S6 being the surface that can be physically touched by someone standing inside the building). In certain embodiments employing two panes, the electrochromic device (or other optically switchable device) is disposed on S3.

Further examples of window controllers and their features are presented in U.S. patent application Ser. No. 13/449,248, filed Apr. 17, 2012, and titled "CONTROLLER FOR OPTICALLY-SWITCHABLE WINDOWS"; U.S. patent application Ser. No. 13/449,251, filed Apr. 17, 2012, and titled "CONTROLLER FOR OPTICALLY-SWITCHABLE WINDOWS"; U.S. patent application Ser. No. 15/334,835, filed Oct. 26, 2016, and titled "CONTROLLERS FOR OPTICALLY-SWITCHABLE DEVICES"; and International Patent Application No. PCT/US17/20805, filed Mar. 3, 2017, and titled "METHOD OF COMMISSIONING ELECTROCHROMIC WINDOWS," each of which is herein incorporated by reference in its entirety Window Control System—When a building is outfitted with tintable windows, window controllers may be connected to one another and/or other entities via a communications network sometimes referred to as a window control network or a window network. The network and the various devices (e.g., controllers and sensors) that are connected via the network (e.g., wired or wireless power transfer and/or communication) are referred to herein as a window control system. Window control networks may provide tint instructions to window controllers, provide window information to master controllers or other network entities, and the like. Examples of window information include current tint state or other information collected by window controller. In some cases, a window controller has one or more associated sensors including, for example, a photosensor, a temperature sensor, an occupancy sensor, and/or gas sensors that provide sensed information over the network. In some cases, information transmitted over a window communication network need not impact window control. For example, information received at a first window configured to receive a WiFi or LiFi signal may be transmitted over the communication network to a second window configured to wirelessly broadcast the information as, e.g., a WiFi or LiFi signal. A window control network need not be limited to providing information for controlling tintable windows, but may also be able to communicate information for other devices interfacing with the communications network such as HVAC systems, lighting systems, security systems, personal computing devices, and the like.

Figure 3:
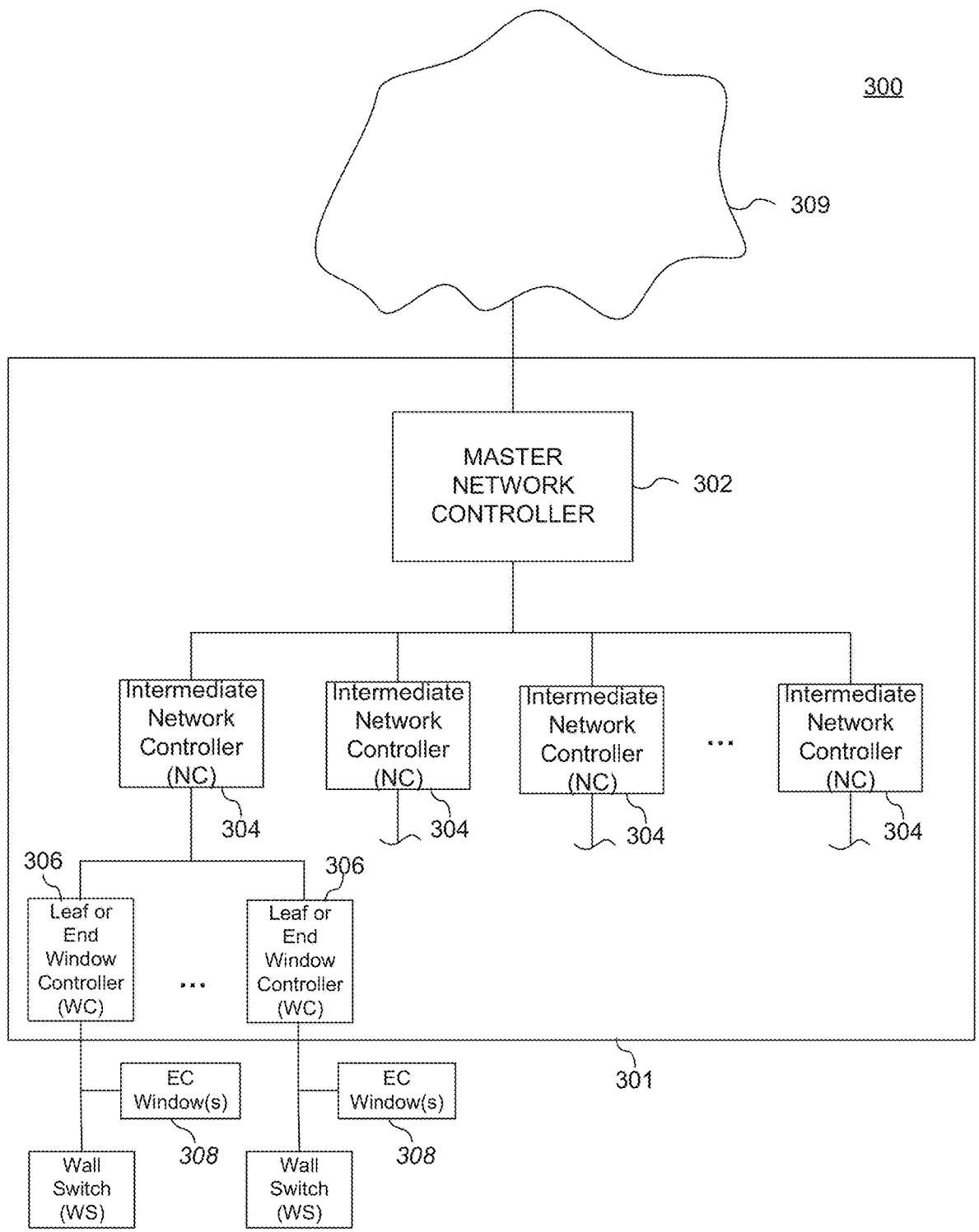
FIG. 3 depicts a window control network provided by of a window control system having one or more tintable windows.

FIG. 3 provides an example of a control network 301 of a window control system 300. The network may distribute both control instructions and feedback, as well as serving as a power distribution network. A master controller 302 communicates and functions in conjunction with multiple network controllers 304, each of which network controllers is capable of addressing a plurality of window controllers 306 (sometimes referred to herein as leaf controllers) that apply a voltage or current to control the tint state of one or more optically switchable windows 308. Communication controllers (304, 306, and 308) may occur via wired (e.g., Ethernet) or via a wireless (e.g., WiFi or LiFi) connection. In some implementations, the master controller issues the high-level instructions (such as the final tint states of the electrochromic windows) to the network controllers, and the network controllers then communicate the instructions to the corresponding window controllers. Typically a master controller is configured to communicate with one or more outward face networks 309. Window control network 301 can include any suitable number of distributed controllers having various capabilities or functions and need not be arranged in the hierarchical structure depicted in FIG. 3. As discussed elsewhere herein, network 301 may also be used as a communication network between distributed controllers (e.g., 302, 304, 306) that act as communication nodes to other devices or systems (e.g., 309).

In some embodiments, outward facing network 309 is part of or connected to a building management system (BMS). A BMS is a computer-based control system that can be installed in a building to monitor and control the building's mechanical and electrical equipment. A BMS may be configured to control the operation of HVAC systems, lighting systems, power systems, elevators, fire systems, security systems, and other safety systems. BMSs are frequently used in large buildings where they function to control the environment within the building. For example, a BMS may monitor and control the lighting, temperature, carbon dioxide levels, and humidity within the building. In doing so, a BMS may control the operation of furnaces, air conditioners, blowers, vents, gas lines, water lines, and the like. To control a building's environment, the BMS may turn on and off these various devices according to rules established by, for example, a building administrator. One function of a BMS is to maintain a comfortable environment for the occupants of a building. In some implementations, a BMS can be configured not only to monitor and control building conditions, but also to optimize the synergy between various systems—for example, to conserve energy and lower building operation costs. In some implementations, a BMS can be configured with a disaster response. For example, a BMS may initiate the use of backup generators and turn off water lines and gas lines. In some cases, a BMS has a more focused application—e.g., simply controlling the HVAC system—while parallel systems such as lighting, tintable window, and/or security systems stand alone or interact with the BMS.

In some embodiments, network 309 is a remote network. For example, network 309 may operate in the cloud or on a device remote from the building having the optically switchable windows. In some embodiments, network 309 is a network that provides information or allows control of optically switchable windows via a remote wireless device. In some cases, network 309 includes seismic event detection logic. Further examples of window control systems and their features are presented in U.S. patent application Ser. No. 15/334,832, filed Oct. 26, 2016, and titled "CONTROLLERS FOR OPTICALLY-SWITCHABLE DEVICES" and International Patent Application No. PCT/US17/62634, filed on Nov. 23, 2016, and titled "AUTOMATED COMMISSIONING OF CONTROLLERS IN A WINDOW NETWORK," both of which are herein incorporated by reference in its entirety.

Electrochromic Windows with Transparent Display Technology

Applicant has previously developed IGUs with integrated photovoltaics, onboard storage, integrated antennas, integrated sensors, an API to serve up valuable data, etc. It has been found that electrochromic windows can be further improved in surprising ways, e.g., by combining with transparent display technology as well as augmenting sensor, onboard antenna, and software applications.

Figure 4:
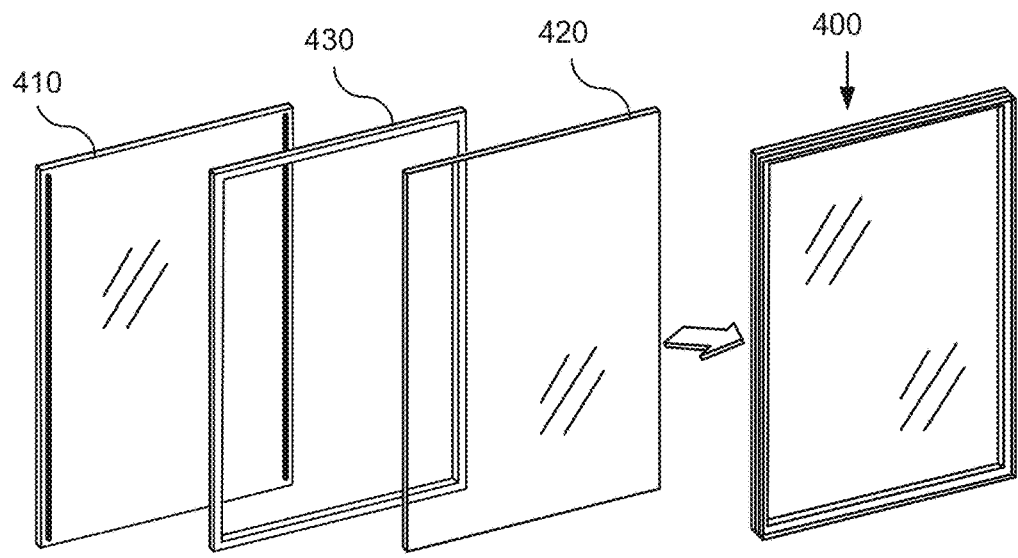
FIG. 4 depicts an electrochromic (EC) window lite, or IGU or laminate, with a transparent display.

One embodiment, depicted in FIG. 4, includes an electrochromic (EC) window lite, or IGU or laminate, combined with a transparent display. The transparent display area may be co-extensive with the EC window viewable area. An electrochromic lite, 410, including a transparent pane with an electrochromic device coating thereon and bus bars for applying driving voltage for tinting and bleaching, is combined with a transparent display panel, 420, in a tandem fashion. In this example, 410 and 420 are combined using a sealing spacer, 430, to form an IGU 400. The transparent display may be a standalone lite for the IGU, or be e.g. a flexible panel laminated or otherwise attached to a glass lite, and that combination is the other lite of the IGU. In typical embodiments, the transparent display is the, or is on the, inboard lite of the IGU, for use by the building occupants. In other embodiments, an electrochromic device coating and transparent display mechanism are combined on a single substrate. In other embodiments, a laminate, rather than an IGU, are formed from 410 and 420, without a sealing spacer.

The transparent display can be used for many purposes. For example, the display can be used for conventional display or projection screen purposes, such as displaying video, presentations, digital media, teleconferencing, web-based meetings including video, security warnings to occupants and/or people outside the building (e.g., emergency response personnel) and the like. The transparent display can also be used for displaying controls for the display, the electrochromic window, an electrochromic window control system, an inventory management system, a security system, a building management system, and the like. In certain embodiments, the transparent display can be used as a physical alarm element. That is, the electrochromic lite of an IGU can be used as a breakage detector to indicate a security breach of the building's perimeter. The transparent display could also, alone or in combination with the electrochromic lite, serve this function. In one example, the electrochromic lite is used as a breakage detection sensor, i.e., breaking the EC pane triggers an alarm. The transparent display may also serve this function, and/or be used as a visual alarm indicator, e.g., displaying information to occupants and/or external emergency personnel. For example, in certain implementations, a transparent display may have a faster electrical response than the electrochromic lite, and thus could be used to indicate alarm status, for example, externally to firefighters, etc. or internally to occupants, e.g., to indicate the nature of the threat and/or escape routes. In one embodiment, breakage of the outboard electrochromic lite sends a signal to the transparent display, via the window controller, such that the transparent display conveys a security breach. In one embodiment, the transparent display flashes a warning message and/or flashes red, e.g., the entire transparent display pane may flash brightly in red to indicate trouble and be easily seen, e.g., a large window flashing in this manner would be easily noticeable to occupants and/or outside personnel. In another example, one or more neighboring windows may indicate damage to a window. For example, in a curtain wall where a first window has four adjacent windows, breakage to the first window triggers one or more of the four adjacent windows to flash red or display large arrows pointing to the first window, to make it easier for occupants or external personnel to know where the trouble is. In a large skyscraper, with many windows, it would be very easy for first responders to see four windows adjacent a central window flashing, i.e., forming a flashing cross to indicate where the trouble is located. If more than one window is broken, this method would allow instant visual confirmation of where the trouble lies. In certain embodiments, one or more transparent displays may be used to display a message to first responders, indicating both the location and nature of the emergency. It may be breakage of one or more windows or indicate, e.g., hotspots within the building for firefighters.

The electrochromic window can be used as a contrast element to aid visualization of the transparent display, e.g., by tinting the EC pane the transparent display will have higher contrast. In turn, the transparent display can be used to augment the color, hue, % T, switching speed, etc. of the electrochromic device. There are many novel symbiotic relationships that can be exploited by the combination of EC window and transparent display technology. When the EC pane and the transparent display are both in their clear state, IGU 400 appears and functions as a conventional window. Transparent display 420 may have some visually discernable conductive grid pattern but otherwise is transparent, and can be uni- or bidirectional in the display function. One of ordinary skill in the art would appreciate that as transparent display technology advances, the clarity and transparency of such devices will improve. Improvements in micro and nanostructured addressable grids, as well as transparent conductor technology, allow for transparent displays where there is no visually discernable conductive grid.

Figure 5:
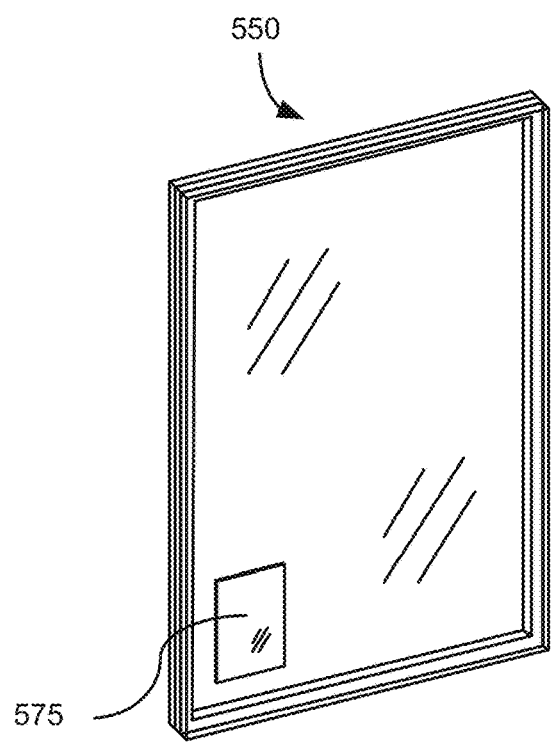
FIG. 5 depicts an electrochromic insulated glass unit with an on-glass transparent display.

FIG. 5 depicts an electrochromic insulated glass unit, 550, with an on-glass transparent display, 575, used as a control interface for IGU 550. Display 575 may be wired to an onboard controller which is, e.g., housed in the secondary sealing volume of the IGU. The wiring for the transparent display 575 may pass through the glass, around the edge of the glass, or may be wirelessly connected to the onboard (or offboard) controller (not shown). When the transparent display 575 is not in use, it is essentially transparent and colorless, so as not to detract from the aesthetics of the IGU's viewable area. Transparent display 575 may be adhesively attached to the glass of the IGU. Wiring to the control unit of the window may pass around or through the glass upon which the display is attached. The display may communicate with a window controller or control system wirelessly via one or more antenna, which may also be transparent.

A transparent display may be located within the viewable area of an optically switchable window. The transparent display may be configured to provide various types of information about windows or the building via, e.g., a graphical user interface. The display may also be used to convey information to the user, e.g., teleconferencing, weather data, financial reports, live streaming data, asset tracking and the like as described herein. In certain embodiments, the transparent display (and associated controller) is configured to show specific information about the window being used (the one displaying the information), information about a zone in which the window resides, and/or information about other particular windows in the building. Depending on user permissions, such information could include information in all windows of a building or even multiple buildings. The transparent displays (and associated controller) may be configured to allow monitoring and/or controlling optically switchable windows on a window network.

In certain embodiments, the graphical user interface may represent windows and/or other controllable systems and devices using smart objects. A "smart object," as described herein, is a representation of one or more material items that can be manipulated by a user (e.g., by contact with a touch-sensitive display) to gather and/or present information about the one or more physical devices the smart object represents. In some cases, a graphical user interface may display a three-dimensional building model with one or more smart objects thereon. By displaying smart objects on the building model according to their physical location, a user in may easily identify a smart object that represents a window of interest. Smart objects allow a user to receive information from, or control an aspect of, the window network and/or a system or electronic device in communication with the window network. For example, if a user has selected a smart object representing a window, information may be displayed such as a window ID, window type, window size, manufacturing date, current tint state, leakage current, usage history, inside temperature, outside temperature, and the like. Additionally, smart objects may present a user with options for controlling a window tint state, configuring a tint schedule, or tinting rules. In some cases, a window may have inboard lite with touch and gesture sensors that allow a user to interact with smart objects in the graphical user interface. In some cases, a user may interact with the smart objects displayed on the graphical user interface using a remote device that is configured to receive user input (e.g., a cell phone, a controller, a keyboard, and the like).

In one example, during the initial installation of a plurality of electrochromic windows, at least one window is installed with transparent display technology. This window may also be configured with power, internet connectivity, and at least one processor (e.g., a window controller, network controller, and/or master controller for the window installation). The at least one window, by virtue of its transparent display functionality, can serve as a GUI for further installation of the plurality of windows in the system to be installed. As the windows of the system are installed, this use may be translated to other windows of the system, and, additionally be used to commission windows of the system. This obviates the need for an installer to have a portable or other separate computing device for commissioning the windows; the window itself and its corresponding processing power can be used during installation to aid further installation and commissioning of the window system. Using, e.g., this at least one window with display technology tradespeople, engineers, and/or construction crews tasked with installing electrical wiring, plumbing, HVAC and other infrastructure may have the ability to pull up building drawings on large format displays, rather than carrying large paper drawings. Moreover, web-based video conferencing e.g., allows workers in disparate areas of the building to communicate with each other and discuss building plans displayed on their screens, manipulate the plans interactively via the touchscreen function of transparent displays described herein.

Figure 6:
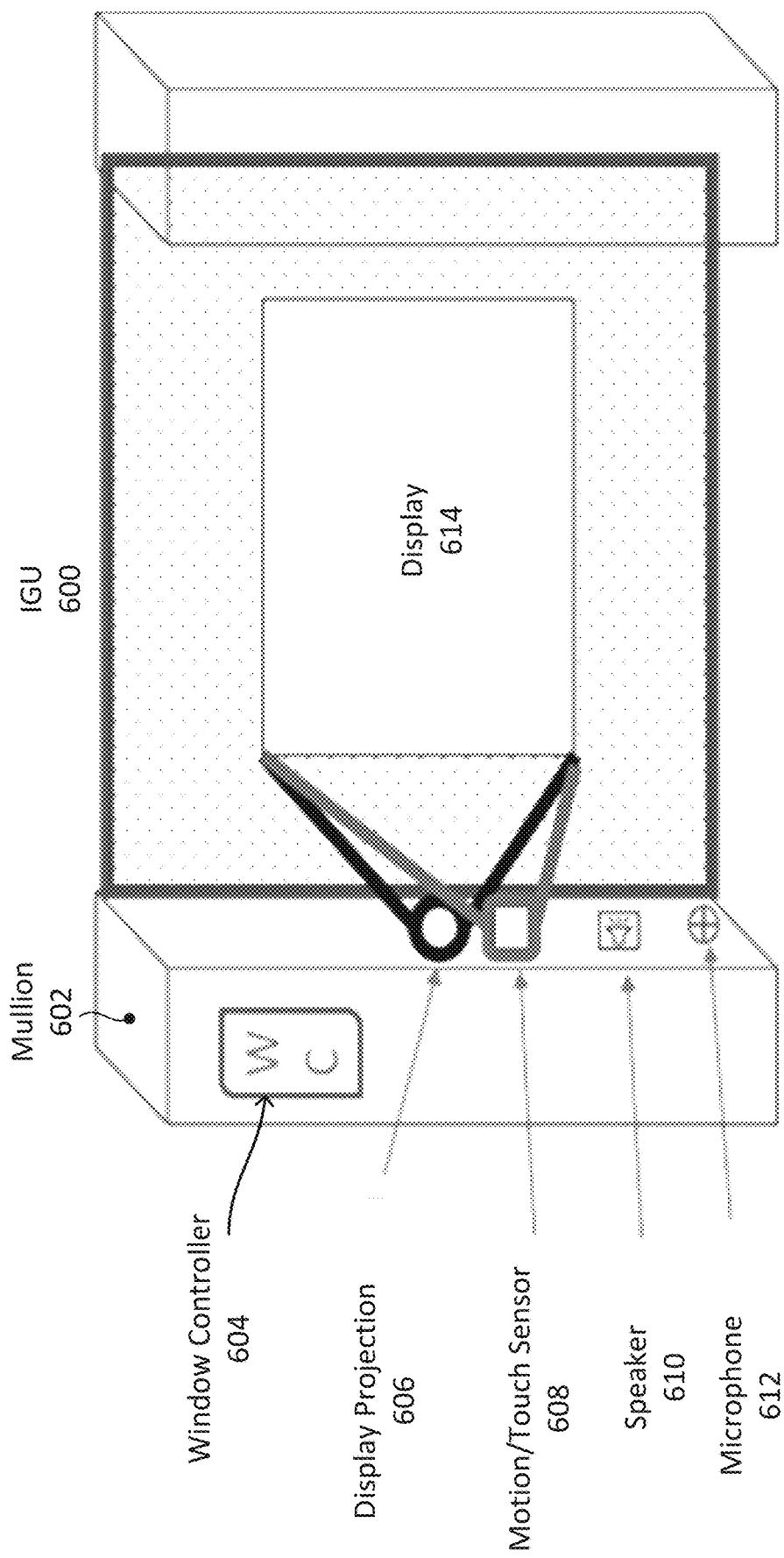
FIG. 6 depicts an optically switchable window configured with a projector for displaying an image on the surface of the optically switchable window.

In certain embodiments, rather than a transparent display registered with an EC device, e.g., in an IGU form factor, an interactive projector is used to both display information onto an EC window and also allow the user to access and input information using the interactive display technology portion of the assembly. FIG. 6 depicts an example of an optically switchable window 600 configured with a projector 606 that displays an image 614 on the surface of the optically switchable window. To improve the visibility of a projected image 614, a window may be configured with a pixelated or monolithic passive coating that is substantially transparent to an observer, but aids in the reflection of the image provided by the projector. In some cases, the level of tinting may be adjusted to improve the visibility of a projected image. In this regard, to ensure that the window tint state is appropriate for projecting, the window controller 604 and projector/display controller 606 may be coupled or in communication. The projector may be located in a mullion 602 (as depicted), a transom, or at a remote location such as a nearby ceiling or a wall. The projector 606 may receive information to display from a window controller 604, which may also be located in a mullion or a transom. In some cases, a projector in a mullion, transom, or similar location is used to project an image through free space and onto a glass surface or a passive coating of the IGU. In some cases, a projector is located within the mullion and projects light onto the display via a light guide that is embedded in, formed by, or attached to a glass substrate of a display lite. The projector may in some embodiments be configured so that the end user does not see the projector mechanism, i.e. it is hidden from view. Light may be projected from the edge of the glass into the light guide, e.g., by using a mirror or by orienting the projector. In this configuration, the projector can be concealed from view so as not to create a visual distraction. In some cases, a light guide plate is used which runs parallel to a lite which has a monolithic passive coating for displaying an image. Examples of light guide plates used for a user wearable display device which can be adapted for use for transparent displays on optically switchable windows are found in US Patent U.S. Pat. No. 9,791,701B2 titled "Display device," and filed on Oct. 17, 2017, which is incorporated in its entirety.

To receive user input corresponding to user motion, the window depicted FIG. 6 may be equipped with motion sensors 608 located on or within mullions and/or transoms. The motion sensors may include one or more cameras to detect user motion (e.g., the motion of a user's hand) and image analysis logic may determine a user's interaction with a displayed smart object based on the detected motion. For example, image analysis logic may determine whether a user's motion corresponds to a gesture used to provide a specific input. In some cases, one or more cameras may be inferred cameras. In some cases, the motion sensors may include ultrasonic transducers and ultrasonic sensors to determine user motion. In some cases, a window may be equipped with a capacitive touch sensor (e.g., on S1 or S4) that at least partially covers the visible portion of the window and receives user input when a user touches the surface of the window. For example, a capacitive touch sensor may be similar to that found in touchscreens such as the Apple iPad. In addition to motion sensors, an optically switchable window may also be equipped with a microphone 612 located in a mullion or transom for receiving audible user input. In some cases, a microphone 612 may be located on a remote device and voice recognition logic may be used to determine user input from received audio. In some cases, audio is recorded on a remote device and transmitted wirelessly to a window controller. Examples of systems that provide a voice-controlled interface for controlling optically switchable windows are provided in PCT Patent Application PCT/US17/29476, filed on Apr. 25, 2017, which is herein incorporated by reference in its entirety. When a window may be configured to receive audible user input, a window may also be configured with one or more speakers 610 for providing information to a user. For example, a speaker 610 may be used respond to a user inquiry or to provide various features that may be controlled by the user. In some cases, a projector such as an Xperia Touch™, manufactured by Sony Corporation, is attached to or near the IGU, e.g., in a mullion or on a wall or ceiling nearby, in order to project onto an IGU to display information to the user and provide an on-glass control function.

In one embodiment, the window assembly includes a motion sensor, a camera, a transparent capacitive touchscreen, and/or a microphone for voice activation. When a user interacts with the window, the projector (or transparent display) activates to show a control GUI for controlling the window, other windows in the building, and/or other building systems. The user interaction may be, e.g., movement detected near the window, video or image identification of the user, an appropriate touch command, and/or an appropriate voice command. The user can then carry out desired work, programming, data retrieval and the like. After a period, or by the appropriate command input provided by the user, the control GUI on the glass (projected or transparent display) disappears or ceases, leaving the (entire) unobstructed view of the window.

Figure 7A:
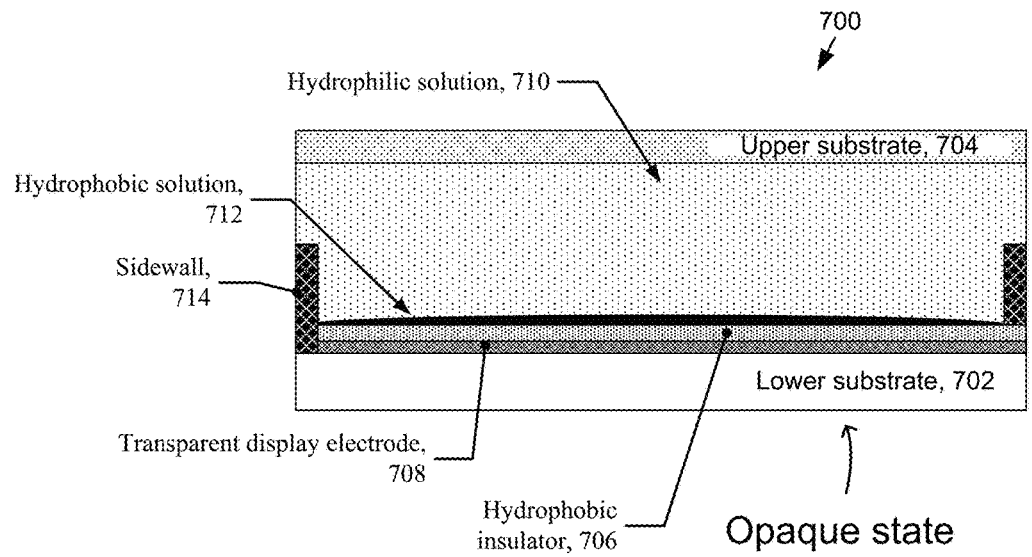
FIGS. 7a and 7b depict a cell of an electrowetting display.
Figure 7B:
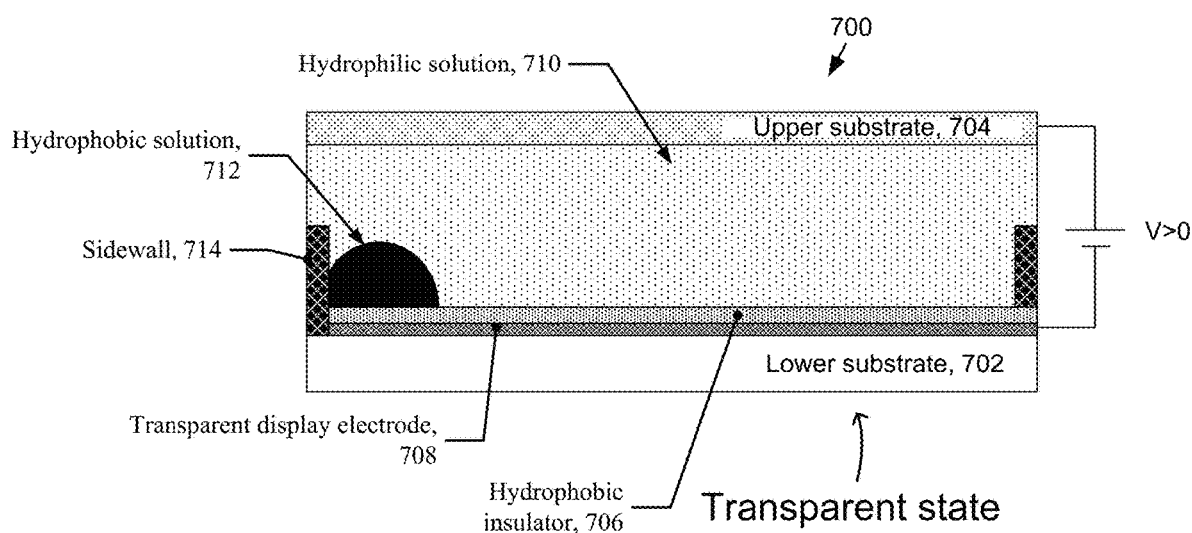

In certain embodiments, a window may use an electrowetting display technology. FIG. 7a depicts a cell 700 of an electrowetting display in an opaque state, and FIG. 7b depicts the cell in a transparent or substantially transparent state. Such displays may have many thousands or more of such cells, individually addressable, and thus can be high-resolution transparent displays.

Electrowetting displays make use of the surface tension in liquids and the electrostatic forces. Electrowetting displays are made of one or more pixels wherein each pixel represents an area of the display that can be controlled to move between two or more substantially uniform optical states. A cell, as depicted in FIGS. 7a and 7b, is bound by an upper substrate 704 (e.g., a glass surface) and a hydrophobic insulating layer 706 having hydrophobic properties. The hydrophobic layer 706 separates the cell interior from a transparent display electrode 708 and creates an electrowetting surface area. Within the cell, there is a hydrophobic solution 712 and a hydrophilic solution 710. The hydrophobic solution 712, sometimes referred to as the electrowetting oil, is electrically non-conductive and may be, e.g., hexadecane, hexane, cyclohexane, benzene, xylene, or (silicone) oil. The hydrophobic solution 712 has a particular color or optical property that is different from that of the hydrophilic solution 710. In some cases, suspended in the hydrophobic solution is a plurality of particles having one or more pigments; in some cases, the particles may be white in color. The particles for coloring may include particles such as titanium dioxide ($TiO2$), zinc oxide, or calcium carbonate. The hydrophilic solution 710 is a transparent or substantially transparent solution that includes an electrolyte. The hydrophilic solution 710 is electrically conductive and often polar It may be, e.g., a water or salt solution such as a solution of potassium chloride in a mixture of water and ethyl alcohol. The hydrophobic character of the electrowetting oil causes it adhere preferentially to the hydrophobic insulator 706 (it "wets" the insulator) when no voltage is applied to the cell resulting in an opaque state as shown in FIG. 7a. When an electric field is applied to the cell via the transparent display electrode 708, the interface tension of the hydrophilic liquid is changed to move the hydrophobic liquid 712, thereby making the cell transparent or substantially transparent as shown in FIG. 7b. In some embodiments, the transparent display electrodes of adjacent cells may be electrically connected so that multiple cells are controlled in unison. In some embodiments, the display electrodes of adjacent cells are electrically isolated from other so cells can be controlled individually. Sidewalls 714 may be used to isolate the hydrophobic and/or the hydrophilic solution within a cell.

An electrowetting display is formed by a grid of adjacent electrowetting cells that may be individually controlled. The cells of an electrowetting display may be very small; for example, in some embodiments, electrowetting cells may be less than about 1 mm×about 1 mm, and in some cases, cells may be about 100 μm×about 100 μm. While smaller cells may be preferable in situations where image resolution is a concern, in some embodiments cells may be much larger, e.g., greater than about 1 cm×about 1 cm or great than about 10 cm×about 10 cm. While cells are generally square-like in shape, this need not be the case. In some embodiments, cells may have a circular shape or a polygonal shape. In some embodiments a cell may be much longer in one dimension than in another dimension; for example, a cell might be 100 or 1000 times longer in a first dimension in comparison to a second dimension. In some embodiments, an electrowetting display may span the dimensions of an IGU lite, and in some embodiments, an electrowetting display may only fill a portion of lite. When an electrowetting display spans the dimensions of an IGU, the display may be used to provide shading or privacy. For example, if privacy is wanted in a conference room, electrowetting displays on one or more windows may be immediately switched from a transparent state to an opaque state—blocking or substantially blocking visibility into and out of the conference room. In some embodiments, cells may be modulated between transparent and opaque states at a frequency of at least about 30 Hz. In some embodiments, cells may be modulated between transparent and opaque states at a frequency of at least about 60 Hz. As discussed herein, an electrowetting display may be associated with an IGU having an electrochromic device. For example, an electrowetting display may be located on the interior lite of an IGU. In some cases, a transparent electrowetting display is located on a separate lite placed in front of an electrochromic lite and held in place by the IGU framing structure.

In some embodiments, an electrowetting display may be configured to turn a transparent window into a partially or substantially reflective screen on which images can be projected. For example, cells may be white and reflective in their opaque state. In embodiments where the pixels of an electrowetting display are configured to transition between optical states simultaneously (e.g., to provide a projection screen or a privacy screen) a monolithic electrode may span the dimensions of an IGU and a voltage may be applied to the electrode so that the cells transition optical states at the same time. In some cases, a projector located within a mullion or somewhere else within the room can be used to project an image onto the display. In some embodiments, an electrowetting display may be configured to display black pixels. In some embodiments, images can be seen on an IGU by contrasting black or colored pixels with the lighter backdrop of an exterior environment to create a viewing experience similar to that of a heads-up display. This may be useful if a user does not want to obscure a view provided by an IGU. In some cases, the tint of an electrochromic window may be manually or automatically adjusted (e.g., to account for glare) to create a high contrast image that is also comfortable to look at. In some embodiments, an electrowetting display may be configured to display color images on an IGU by using multiple electrowetting cells for each pixel as shown in FIG. 8.

Figure 8:
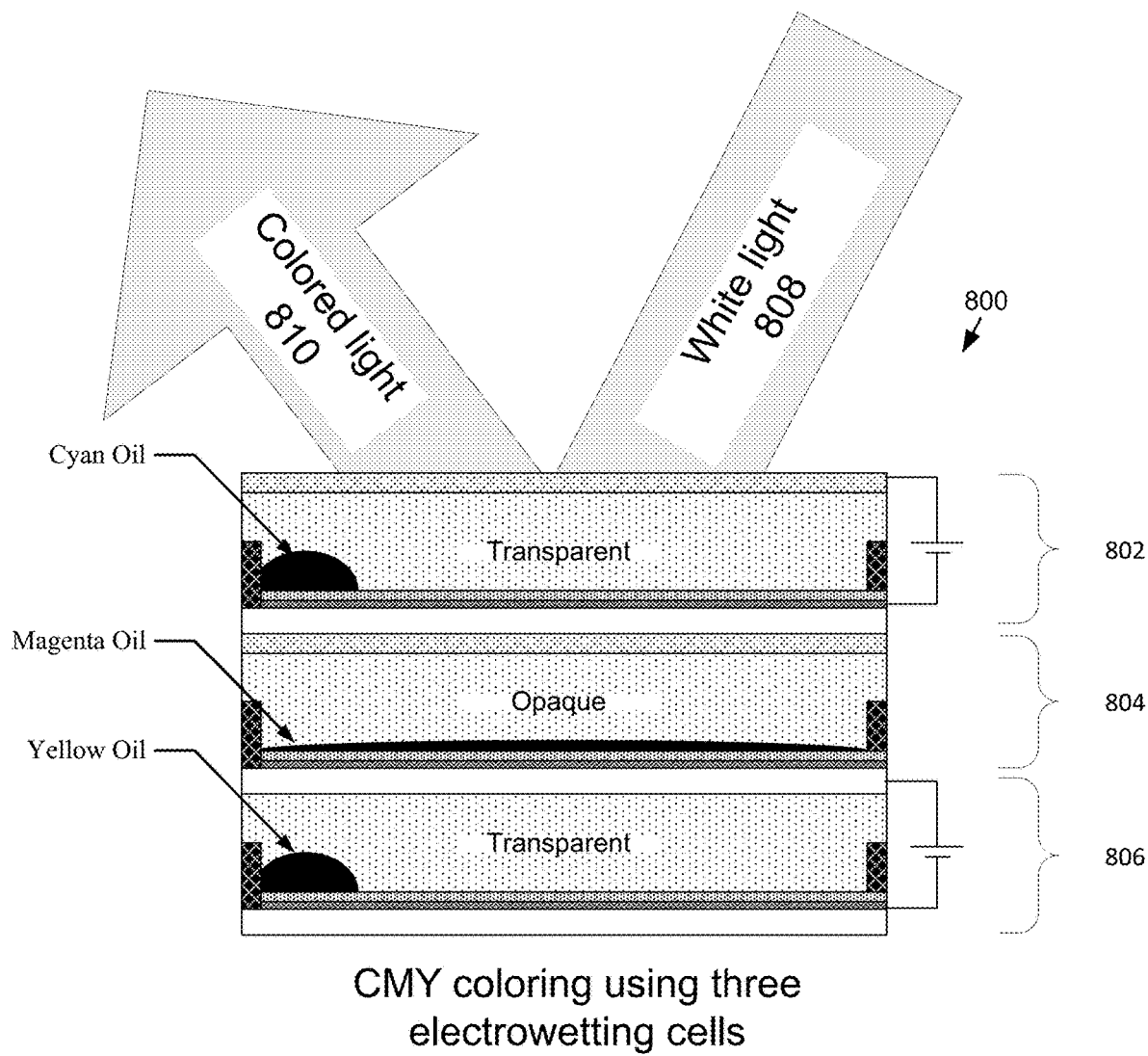
FIG. 8 depicts a multi-cell pixel of an electrowetting display.

FIG. 8 depicts multi-cell pixel of an electrowetting display uses particles of various pigments. The pixel is created by three cells (802, 804, and 806) that reflect cyan, magenta, and yellow light in their opaque states. As depicted, the magenta cell 804 is in an opaque state while the cyan cell 802 and yellow cell 806 are in transparent states. As a result, incident light 808 is reflected having a magenta colored wavelength 810. By oscillating the states of a multi-cell pixel very quickly at prescribed ratios, the colors may be combined to generate wide gamut of perceptible colors. While a 3-cell pixel is depicted, an electrowetting display includes pixels having any number of cells. In some cases, cells may have oils that reflect light having a different color than cyan, magenta, or yellow. In some cases, a pixel may include a cell that absorbs visible light in its opaque state to produce a black color. In some cases, a pixel may include a cell that reflects white light in its opaque state. Using multi-cell pixels, various subtractive color techniques that are understood well in the art (e.g., in the printing industry) may be used to a variety of colors.

Electrochromic Window Assemblies

Certain embodiments relate to a system for mounting a transparent display with an electrochromic window. Such systems can be thought of as a docking station or framing system to couple the display and the electrochromic window. Such systems typically, but not necessarily, are configured to route power and communications between the display and the electrochromic window components. This routing function, and apparatus, may include a combined display and electrochromic window controller.

The display may be permanently or reversibly attached to the electrochromic window. The electrochromic window may include an electrochromic lite, an electrochromic IGU, and/or a laminate including an electrochromic lite, for instance. In some cases, it may be advantageous to include a reversible and/or accessible connection between the display and the window such that the display can be upgraded or replaced, as needed. For example, a typical electrochromic window may have a useful lifespan of several decades, while a display may have a much shorter lifespan of a handful of years. In such cases, it is beneficial for the display to be reversibly and/or accessibly mounted for easy replacement. Similarly, such reversible and/or accessible connections can be beneficial as display technology advances and improves, allowing for the display to be upgraded as desired. As used herein, a display that is "reversibly" mounted can be removed and replaced without damaging the electrochromic window. Further, a display that is "accessibly" mounted can be removed and replaced without damaging the electrochromic window and without removing the electrochromic window from its installed location.

Many of the figures herein show the display lite either inboard or outboard of the electrochromic window. It is noted that any of the embodiments herein can be modified to switch the relative positions of the display lite and the electrochromic window (e.g., EC lite, EC IGU, laminate EC lite, etc.). Similarly, any of the embodiments herein can be modified to provide an electrochromic device on any lite of the window. Therefore, while a particular figure might show the EC IGU outboard of a display lite, where the EC lite of the EC IGU is outboard of the second lite of the EC IGU, it is understood that a similar embodiment may have the EC IGU inboard of a display lite, and/or may have the EC lite of the EC IGU inboard of the second lite of the EC IGU. Moreover, while certain figures show an electrochromic window that includes a particular number of lites, any of these embodiments can be modified such that the electrochromic window includes any number of lites (e.g., an EC IGU may be replaced with an EC lite or EC laminate, and vice versa).

Figure 9:
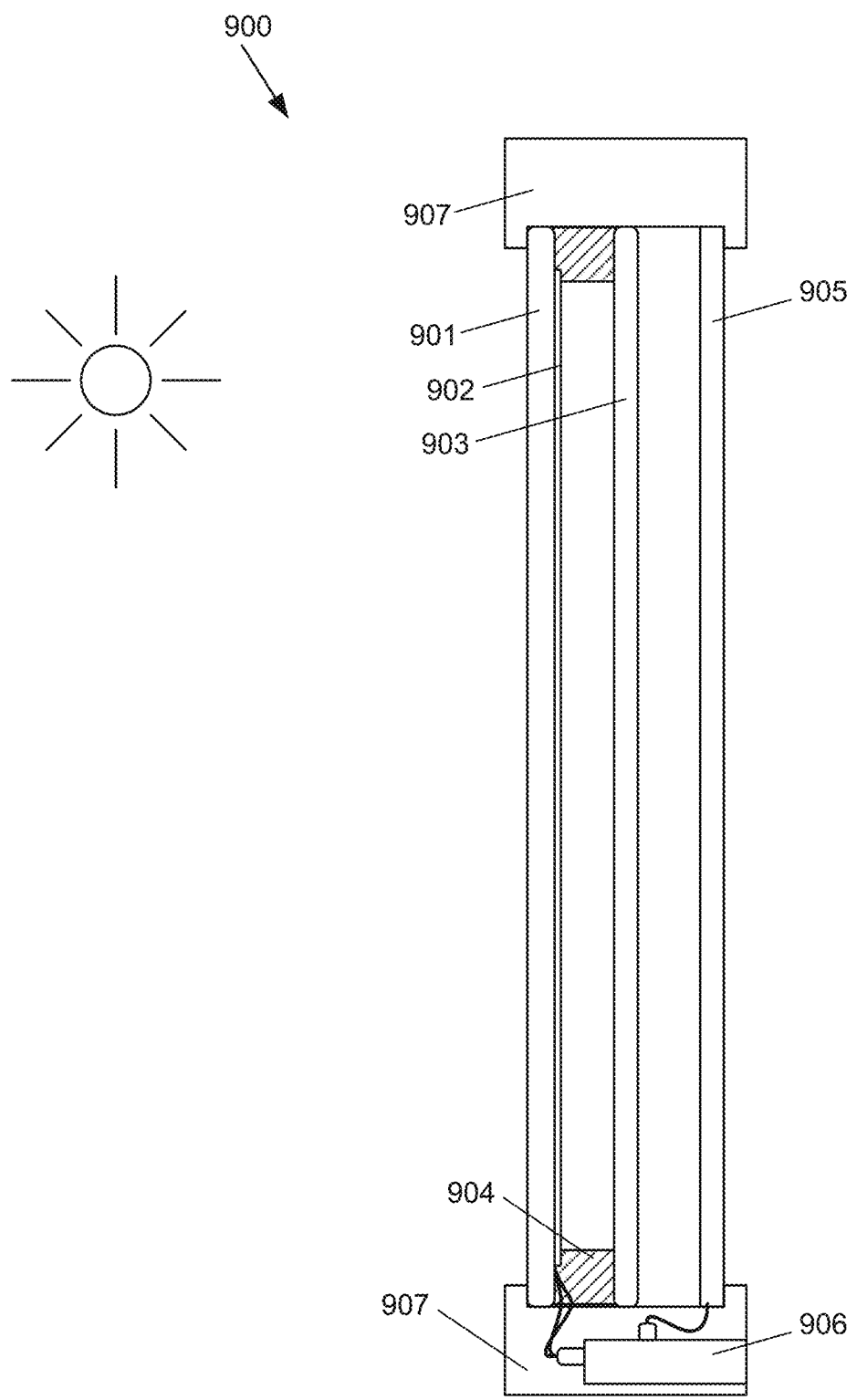
FIG. 9 shows an example of an electrochromic window that includes an electrochromic lite and a display lite.

FIG. 9 shows an example of an electrochromic window 900 that includes an electrochromic IGU (including electrochromic lite 901 with electrochromic device 902 thereon, second lite 903, and an IGU spacer 904 separating the electrochromic lite 901 from the second lite 903), and a display lite 905. A controller 906 is housed in the framing 907 that surrounds and/or supports the electrochromic window 900. Controller 906 includes electrochromic window control functions as well as display control functions. These functions may be independent or coordinated, depending on the need. For example, activating the display may override a tint setting of the electrochromic window if a higher contrast is desired for the displayed information, a privacy mode is desired for the displayed information, the displayed information is desired to be seen by persons outside the building, etc.

In certain embodiments, the transparent display, alone or in conjunction with the electrochromic device, can be used for privacy applications. For example, an electrochromic device can be adjusted to a dark tint state to reduce light transmission, and a transparent display (e.g., an electrowetting display) can be turned to an opaque tint state so that outsiders cannot see into the building or room and observe the occupant's activities. In some cases, a transparent display that emits light, such as an OLED display, can be used to distract an outsider or otherwise make it more difficult for an outsider to see into a building or room. In some cases, transparent displays (for privacy, signage, and other applications) can be located on a separate film or a separate lite spaced apart from the defining interior and exterior lites of an IGU. In some cases, an IGU framing structure may be configured to accept a transparent display that can be installed as an optional feature at a later point in time. For example, an IGU framing structure may be configured to accept an externally facing transparent display to user for signage applications if, e.g., a building owner wishes to receive additional advertising income without obstructing an occupant's view. Such displays could then, if only needed temporarily, be moved to a different location or building.

In this example, the display lite 905 is reversibly mounted to the electrochromic IGU through the framing 907. If and when the display lite 905 is to be removed and replaced, the framing 907 can be uninstalled, allowing the display lite 905 and the electrochromic IGU to be separated from one another and from the framing 907. This may involve unplugging a connection between the display lite 905 and the controller 906 (or in other cases, between the display lite 905 and another portion of the window such as the EC lite 901 or EC device 902). A new display lite can then be provided along with the electrochromic IGU within the framing 907, and the unit can be re-installed in the building. In some cases, a second spacer (sometimes referred to as a display spacer, not shown) may be provided between the second lite 903 and the display lite 905. The second spacer may be used to ensure a uniform distance between the second lite 903 and the display lite 905, and, in some embodiments, create a hermetically-sealed volume between the display lite 905 second lite 903 of the electrochromic IGU, e.g., as an IGU would have. In other embodiments, the framing 907 supports and provides the appropriate spacing between the EC window and the display. There may be sealing elements (not shown) in framing 907 to prevent dust from entering the volume between display 905 and the EC IGU.

FIGS. 10a-10c show close-up views of one side of an EC window similar to that shown in FIG. 9, but including a connection between the display lite 1005 and the electrochromic IGU that is both reversible and accessible. In this example, the framing 1007 includes one or more movable components 1008 that allow for insertion and removal of the display lite 1005 without removal of the framing 1007. In other words, this embodiment shows a display lite 1005 that is removable and accessibly mounted to an electrochromic IGU. If and when the display lite 1005 is to be removed, the movable component 1008 may rotate, slide, retract, snap, or otherwise move from a first position to a second position. In the first position, shown in FIG. 10a, the movable component secures the display lite 1005 in the framing 1007. In the second position, shown in FIG. 10b, the movable component is out of the way such that display lite 1005 is no longer secured in the framing 1007. The moveable component 1008 may, e.g., rotate away from the display lite so that it can be removed. In FIG. 10c the movable component 1008 retracts into the main portion of the framing 1007. As noted above, the display lite 1005 may be disconnected from an electrical connection to, e.g., the window controller, EC lite 1001, or EC device 1002, when the display lite 1005 is removed. Movable component 1008 may itself be a frame that attaches within the inner perimeter of framing 1007 to secure the display.

Figure 11A:
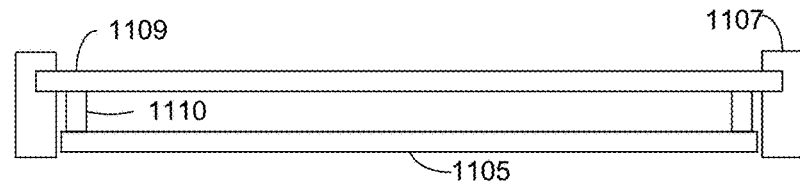
FIGS. 11a-11c depict embodiments for attaching a display lite to a window assembly.

FIG. 11a shows another configuration for attaching a display lite 1105 to an electrochromic window 1109. The electrochromic window 1109 may include an electrochromic lite, an electrochromic IGU, and/or a laminate structure including an electrochromic lite. In this example, framing 1107 secures the electrochromic window 1109. A display spacer 1110 is positioned between the electrochromic window 1109 and the display lite 1105. The display spacer 1110 may be adhesively attached to both the electrochromic window 1109 and the display lite 1105. The display spacer 1110 may be peripherally oriented along two or more sides of the window, in many cases along all sides of the window. Additionally, in some cases, one or more support structures may be provided between the edge of the display lite 1105 and the framing 1107, along one or more edges of the display lite 1105. In a particular example, a support structure (e.g., a block) may be provided under the bottom edge of the display lite 1105 such that at least some of the weight of the display lite 1105 is supported on the support structure. Flashing (not shown) may be provided to obscure the edges of the display from view by the occupant of the room. These embodiments allow for a retrofit or "infill" type application of a display to an existing EC IGU such as are described in U.S. patent application Ser. No. 15/528,071, filed May 18, 2017, and titled "INFILL ELECTROCHROMIC WINDOWS, which is herein incorporated by reference in its entirety. This allows for flexibility, e.g., in that particular EC IGUs can be fitted with display technology after the EC IGUs are installed. The existing EC window controller may be swapped out for a controller that controls both the display and the EC window, or, e.g., EC window controllers may have display control functions that are used when displays are coupled with the EC windows.

Figure 11B:
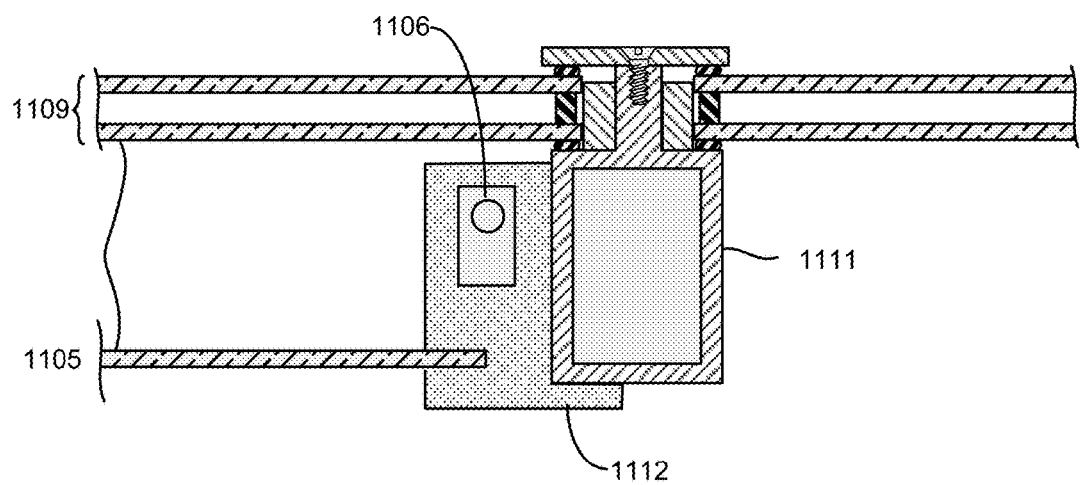

FIG. 11b shows another configuration for attaching a display lite 1105 to an electrochromic window 1109. In this example, a first framing system 1111 supports/secures the electrochromic window 1109, and a second framing system 1112 (sometimes referred to as a display frame) supports/secures the display lite 1105 proximate the electrochromic window 1109, within the first framing system 1111. In this particular example, the controller 1106 is positioned within the second framing system 1112, though it can be provided at any location onboard or offboard the window. Controller 1106 may be accessible to the occupant, e.g., having an exposed surface on the inboard surface of the second framing system 1112. In other embodiments, a GUI for the controller is displayed on the display panel 1105. The second framing system 1112 is configured to fit within the dimensions of the first framing system 1111. The second framing system 1112 may be held in place by friction and/or by screws, nails, brackets, clips, or any other securing hardware. The second framing system 1112 is removably and accessibly attached to the first framing system 1111 such that the second framing system 1112 can be removed without damage to or removal of the first framing system 1111 and electrochromic window 1109. There may be a seal (not shown) between the second framing system 1112 and the first framing system 1111.

Figure 11C:
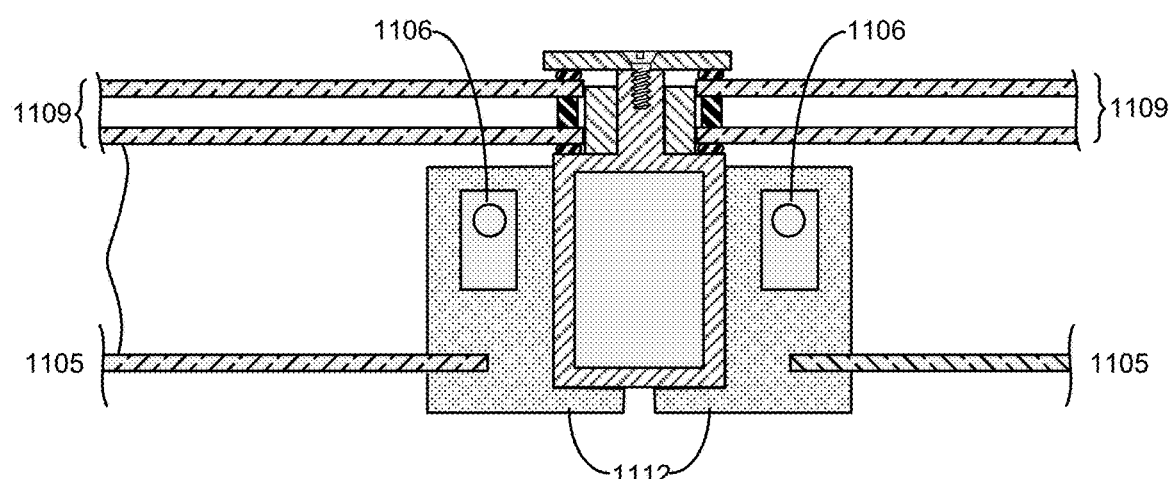

FIG. 11c shows an embodiment similar to that in FIG. 11b, but including two display lites 1105 installed side-by-side proximate two electrochromic windows 1109. The area of the display can be effectively increased by including additional displays, e.g. when a curtain wall or building façade is used to display information in large format, e.g. in advertising on the outside of the building or to augment interior information display format. Of course, multiple EC/display assemblies, such as depicted below, can be used e.g. to display different information on the same or separate displays, e.g. for slideshows, teleconferencing, asset tracking, EC window control, and the like, simultaneously or not. For example, for a particular curtain wall having electrochromic windows, any number of the windows may have display components, depending upon the needs of the occupants, the building owner, etc. The system described allows for flexibility in display/EC window configurations, any number of windows among a set of windows can be fitted with display functionality.

Figure 12:
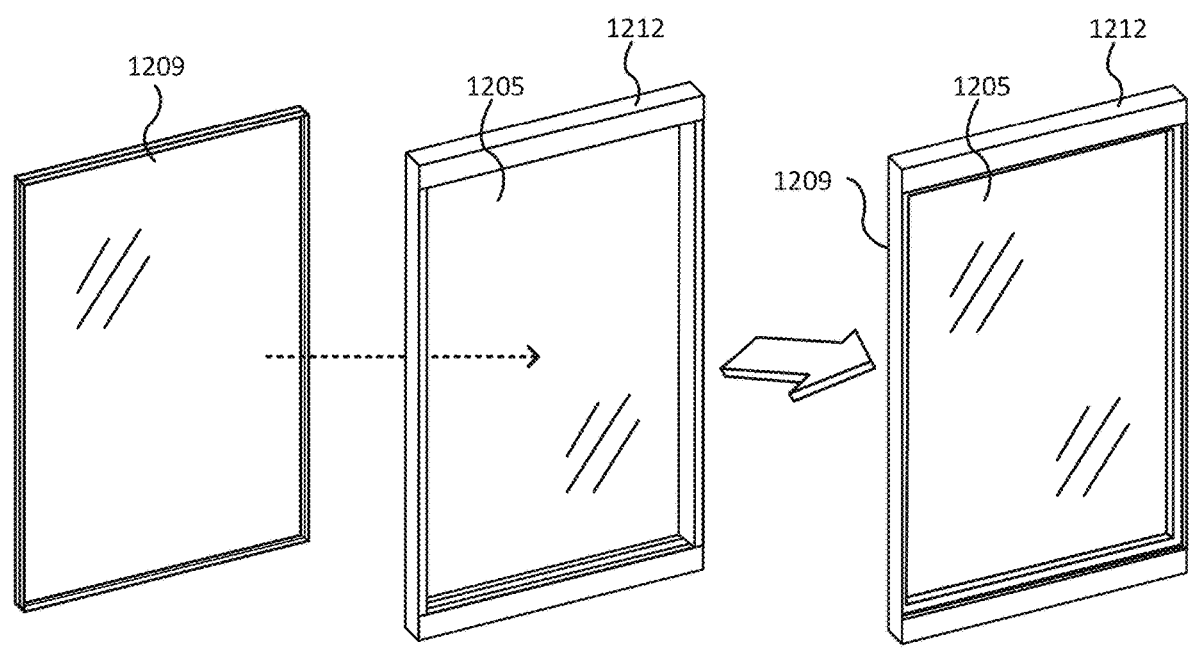
FIG. 12 depicts an electrochromic window and a display lite installed in a display frame.

FIG. 12 shows an electrochromic window 1209, a display lite 1205 surrounded by a display frame 1212, and a unit that includes both the electrochromic window 1209 and display lite 1205 installed in the display frame 1212. The display frame 1212 may reversibly and/or accessibly mount the electrochromic window 1209 therein/thereon. The display frame 1212 may extend along one side, two sides, three sides, four sides, and/or all sides of the display lite 1205. In some cases, a display spacer (not shown) may be provided between the electrochromic window 1209 and the display lite 1205, or between the electrochromic window 1209 and the display frame 1212. In some cases, the display frame 1212 may itself act as a display spacer to maintain a uniform distance between the electrochromic window 1209 and the display lite 1205. Display frame 1212 may be unitary or be an assembly of parts, e.g., four sides that attach to form the frame. Frame 1212 may be constructed from materials common to the window framing arts, e.g., aluminum, extruded vinyl, wood, vinyl-wood composites, fiberglass or other common window framing materials.

In another example, an electrochromic IGU includes two or more lites, where one or more of the lites has an electrochromic device thereon, and one or more of the lites is a display lite. In a particular example, an electrochromic IGU includes two lites, where one lite is electrochromic and the other is a display lite.

In certain embodiments, a lite and an electrochromic device thereon (e.g., electrochromic lite 901 and electrochromic device 902 shown in FIG. 9) may be made from materials that are partially or completely solid-state and inorganic. These materials are desirable because of their reliability and consistent characteristics in comparison to organic materials that may be susceptible to degradation when exposed to ultraviolet radiation and/or heat as a result of solar exposure. Solid-state and inorganic materials are resilient to prolonged sun exposure. Example solid-state electrochromic devices, methods, and apparatus for making them and methods of making electrochromic windows with such devices are described in U.S. patent application Ser. No. 12/645,111, entitled "Fabrication of Low Defectivity Electrochromic Devices," by Kozlowski et al., and U.S. patent application Ser. No. 12/645,159, entitled "Electrochromic Devices," by Wang et al., both of which are incorporated by reference herein in their entireties. In various embodiments, a solid-state electrochromic device is used in conjunction with a transparent display, which may be pixelated and which may include one or more organic or non-solid components. Examples of such displays include OLEDs, electrophoretic displays, LCDs, and electrowetting displays. As described, the display may be fully or partially coextensive with an electrochromic device on a lite. Further, the display may be provided in direct on contact with an electrochromic device, on the same lite as the electrochromic device but on a different surface, or on a different lite of an IGU.

In some embodiments, the electrochromic devices are entirely solid-state and made in apparatus that allow deposition of one or more layers of the stack in a controlled ambient environment. That is an apparatus where the layers are deposited without leaving the apparatus and without, for example, breaking vacuum between deposition steps, thereby reducing contaminants and ultimately improving device performance. In certain embodiments, all of the materials making up electrochromic stack are both inorganic and solid. In some cases, an electrochromic device made of all solid-state and inorganic materials may filter ultraviolet light and protect a building's interior from damaging solar rays. In some cases, an IGU having an electrochromic device made from materials that are all solid-state and inorganic may be placed between a display lite and an exterior environment. In this arrangement, the solid-state and inorganic electrochromic device may reduce or block high energy solar radiation from impacting and potentially damaging a display lite. For example, in some embodiments, an all solid-state and inorganic electrochromic device may block ultraviolet light and protect an OLED or an electrowetting display that is on the interior side of the EC device.

FIG. 13a shows different views of a retainer 1315 and fastener 1316 that may be used to secure a display lite 1305 to a framing 1307 that secures the electrochromic window 1309. The retainer 1315 includes an opening through which the fastener 1316 fits to secure the display lite 1305 to the framing 1307.

Figure 13B:
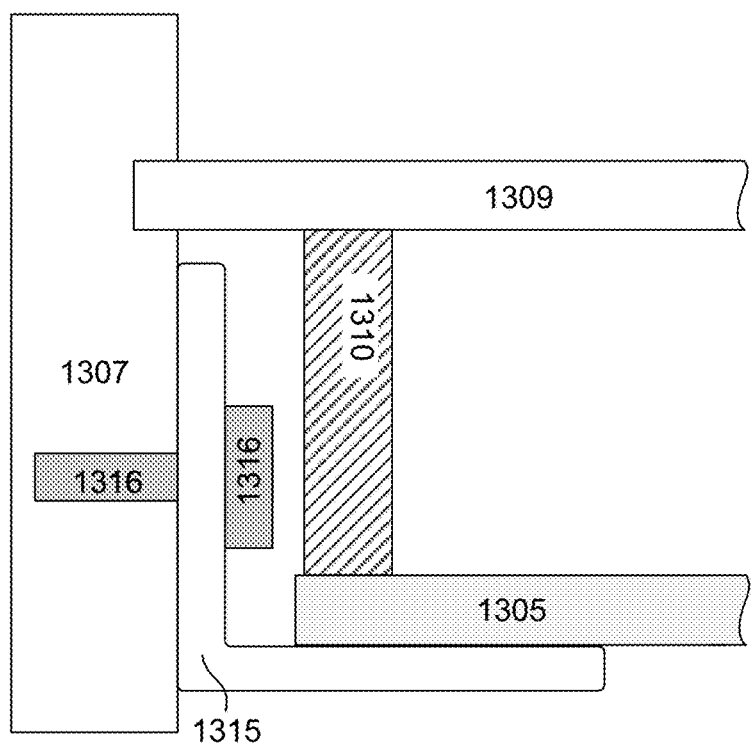

FIG. 13b shows the retainer 1315 and fastener 1316 shown above installed in framing 1307. The framing 1307 directly secures the electrochromic window 1309, and secures the display lite 1305 via the retainer 1315 and fastener 1316. The retainer 1315 can slide into place over the fastener 1316 when the display lite 1305 is installed, and can slide out of place when the display lite 1305 is to be replaced. This type of attachment system has the advantage of not exposing the fastener 1316 to the occupant's view and providing a flashing function to hide the edge of the display panel 1305.

Figure 14A:
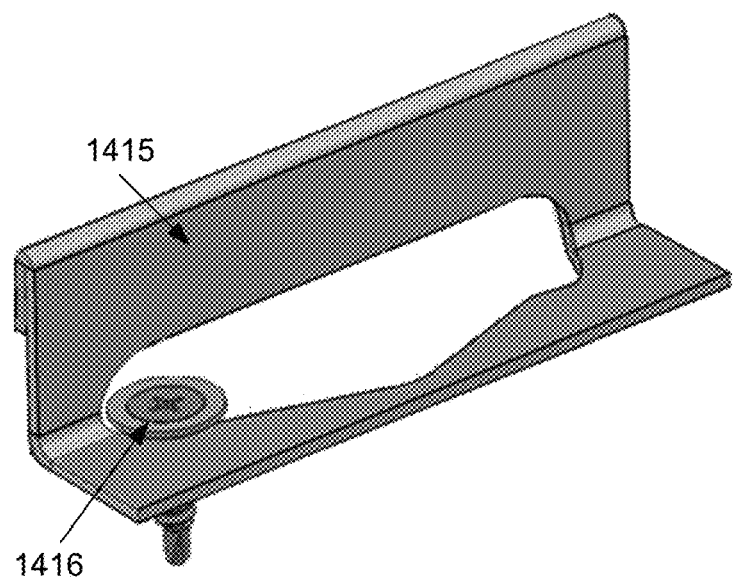
FIGS. 14a-14c depict retainers and fasteners used to secure a display lite.
Figure 14B:
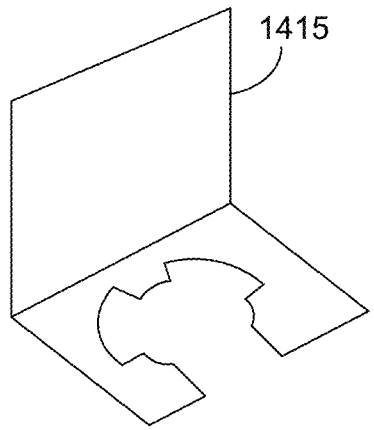
Figure 14C:
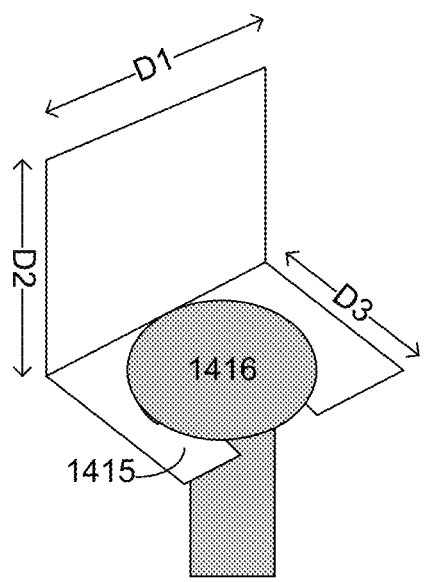

FIG. 14a-14c show other examples of a retainer 1415 and fastener 1416. In FIG. 14c the retainer has dimensions D1, D2, and D3, as shown. These dimensions should be sufficiently large to adequately secure the display lite 1415, and should be sufficiently small to block an acceptably small amount of viewable area.

In some embodiments, the display lite may reversibly and accessibly attach to a dock that secures the display lite. The dock may be configured to safely receive the display lite and support it at one or more edges. The dock may also include electrical connections for powering the display lite and/or for providing communication to the display lite. In some cases, the dock may include electrical connections for powering the EC device and/or for providing communication to the EC device. As noted above, communication may also be accomplished wirelessly. In a particular example, the dock includes one or more controllers that, singly or together, control the EC device and the display lite. Such controller or controllers may also be provided outside of a dock, in another type of framing, on a lite, in a secondary seal area, offboard the EC window, etc. The dock may be implemented as a framing for the display lite. Any of the framing examples shown herein may be modified to include such a dock. Additional examples of docks and other framing are described in U.S. patent application Ser. No. 14/951,410, titled "SELF-CONTAINED EC IGU" and filed on Nov. 24, 2015, which is herein incorporated in its entirety.

In various examples, a framing system that secures a display lite includes a structure for securing the display lite proximate an EC window, and wiring for providing power to the display lite. The framing system may further include wiring for providing communication to the display lite, wiring for providing power to an EC window and/or window controller, and wiring for providing communication to the EC window and/or window controller. In these or other embodiments, the framing system may include wireless transmitters and/or receivers for transmitting and/or receiving wireless control information that may be communicated to the display lite and/or the electrochromic window/window controller. The framing system may also include a number of other components useful for an electrochromic window such as various sensors, cameras, etc.

In some embodiments, a framing system supporting a display lite is configured to be installed proximate existing framing that already secures an electrochromic window. The electrochromic window is essentially being retrofitted to include the display lite in this example. In some such cases, the framing may include control hardware to interface with the existing EC window. Such control hardware may use wireless communication to control the EC window in some cases.

Generally speaking, the framing system/dock/similar hardware may be referred to as an apparatus for mounting an electronic device onto an optically switchable window. The electronic device is a display in many cases (e.g., a display lite or other display), and may or may not be transparent. The electronic device may also be any number of other devices, including but not limited to a window controller, user input device, etc. In some cases, the apparatus may mount more than one electronic device onto the optically switchable window.

In some cases, the display and the EC window may be controlled in tandem to enhance user experience. For instance, the display may be controlled in a way that takes into account the optical state of the EC window. Similarly, the optical state of the EC window may be controlled in a way that takes into account the state of the display. In one example, the EC window and display may be controlled together in order to optimize the appearance of the display (e.g., such that the display is easy to see, bright, readable, etc.). In some cases, the display is easiest to see when the EC window is in a darkened tint state. As such, in some cases, the EC window and display may be controlled together such that the EC window goes to a relatively dark tint state when the display is used, or when the display is used and certain conditions are met (e.g., with respect to timing, weather, light conditions, etc.).

In some embodiments, a first controller may be used to control the optical state of the EC window, and a second controller may be used to control the display. In another embodiment, a single controller may be used to control both the optical state of the EC window and the display. The logic/hardware for such control may be provided in a single controller or multiple controllers, as desired for a particular application.

Figure 15:
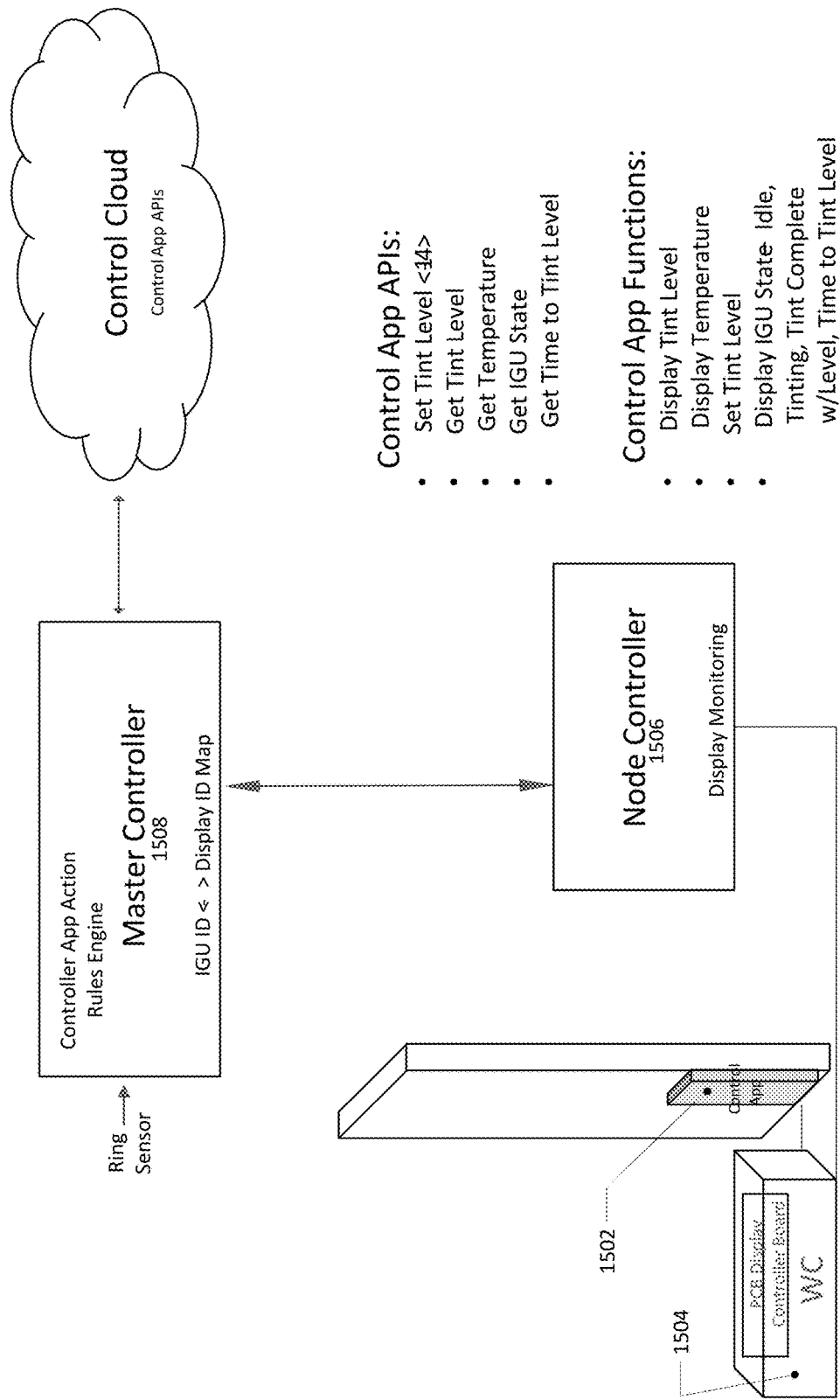
FIG. 15 illustrates one configuration of how the architecture of how an on-glass transparent controller can be implemented.

FIG. 15 illustrates one configuration of how the architecture of how an on-glass transparent controller can be implemented. The on-glass controller transparent display 1502 is used to display control applications in a graphical user interface (GUI) format. The transparent display is in communication with the window controller 1504, either onboard or offboard as depicted below. A node controller 1506 is used for display monitoring and function. The node controller communicates with a master controller 1508 for controlling the EC functions, etc., which in turn communicates via the cloud with APIs. The window controller may include RF radio, temperature sensors and control and Bluetooth capability. Transparent on-glass controller displays can be, e.g., as commercially available Lumineq® transparent displays from Beneq Oy, of Finland, as described on their commercial website (http://beneq.com/en/displays/products/cus-tom). When a window controller is connected to a local area network (e.g., a local network provided via windows) or connected to the internet, the transparent display and other glass functions can be controlled in some cases, through a web-based application or another application configured to communicate with the window control network. Such applications can be run on, e.g., phones, tablets, or desktop computers.

Applicant's previously described window control technology architecture can, in some cases, include a daughter card containing I/O for driving a transparent display (whether on-glass controller and/or if a full window size display/controller). Embodiments may also include an onboard antenna. The antenna may be an on-glass antenna, e.g., fractal and/or antenna suites scribed into a transparent conductive oxide layer on a lite of an IGU. Antennas are used for various functions, including RF transmission/reception. Various EMI blocking coatings may also be included in embodiments.

Figure 16A:
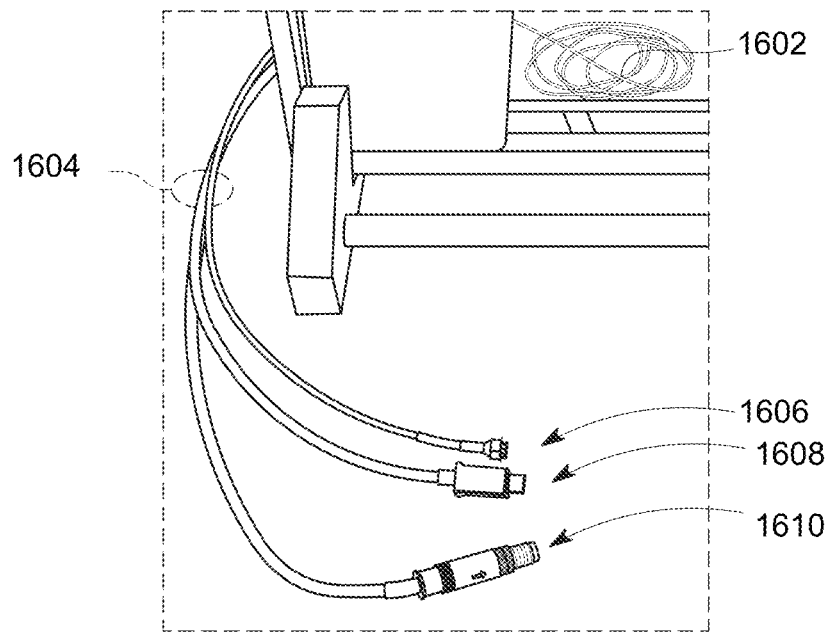
FIGS. 16a and 16b depict an EC IGU with an IGU connector for EC, antenna, and video applications.
Figure 16B:
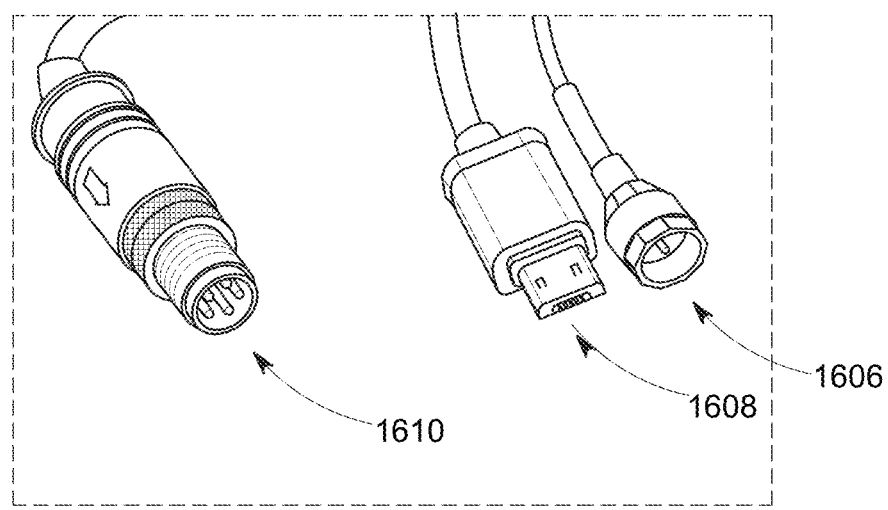

FIGS. 16a and 16b depict an EC IGU 1602 with an IGU connector 1604 for EC, antenna, and video applications. An IGU connector may include a single cable that supports each of these applications, or in some cases (such as depicted in FIGS. 16a and 16b) an IGU connector may include more than one connector, each connector being used to support a different application of the EC IGU. For example, a 5-pin connector 1610 may be used to support EC functionality while a coax cable 1608 may support wireless communications (e.g., via window antennas) and an MHL connector 1608 (or I2C) may provide a video signal for the transparent display. Some embodiments include wireless power and control, which may, in some cases, obviate the need for one or more wired connectors.

Certain embodiments described herein combine the strength of an existing building operating system (BOS) infrastructure with antennas and display technology for additional functionality. One example of such functionality is providing power for window system components such as window controllers, radio, and display drivers. In some cases available power is provided at about 2-3 W per IGU. In some implementations, EC control communication can be delivered over, e.g., standard 5 wire cable with CANbus and power. For example, a CANBus may be operated at 100 kbps or higher, e.g., up to about 1 Mbps if needed. In some embodiments, an ARCnet network is employed, operating at up to about, e.g., 2.5 Mbps. It may do this in various network topologies including a linear control network. Delivering content for wireless and video requires relatively high bandwidth communication interfaces, which can be made available with window systems that employ wireless transmission, UWB, or the like, each of which can be provide 500 Mbps or higher data rates. Often window system installations have many windows, thereby allowing high data rates, particularly compared to sparse systems with an occasional transceiver as with current Wi-Fi technology.

The aspect of adding a display device to an EC window drives a need for greater communication bandwidth, at least if the display content changes frequently. Bandwidth requirements may be branched into two different products, one for real-time display (e.g., a projector screen replacement) with higher bandwidth, and one for lower bandwidth applications (e.g., signage applications).

Frequently changing content like h.264 video conferencing requires 10 Mbps (Ethernet) data rates for HD quality at 30 frames a second. More static data, like a static advertisement can use the existing data path (CANbus) and available bandwidth (around what's required for glass control) to load the content. The content can be cached, so data could trickle in over an hour, and then the display updates when the frame is complete. Other more slowly changing data like weather feeds, or sales metrics also don't require high-speed data. Table 1 illustrates data communication bandwidths and associated applications.

TABLE 1

Data communication Bandwidths.

| Quality | Resolution | Video Bitrate | Audio Bitrate | Frames Per second | Video codec | h.263 Profile |
|---|---|---|---|---|---|---|
| Low | 480 × 270 | 400 kbps | 64 kbps | 15/30 | h.264 | Baseline |
| Med | 640 × 360 | 800-1200 kbps | 96 kbps | 30 | h.264 | Main |
| High | 960 × 540 | 800-1500 kbps | 96 kbps | 30 | h.264 | Main |
| HD 720 | 1280 × 720 | 1,200-4,000 kbps | 128 kbps | 30 | h.264 | Main |
| HD 1080 | 1920 × 1080 | 4,000-8,000 kbps | 192 kbps | 30* | h.264 | Main or High |

For signage applications, a transparent display integrated with an EC IGU offers a number of benefits. In some cases, windows may display a "follow me" guidance system to get you to your connecting flight in the most efficient way. This guidance system may be combined with a high accuracy location awareness system that provides personalized services on a display based on the location of a traveler's mobile phone and the traveler's boarding pass for the next flight. For example, the transparent display may indicate: "this way to your next flight, Chuck" on panes of glass as you move along the corridor in the terminal. In another example, personalized displays on glass doors in a grocery store may display what is on special within a buyers preference category. In an emergency, the display windows may indicate safe exit routes, where fire extinguishing equipment resides, provide emergency lighting, and the like.

For real-time displays utilizing higher bandwidth data communication, the following examples are provided. In some cases, a video projector can be replaced with an OLED display and an EC IGU. The EC IGU can then darken the room and/or provide the dark background necessary for good contrast on the display. In another example, windows with transparent displays can replace TVs in commercial and residential applications. In another example, a window having a real-time display can provide real-time health statistics for a patient as one looks through the outside window. In this example, the patient retains the health benefits of natural lighting while a doctor reviews patient's chart. In yet another example, a real-time display can be used outside of a conference room wall to, e.g., display scenery to people passing by as a privacy enhancement mechanism. Privacy provided by the display can augment the privacy provided EC glass may darken over a period. In yet another example, transparent displays can provide augmented heads-up displays in cars or other forms of transportation.

OLED displays or similar (TFT, etc.) components of the EC IGU may have other applications besides providing dynamic graphical content. For example, OLED displays can provide general illumination. A dark window on a winter night simply looks black or reflects the interior light, but by using an OLED display, the surface can match the color of your wall. In some cases, the transparent display can display a scene that is pleasant to a building occupant and provides privacy. For example, a window can display a screenshot of a sunny day from that exact window from a camera integrated into the on glass or onboard window controller. In another scenario, a transparent display can be used to modify the perceived color of light transmitted through the EC lite portion of the IGU. For example, a transparent display may add a tinge of blue to a clear EC IGU, or a little color to a tinted IGU to make it more gray or neutral in tint. Light provided by the display can alter the color and spectrum of the incoming daylight into the room and consequentially the comfort, visual perception, mood, and well-being of the occupant. In some cases, the window control system and be configured to illuminate the room and/or control other light sources (e.g., LED lighting) in a room to alter the color or spectrum of light observed by an occupant. For example, a tintable window may, in some configurations, impart an unwanted blue hue to the occupant's space. In such cases, light emitted from a transparent display and/or another light source can be used to emit specific wavelengths of light to offset the blueness or another unwanted hue in the occupant's space due to the transmitted light from tintable windows. In certain embodiments, control of tintable windows includes control over LED lighting and/or lighting provided by a transparent display to correct this perceived and rendered color to produce an ambient lighting condition that the occupant would prefer. Some techniques using lighting provided by a transparent display and/or other light sources can change the CCT (correlated color temperature) and CRI (color rendering index) of the light in a room to have incoming light-color closer to natural light. Further methods of using interior lighting to improve the perceived color and spectrum light within a building are described in U.S. patent application Ser. No. 15/762,077, filed Mar. 21, 2018, and titled "METHODS OF CONTROLLING MULTI-ZONE TINTABLE WINDOWS," which is herein incorporated by reference in its entirety.

In another scenario, a transparent display can also be used to change the reflected color of light on the walls of the occupant's interior space. For example, instead of looking at various hues of blue on a white wall, the display can be tuned to make that color more uniform using feedback from an inward facing camera of an onboard window controller.

In certain embodiments, the transparent display component of the IGU is used to augment or replace conventional lighting in interior spaces (or exterior spaces if the display is bi-directional). For example, OLED displays can be quite bright, and therefore can be used to light up a room (at least to some degree) as an occupant walks into the space at night (with occupancy sensing). In another embodiment, the transparent display component is used to provide a color controlled light for an art gallery at a museum, e.g., a length of EC glass on one side of a wall used to illuminate artwork on the opposite wall.

Figure 17:
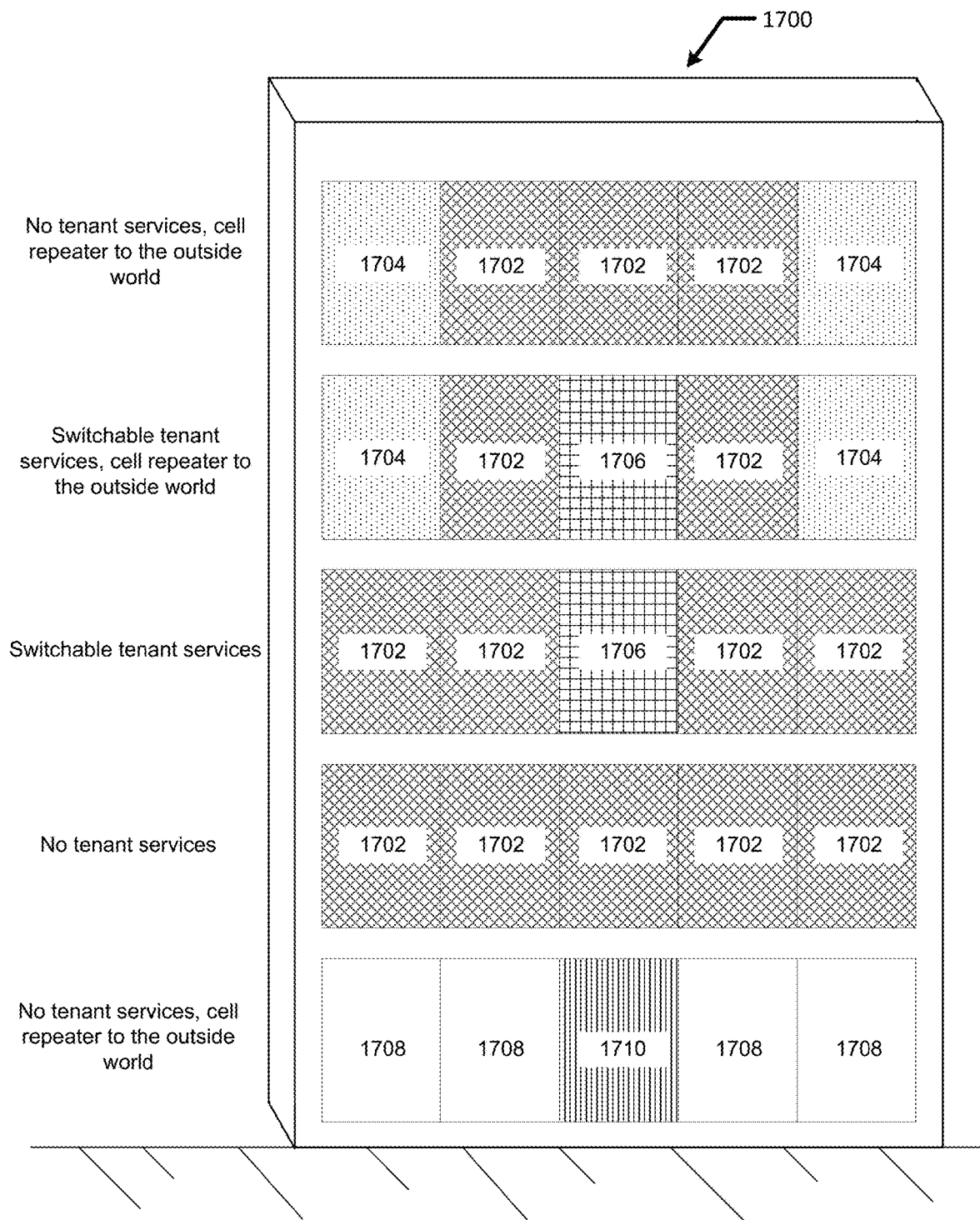
FIG. 17 depicts a façade of a building having IGUs with various capabilities

A curtain wall of IGUs may all have transparent display technology or may be a mixture of IGUs, some with and some without transparent display technology. FIG. 17 depicts a façade of a building 1700 having IGUs with various capabilities. IGUs labeled 1702, 1704 and 1706 are for EMI blocking. IGUs labeled 1704 and 1710 are configured to provide cellular communications to the outside world, and IGUs labeled 1706 and 1710 are configured to offer WiFi and/or cellular services to occupants within the building. IGUs labeled 1708 only are configured for EC tinting and do not block wireless communications.

In the example depicted in FIG. 17, the top floor tenant either wants to be isolated from the outside world or will provide their own communications (a cable modem for example). The building owner may, e.g., lease the outward facing antennas (1704) to the local cellular company as repeater towers. The fourth-floor tenant may want cellular services in the building and control when they are available. The inward facing antenna (1706) emanate signals into the building on demand, but blocks exterior signals. The source of the signals may be the two outward facing cellular antennas (1704). The third-floor tenant wants to block all outside signals, but offer WiFi and cellular services to occupants (1706). The second-floor tenant wants complete isolation, they may have their own hardline (e.g., cable modem) connections, but otherwise are isolated. The ground floor is a lobby, EC glass (1708) allows exterior signals to pass through the glass, as well as offering a cellular repeater (1710) to boost the available signals in the common area of the building.

Environmental Sensors

In some embodiments, an IGU may be equipped with environmental sensors for air quality monitoring. For example, an IGU may have one or more electrochemical gas sensors that transduce a gas concentration into a current flow through oxidation and reduction reactions between the sensor and the sensed gas. In some embodiments, metal oxide gas sensors may be used. Metal oxide sensors monitor a sensed gas concentration as function of electronic conductivity at the sensor. In some cases, an IGU may be able to sense one or more of the six criteria pollutants (carbon monoxide, lead, ground-level ozone, particulate matter, nitrogen dioxide, and sulfur dioxide) that are monitored by the US national ambient air quality standards (NAAQS). In some cases, IGUs may be equipped with sensors for detecting less common pollutants if there is a specific safety concern at an installation site. For example, in a facility for semiconductor processing, sensors may be used to monitor for fluorocarbons or to detect chlorine gas. In some cases, a sensor may detect carbon dioxide levels as a form of occupancy sensor, e.g., to aid window control logic to determine heating and cooling needs of the interior environment.

Figure 18:
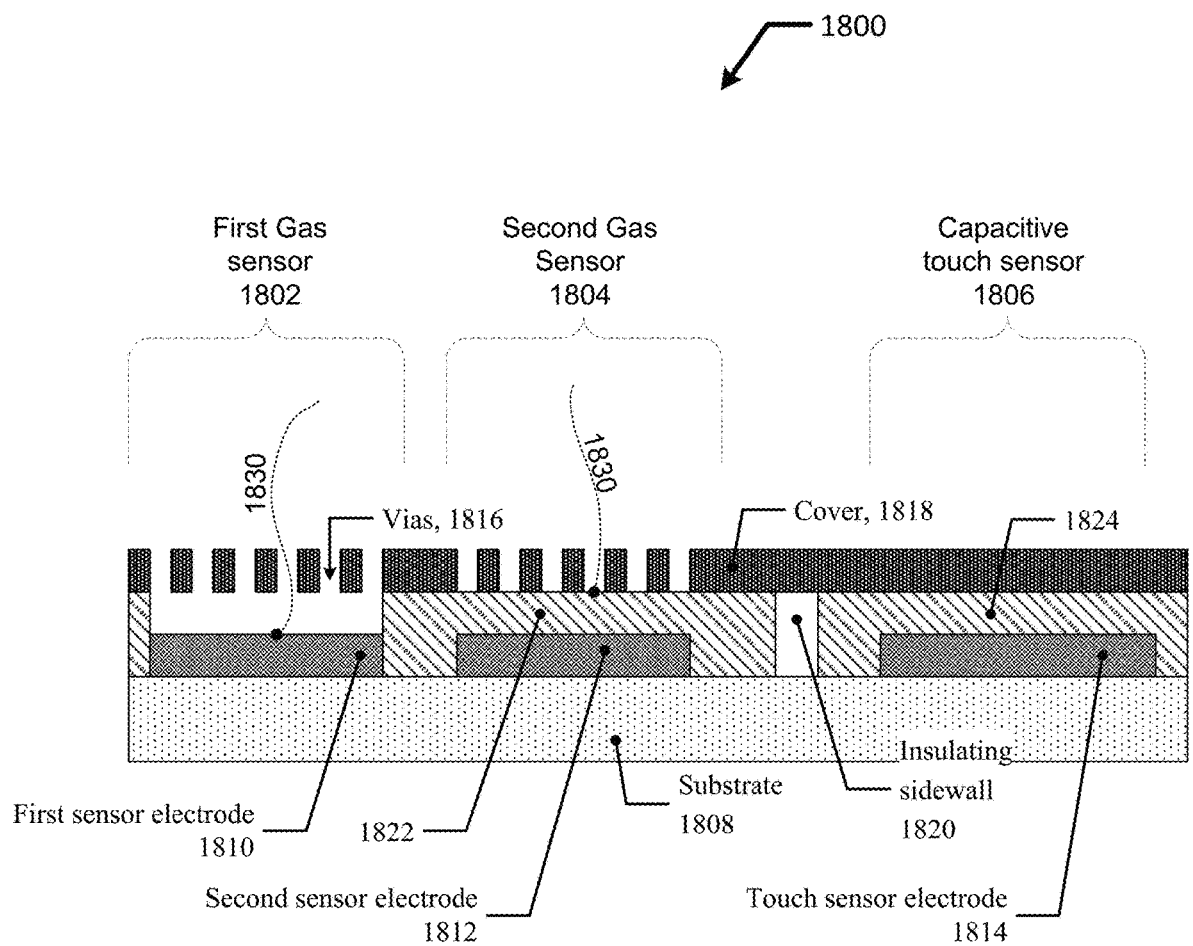
FIG. 18 depicts an atmospheric gas sensor that may be located on or associated with an IGU.

FIG. 18 depicts a cross-sectional view of an example atmospheric gas sensor that may be located on an IGU. The environmental sensor 1800 includes one or more first sensing units 1802 and one or more second sensing 1804 units disposed on a substrate 1808. A cover 1818 may be disposed over the first and second sensing units to protect sensing units from large particles. Vias 1816 in the cover allow chemical particles 1830 to pass and be detected by the sensing units. The first sensing unit 1802 senses chemical particles when particles pass through the vias 1816 and adhere to the first sensor electrode 1810, changing the electrode's resistance. The second sensing unit 1812 has an insulating layer 1822 between the second sensor electrode 1812 and the cover 1818 and senses a capacitance change when chemical particles pass through the vias and adhere to the insulating layer 1822. In some embodiments, the environmental sensor is also integrated with a capacitive touch sensor 1806, where the insulating layer 1824 between the touch sensor electrode 1814 may be the same material as the insulating material used for the second electrode 1822. In some cases, insulating layers used for a capacitive touch sensor and a second sensor unit 1822 and 1824 are deposited during the same operation. In embodiments where a touch sensor is integrated with an environmental sensor, an insulating sidewall 1820 is used to prevent the chemical particles from diffusing into the region near the touch sensor electrode 1814. Electrodes for the first and second sensing units may be made from materials such as Graphene, Carbon Nano Tube (CNT), Silver Nano Wire (AgNW), Indium Tin Oxide (ITO), etc. In some cases, the same material used for a transparent conductive layer in an electrochromic device can be used as for an electrode of the sensing unit or the touch sensor.

In some embodiments, an environmental sensor may be located on an interior surface or an exterior surface of an IGU. The sensor units may be very small such that even if they are made with opaque materials they can still be inconspicuous. For example, the area of the first sensor electrodes and/or the second sensor electrodes may be between about 1 µm and about 10 µm, or in some cases between about 10 µm and about 100 µm. In some cases, the substrate of an environmental sensor may be located on or embedded in a lite of an IGU. In some embodiments, the sensor is fabricated directly on top of an electrochromic device, and in some cases, an environmental sensor may be integrated into a transparent display (e.g., an OLED display) as described herein where capacitive touch sensors provide a means accepting for user input of a GUI provided by the transparent display. In some embodiments, an environmental sensor may be fabricated separately from an IGU and then may be bonded or attached to the interior surface, the exterior surface, or the frame of an IGU. The sensor may be part of the window controller architecture; e.g., a window controller may be part of the window assembly. In some cases, sensors are located on or associated with on glass controllers which are described in U.S. patent application Ser. No. 14/951,410, titled "SELF-CONTAINED EC IGU" and filed on Nov. 24, 2015, which was previously incorporated in its entirety. In some cases, a sensor is located on a frame, mullion, or adjacent wall surface. In certain embodiments, sensors in mobile smart devices may be used to aid in window control, e.g., as inputs to window control algorithms when sensors are available in smart devices also having window control software installed.

When installed, an environmental sensor is electrically connected to a window controller or another controller having logic for collecting and processing data from the first sensing unit(s), the second sensing unit(s), and/or capacitive sensor(s). When located on an IGU, an environmental sensor may be electrically coupled to a controller via conductive lines on the surface of a lite that connect to a pigtail connector. As described elsewhere, pigtail connectors provide a plug interface for electrically connecting a window controller to an electrochromic device, window antennas, and/or other sensors and electrical components of an IGU.

An environmental sensor may have a high sensing performance and be able to discriminate between various gas pollutants. For example, the first sensing unit may be reactive to first and second particles, while the second sensing unit may be reactive to second and third particles but not the first particles. In this example, the presence of each of the first, second and third types of chemical particles in the air can be determined by evaluating a sensed response from the first sensing unit(s) in combination with the second sensing unit(s). In another example, if a gas sensor has cross-sensitivity to a plurality of gasses, it may be difficult to determine what gas is being detected from a single type of sensing unit. For example, if the first sensing unit has a strong sensitivity to chemical A but is less sensitive to chemical B, the sensing logic may be unable to determine whether chemical A is present in a low concentration or chemical B is present in a high concentration. When a second sensing unit is also used and has a different sensitivity to chemicals A and B (e.g., being more sensitive to chemical B than to chemical A), then gas sensing logic may be able to discriminate between the gasses. If the second sensing unit is located adjacent to the first sensing unit, it may be assumed that the concentration of a sensed gas is similar at both units, and then the sensitivity difference of the two units may be used to discriminate between the two or more chemicals. In some cases, there may be three or more types of sensing units on an IGU which may be used by sensing logic to discriminate between air pollutants. In some cases, an IGU may have multiple gas sensors to compensate for sensor drift or instabilities.

Advanced Network Architectures

Figures 19A, 19B, 19C:
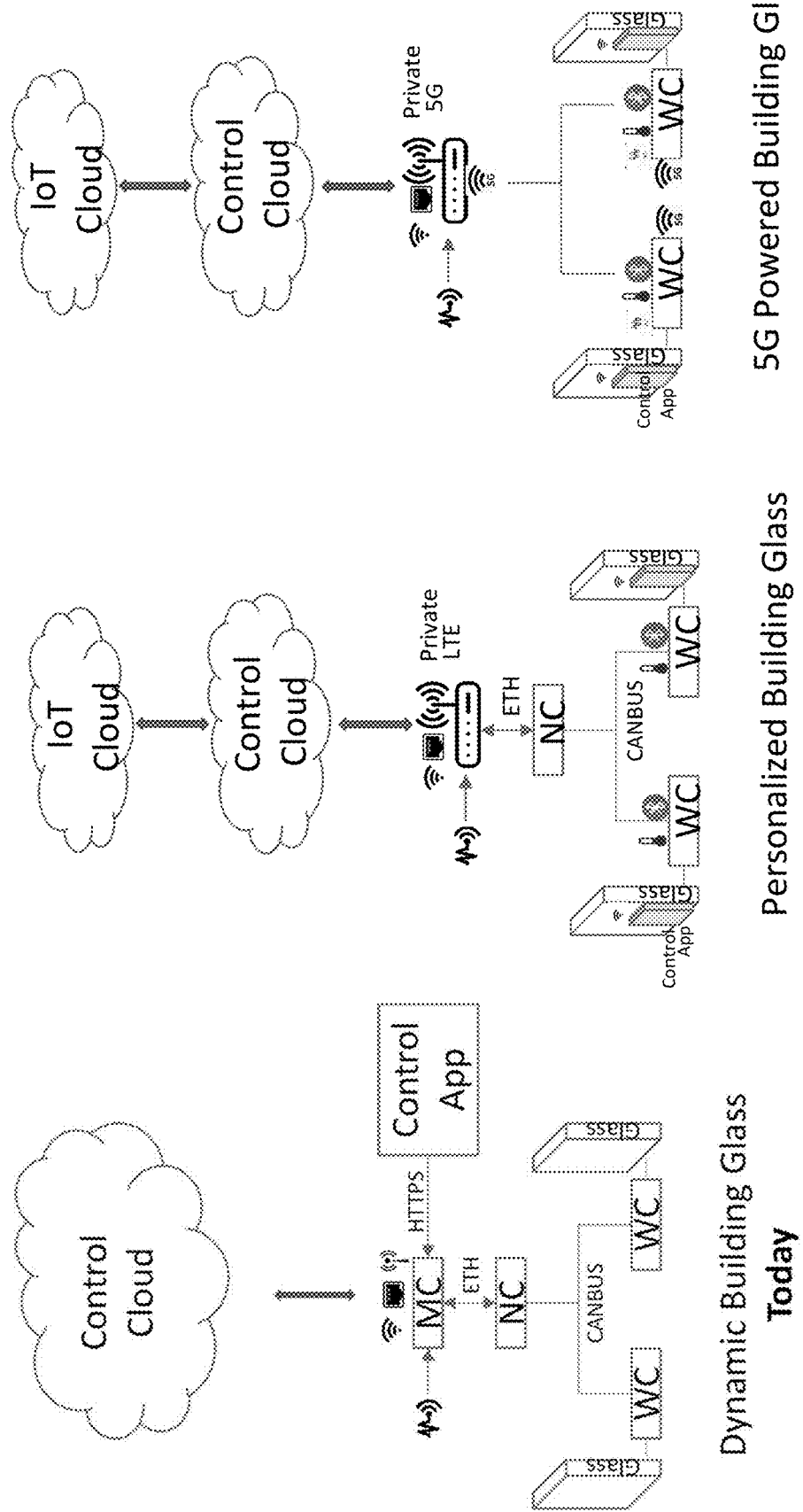
FIGS. 19a-19g depict network architectures that may be used by the window control system.

FIG. 19a depicts the network architecture of current and commercially available window control systems. Each EC window has a window controller (WC), which in turn communicates with a network controller (NC), which in turn communicates with a master controller (MC). Communication and control can be done wirelessly, via a mobile app and/or via the cloud. Power is provided to windows through a trunk line cabling system, which is modular and has a plug-n-play interface. In some cases, EC windows are controlled based on sensor readings, e.g., based on the measured light intensities or based on measured temperatures. In some cases, windows are controlled via user input provided using the control application. In other cases, windows can be controlled based on the logic that considers the context, intensity, and angle of incident light. Once the desired tint level is determined, the drive commands tint the EC glass accordingly. In addition to automatic control based on local sensors an manual control provided through the control application, Applicant's operating system can take into account information provided by weather services, an occupant's physical location, and/or an occupant's schedule when determining the appropriate tint level for the window. Tint level adjustment may be performed in conjunction with indoor LED light luminosity & color adjustments and temperature control.

FIG. 19b depicts an embodiment having a proprietary cloud-based software that supports a window control network. The cloud-based software can store, manage, and/or process basic functions such as sensing light, sensing air, sensing water, applying proximity context, executing tasks, controlling peripherals and providing an open interface for other applications. Transparent displays on the electrochromic windows enhance the user experience by allowing users to interact directly with the glass, rather than using a mobile device or wall unit. By including atmospheric sensors (not depicted) controllers may analyze air, water, light along with the occupant's context and/or personal data to create a personalized user experience. Glass controllers can create mesh networks with other digital systems in the building including LED lights, HVAC, and air filters. The glass controllers can work in conjunction with these systems to keep an optimal ambient environment within the building and act as 'data wall' between indoor and outdoor environments. Proximity detection and user recognition that is sensed or provided by user input can trigger glass personalization. The glass network specific internet-hosted software interacts via the cloud with, e.g., commercially available IoT digital systems, such as Nest, FB, Predix, IBM Watson++, etc. to augment and create integrated glass functions, including end-to-end data security and an IoT LTE network. Further embodiments include, partner eco-system powered glass functions within their application like building automation apps (e.g., Honeywell, J&J controls), workplace apps (e.g., iOffice), service and ticketing apps (e.g., Service Now, personalization apps (e.g., IFTTT), IoT eco-system—asset tracking (e.g., Oracle IoT cloud), Smart Lighting (e.g., Bosch, Philips, GE), Digital Ceiling (e.g., Cisco) and the like.

Figures 19D, 19E, 19F:
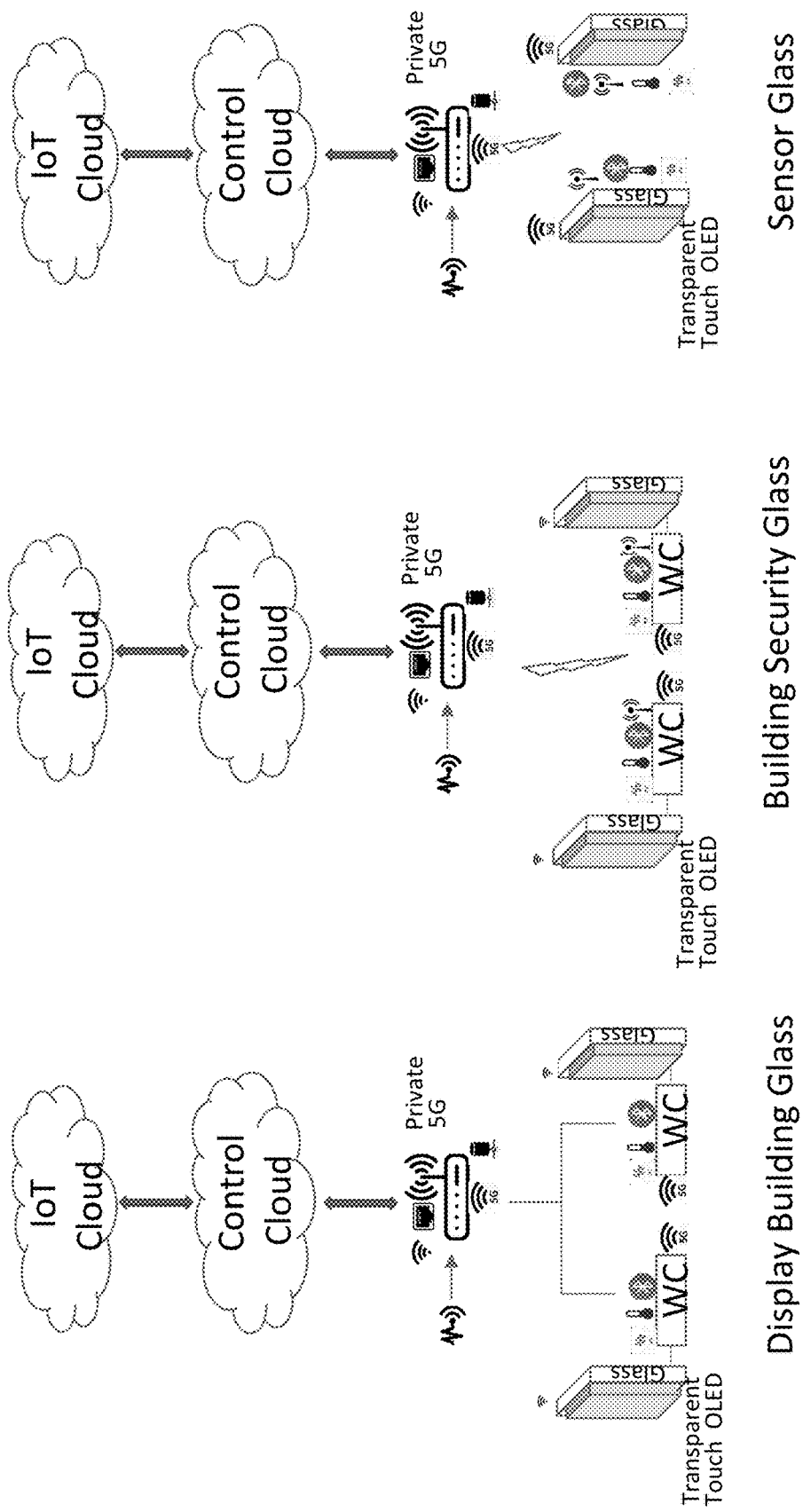

FIG. 19c depicts a network architecture where the electrochromic glass is 5G enabled. As in FIG. 19b, the EC glass includes on-glass control, e.g., transparent display controller on surface 4 (occupant side of the window) as depicted. FIG. 19d depicts the same architecture as in FIG. 19c, but in this case, the transparent display is large, substantially covering the viewable portion of the window on surface S4. This architecture may include, as in previous embodiments, auto personalization of glass upon proximity detection of the occupant, asset location tracking near the glass, etc. using, e.g., proximity and motion sensors. Having 5G network speed from glass to the cloud enables high bandwidth applications like full-HD display technology.

A full HD Display on (or as) the inner glass surface allows for various digital content to be displayed. Displayed digital content may include, e.g., signage, communication, a work collaboration space connected to a personal computer, or graphical user interfaces (GUIs) for controlling windows, sensors, or HVAC systems. In certain embodiments, e.g., in signage applications, there is a transparent LED Mesh on surface S1 (not depicted) displaying signage to those outside the building, while still allowing for occupants to simultaneously see out of the building. Adjusting the EC glass component of the system allows for contrast control for inward and/or outward projecting transparent display technology. In one embodiment, a two-way transparent display on, or as S4, is used both for inside occupant display as well as signage for those outside the building. In one example, office buildings windows are used for occupant needs (e.g., providing a display, providing control functions, and communication), during business hours, but used for external signage during non-business hours.

Having such capabilities greatly expands the utility and value of building windows/facades. In another example, some of the windows or areas of individual windows are used for signage, and simultaneously other windows or areas of individual windows are used for occupant display, communication and control functions.

In some embodiments, a controller such as a master controller in the network may include a CDN proxy for signage content for local playback. Any controllers of the window control system (e.g., a master controller, network controllers, and/or leaf controllers) may contain a 5G LTE network controller.

In some embodiments, the IGU is configured with an RF modulator module for Wi-Fi, GSM blocking/allowing. As depicted in FIG. 19e, this enables drone-safe buildings. As in previous embodiments, this architecture can include embedded sensors (BLE, RF, proximity, light, temperature, moisture, 5G) on, in, or around the IGU, as depicted in FIG. 19f. The IGU's window controller (e.g., an onboard controller) may be wirelessly powered (as illustrated by the lightning bolt in the figure). This enables plug & play intelligent glass powered over a 5G network.

In some embodiments, the transparent display and/or another transparent layer, includes photon cells (a type of photonic memory cell), which are capable of storing not only power (photovoltaic function) but also information. A network of photon cells can enable onboard control where the window controller logic circuit is configured as a transparent grid, thus allowing for "sensor glass." The transparent grid window controller can be self-powered and mesh with other windows in the network as a true plug and play system. The transparent window controller may or may not be integrated or part of the transparent display component. One embodiment is an electrochromic IGU with a transparent on pane window controller which receives power through photovoltaic cells.

Figure 19G:
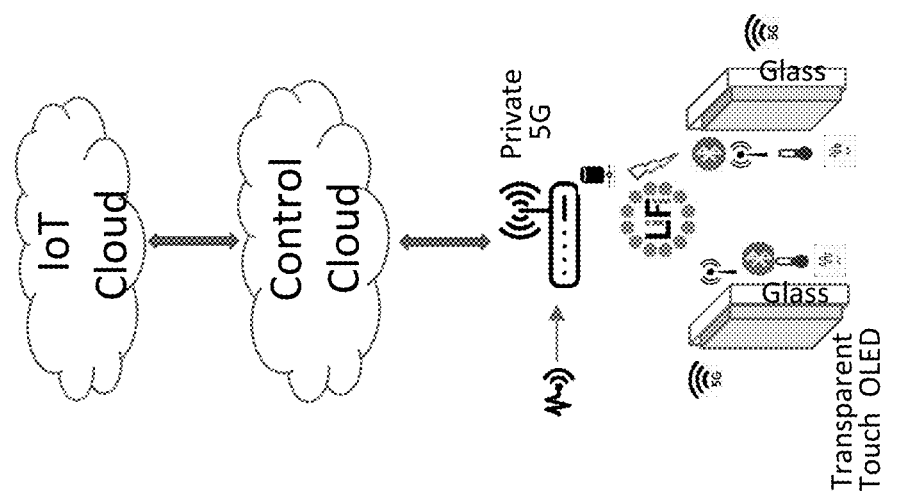

In some embodiments, the IGU is configured with Light-Fidelity (Li-Fi) wireless communication technology, as depicted in FIG. 19g. Light Fidelity is a bi-directional, high-speed and fully networked wireless communication technology similar to Wi-Fi. It is a form of visible light communication and a subset of optical wireless communications (OWC). In certain embodiments, Li-Fi is used as a complement to RF communication (Wi-Fi or cellular networks), while in some embodiments Li-Fi is used as the sole means of data broadcasting to and from the IGU. As Li-Fi carries much more information than Wi-Fi, it allows for virtually unlimited bandwidth for communication between the IGU(s) and the control system.

Using Li-Fi enables radio free buildings, e.g., to obviate occupant exposure to RF radiation. A Li-Fi powered glass network provides ultra HD to devices inside the building (including the transparent display component(s) of the IGUs described herein) paired with high-speed external radio networks.

Use Cases

The following description illustrates use cases associated with embodiments described herein. The description below may also include further embodiments. The architectures, configurations, hardware, software, etc. described herein allow for greatly expanded capabilities of building glass which therefore makes the building façade far more useful and valuable, e.g., not only to save energy, but also to increase productivity, promote commercial markets, and enhance occupant comfort and well-being. In the description below the term "the glass" may be used to mean the control network, the system architecture, the window controller, interchangeably, to simplify the description. One of ordinary skill in the art would recognize that, along with the hardware, software, network and associated embodiments described herein, that "the glass" means the appropriate systems needed to perform whatever function is described in the particular use case.

Proximity & Personalization:

The IGUs and glass control architectures described herein detect the proximity of the occupant near the glass (e.g., via a proximity sensor on the window controller) and control the ambient environment (e.g., window tint, lighting, HVAC of the area where the user currently is) to the occupant's preferences. For example, occupant preferences provided by the occupant or learned from previous encounters with the occupant can be stored by the window control system. The glass network can integrate with the BMS as well as the occupant sensor networks (e.g., Nest, Hue, SmartThings, as well as activity networks, e.g., IFTTT) and has a cloud-based intelligent rule engine (e.g., a glass IFTTT rule engine) for determining the right ambience parameters as well as actions and timing based on the occupant's activity.

Figure 20A:
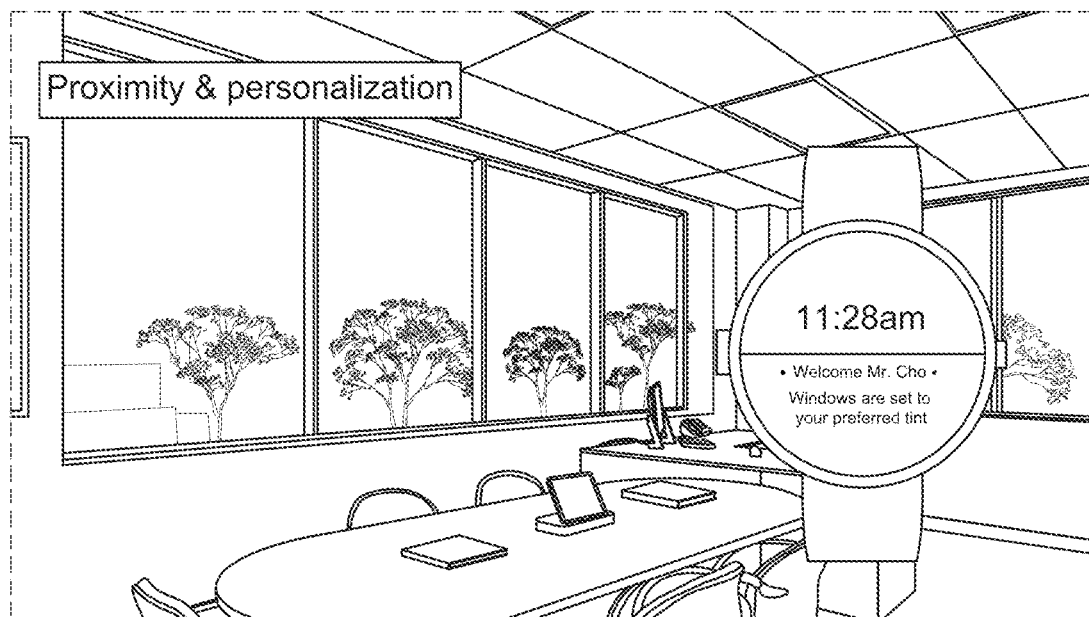
FIGS. 20a-20c illustrate example graphical user interfaces used in conjunction with proximity and personalization services implements on optically switchable windows.
Figure 20B:
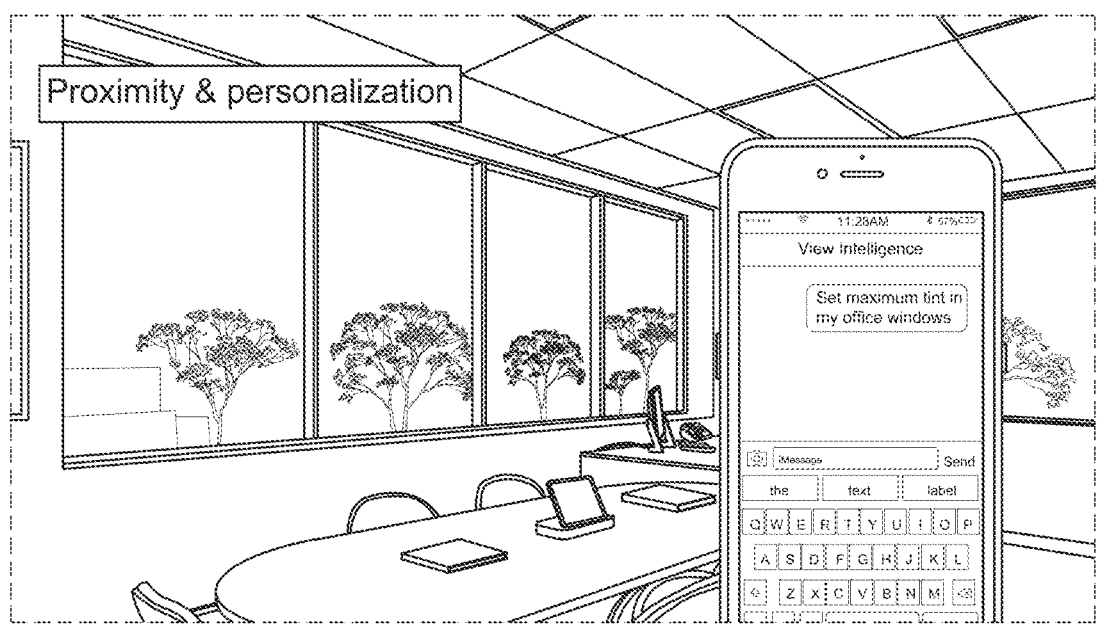
Figure 20C:
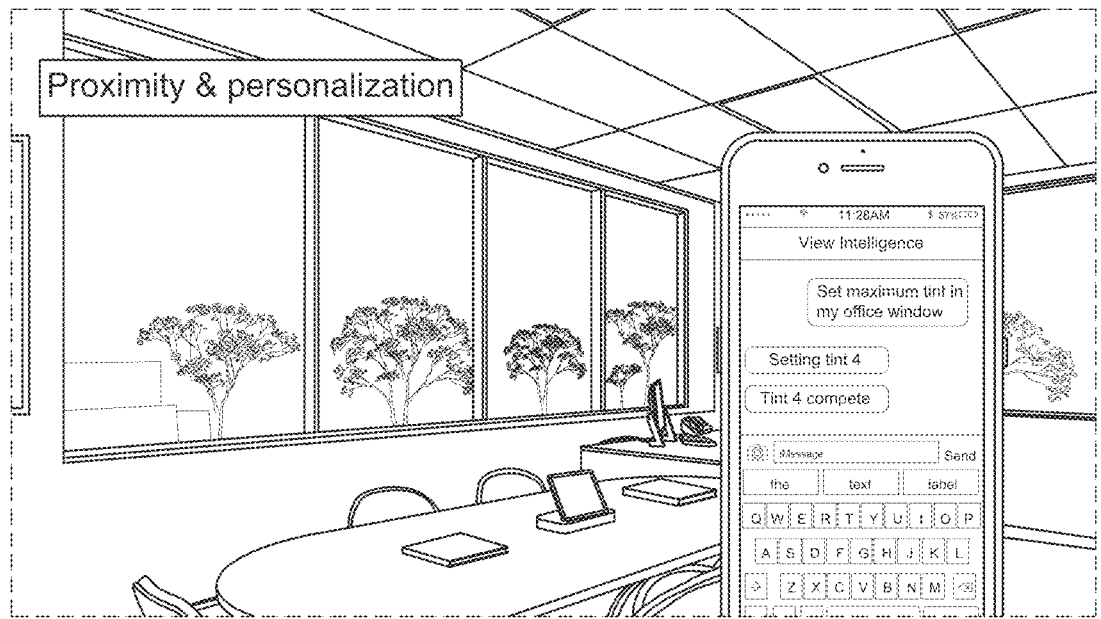

The glass provides a personalized communication channel across natural language voice commands and messaging bots (e.g., text messages, instant messaging, chat, email and the like) to get information about the ambient environment as well as set the ambient environment to the occupant's preferred settings. Full HD displays integrated into the IGUs enable these personalization channels to drive specific content on glass panel for enabling collaboration as well as communication. The glass is mapped to a building network, personal area network and IT-app context network cloud to drive seamless proximity and personalization to users. Some examples of proximity-based communication channels are illustrated in FIGS. 20a-20b.

Figure 21:
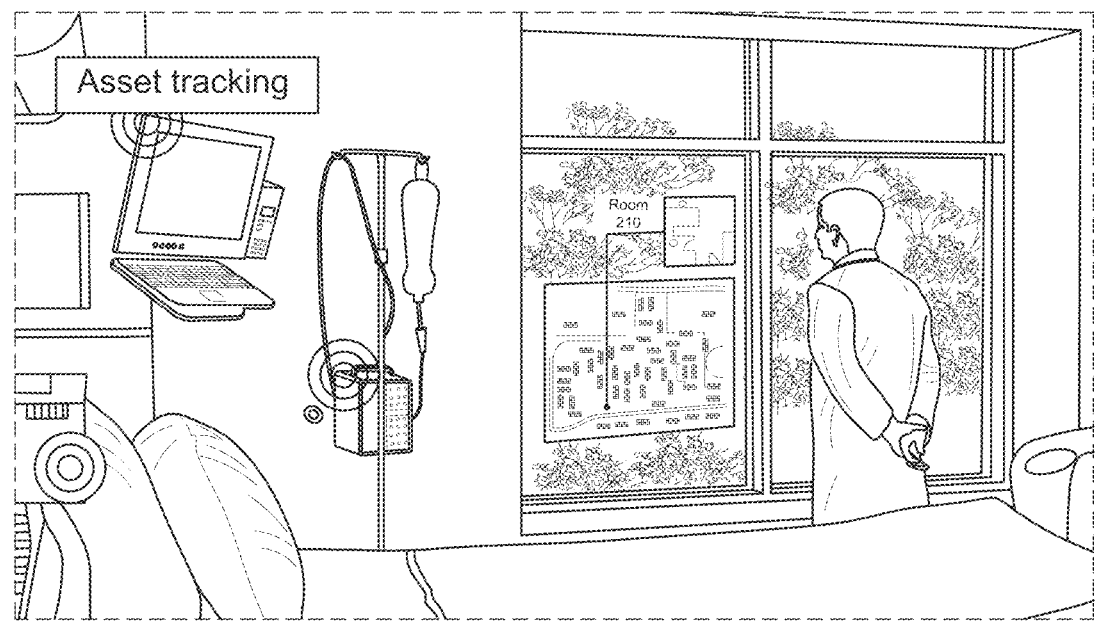
FIG. 21 illustrates a window with a transparent display configured for asset tracking.
Figure 22A:
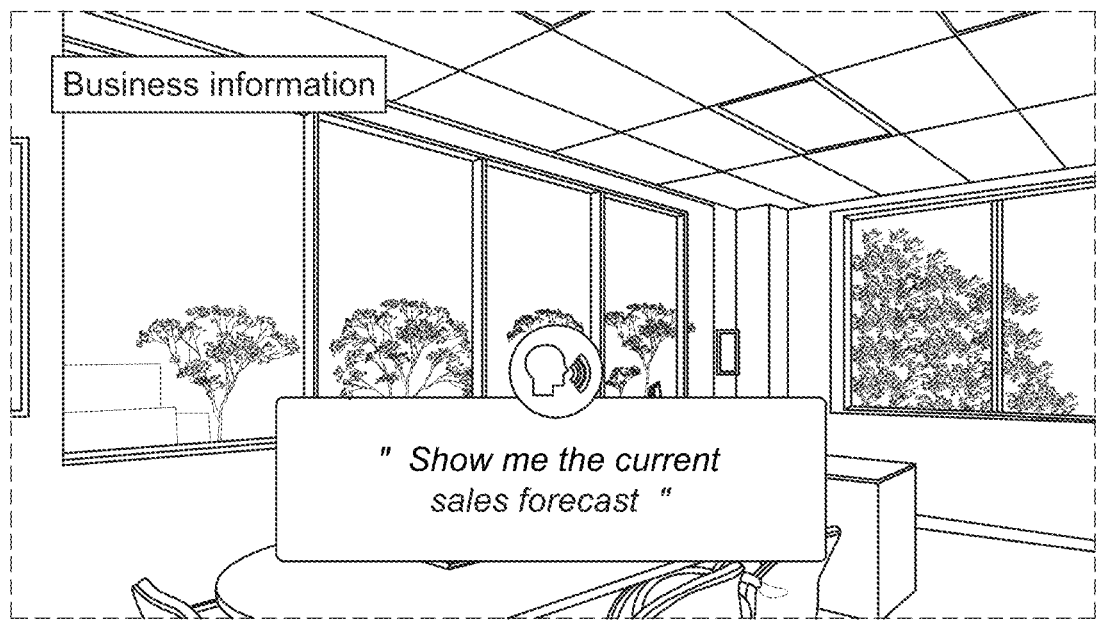
FIGS. 22a-22e depict windows with transparent displays used for business, collaboration, video conferencing, and entertainment purposes.
Figure 22B:
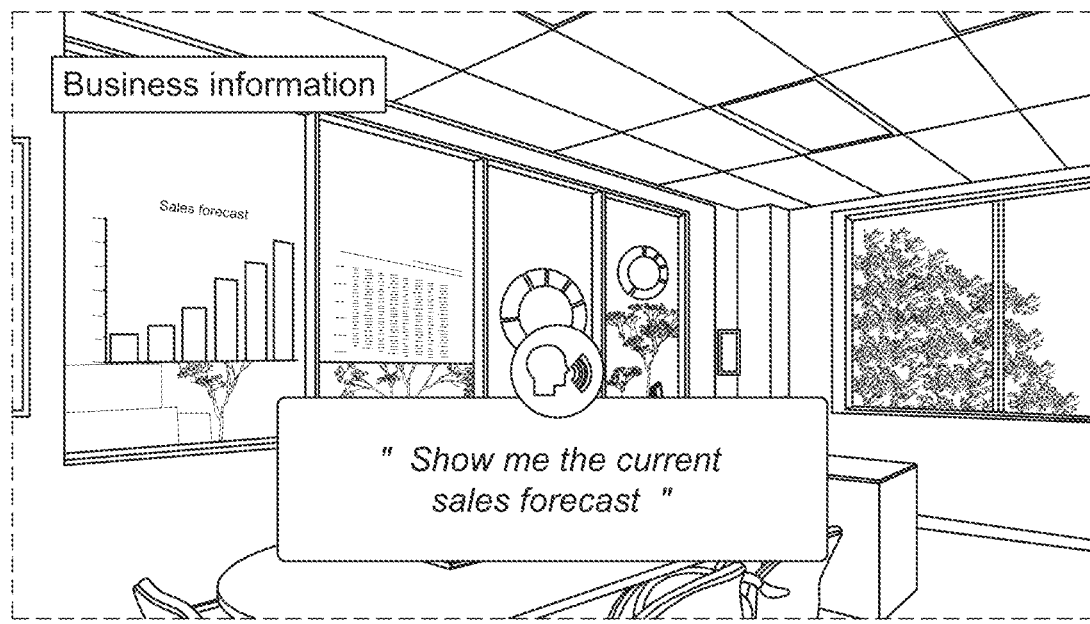
Figure 22C:
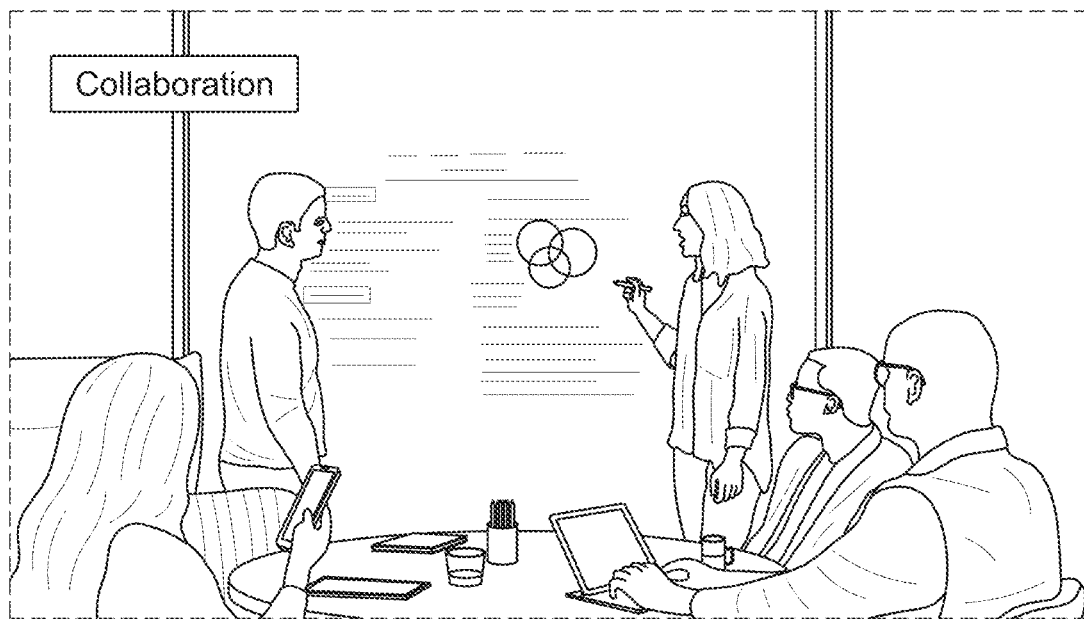
Figure 22D:
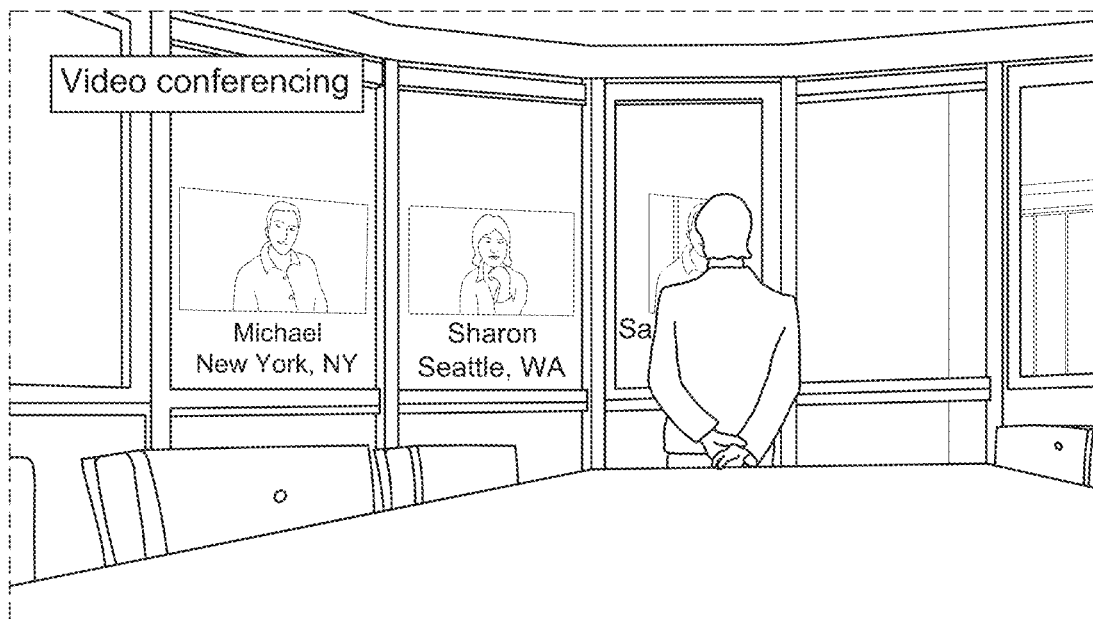
Figure 22E:
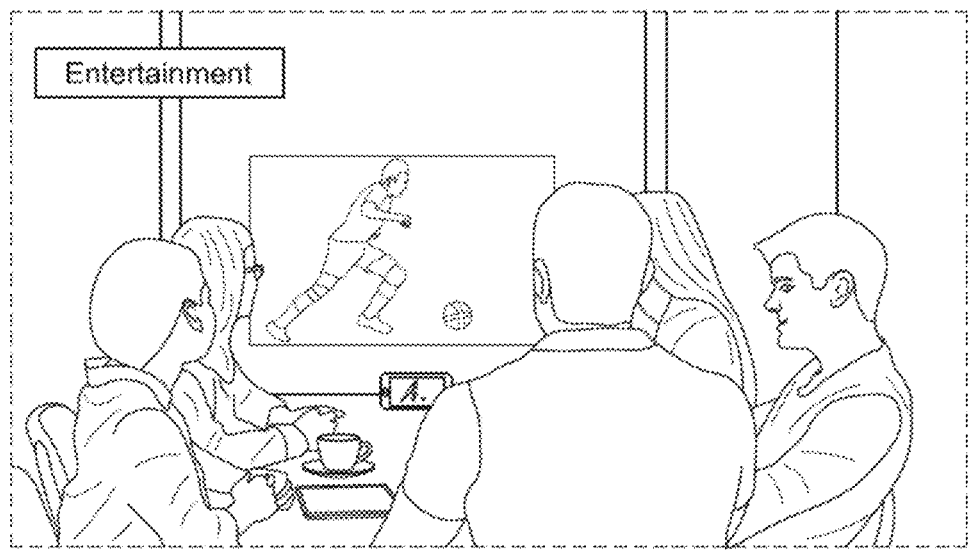

In another case, in a hospital setting, the glass can be programmed with a patient's care plan data. This is illustrated in FIG. 21. That along with sunlight information allows the glass to set the appropriate tint level of the glass, with or without augmentation by the transparent display component and/or interior lighting and HVAC, to create an ambient environment that is best suited for the patient's recovery. Moreover, the glass can change the ambient environment based on the visiting doctor's preferences, or a balance between what the doctor prefers and the patient needs. The doctor's visit may be scheduled, and thus the glass can make changes in anticipation of the doctor's visit or nurse's visit. The transparent display can be used by the medical practitioner to bring up the patient's medical records, order a prescription medication, confer with a colleague via video conference, display x-rays, play a pre-recorded presentation or tutorial for the patient, etc. The doctor may also use the glass to find and/or track assets, such as a crash cart or other medical supplies needed for the patient. The doctor may also use the glass to find a colleague, set up a meeting with the colleague or call the colleague to the patient's room for a consultation. In another example, the doctor may arrive at the patient's intended room before the patent and use the glass to identify where the patient is. For example, it may be the case that the patient has not left surgery, has been taken to the x-ray facility or for physical therapy, is in the lobby with family, or is in the nursery visiting their newborn baby. The doctor may use the glass to call the patient back to the room, or simply wish them well.

In another example, in an office setting, a meeting schedule may allow the glass to control the ambient in a meeting room, including appropriate light and heat levels, considering occupant's personal preferences as well as taking into account how many occupants will attend the meeting, if there will be a presentation, etc. The glass may automatically order lunch for the attendees based on their preferences (e.g., based on other apps that the glass interacts within the cloud) such as favorite foods, local restaurants, known food allergies, etc. Moreover, the glass may also automatically block telecommunications into and from the meeting room if the meeting is about highly sensitive matters. The glass can obviate the need for projectors and screens in the meeting room. The glass itself can be used as the presentation medium for displaying slide presentations, video conferencing, whiteboard functions having read/write capabilities and the like. In this latter function, using HD displays and high-speed communication protocols, the notes written on the glass can be simultaneously transferred to attendees personal computing devices, whether in the meeting room or remotely situated. The transparent display may, e.g., be enabled for a wide spectrum of colors for such note-taking. As seen from these examples, the glass becomes a "digital skin" of a building, serving as an environmental shield, a telecommunications hub, a productivity enhancement, etc. Some examples of transparent displays being used for business, collaboration, video conferencing, and entertainment are shown in FIGS. 22a-22e In another example, the glass can interact with other systems such as IBM Watson. In some cases, the window control system can use sensors for monitoring real-time building temperature or moisture data to create localized weather pattern data that can be pushed to the cloud. In some cases, this data can also aide in weather prediction, e.g., in collaboration with other buildings equipped with the glass. As illustrated in, e.g., FIGS. 22*a* and 22*b*, the glass may include a natural language translation system. Also, the glass has a cloud-to-cloud integration. This allows the transparent display to interact with an occupant's other apps, enabling collaboration and communication using a programmable rules engine. In this example, ambient light and temperature control are coordinated with the building's BMS, and buildings can interact with each other. For example, if a building on the west side of town encounters a rainstorm or cold front, this information can be communicated to a building on the east side of town, which can then adjust the HVAC and/or glass in anticipation of the storm or cold front.

Service Optimization:

Glass with transparent displays are listed as a digital asset in service management systems providing full-service lifecycle management during deployment and operations phase for seamless integration of the glass' operational management. This is achieved by integrating the glass' location and identification hierarchy into existing service lifecycle management clouds like ServiceNow.

Industrial Automation:

Glass equipped with a transparent display can be integrated into an industrial workflow automation cloud as an ambient control digital asset. The glass provides an interface for control and feedback into business operation workflow systems providing best ambient conditions for that workflow. For example, a tint level for an eye specialist's windows may be different than the tint level for a patient room and tint setting for an unoccupied patient room. In another example, an industrial process requires low lighting during a particular chemical processing phase due to the sensitivity of the reactants to light or heat. The tint level and/or UV blocking of the glass is adjusted to account for the sensitivity during that process flow or, e.g., in that part of the building where the flow is happening. During periods when the flow is not happening, the glass changes the ambient conditions for improved lighting or other desired conditions. In another example, the glass is typically in a dark tint in a computer server facility to reduce the heat load on the servers. If a server malfunctions, the occupant can be notified by the transparent display on the glass. The glass can display the location of the malfunctioning server to the service technician, and the system may clear the glass near the malfunctioning server to provide lighting for the technician during repairs or replacement of the server. Once the server is back online, the glass may adjust the proximate windows back to their tinted state to once again protect the servers from heat load.

Efficient Workplace:

The glass in a building (e.g., in conference rooms, cafeterias, common areas, executive suites, etc.) provides a distributed network digital nodes integrated into workflow applications like email, calendaring, messaging (IM, email, text, providing policy driven ambient control for workforce as part of their workday. When an occupant moves from a first room to a second room, items displayed via a transparent display to a user on in the first room may then be displayed to the user via the glass in the second room after authenticating the user. This allows users to easily access their own digital content while moving around the building.

Figure 23A:
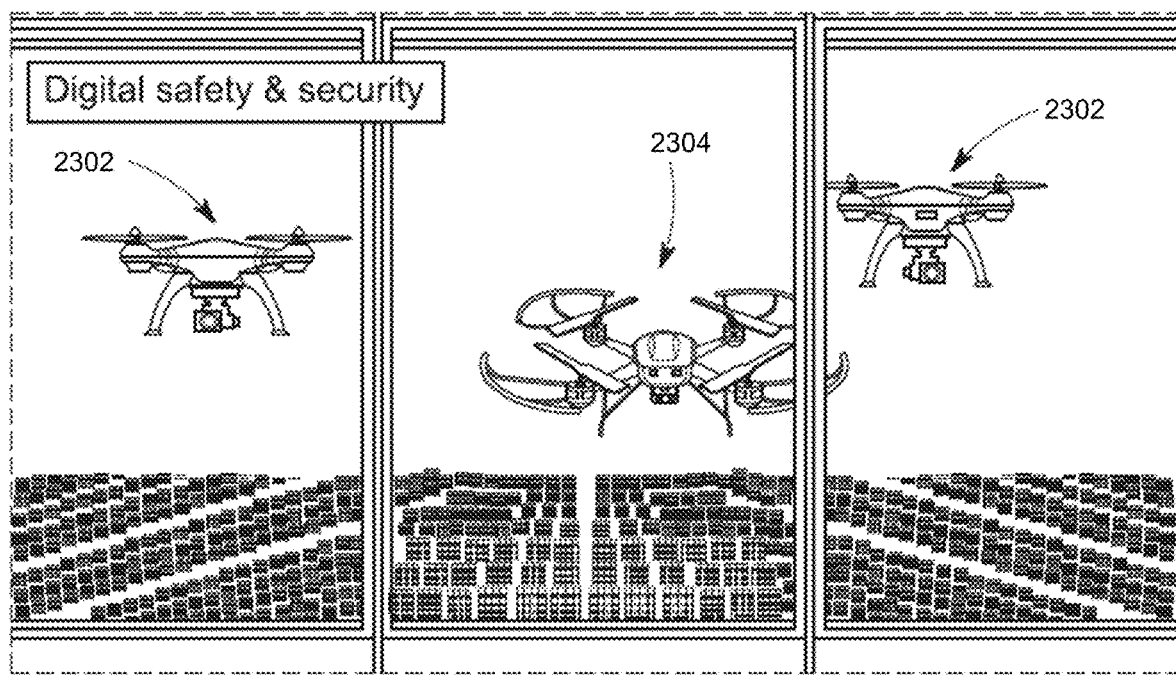
FIGS. 23a-23c illustrate a window network configured to selectively deter unauthorized drones from flying around a building via window tinting and wireless communication jamming.
Figure 23B:
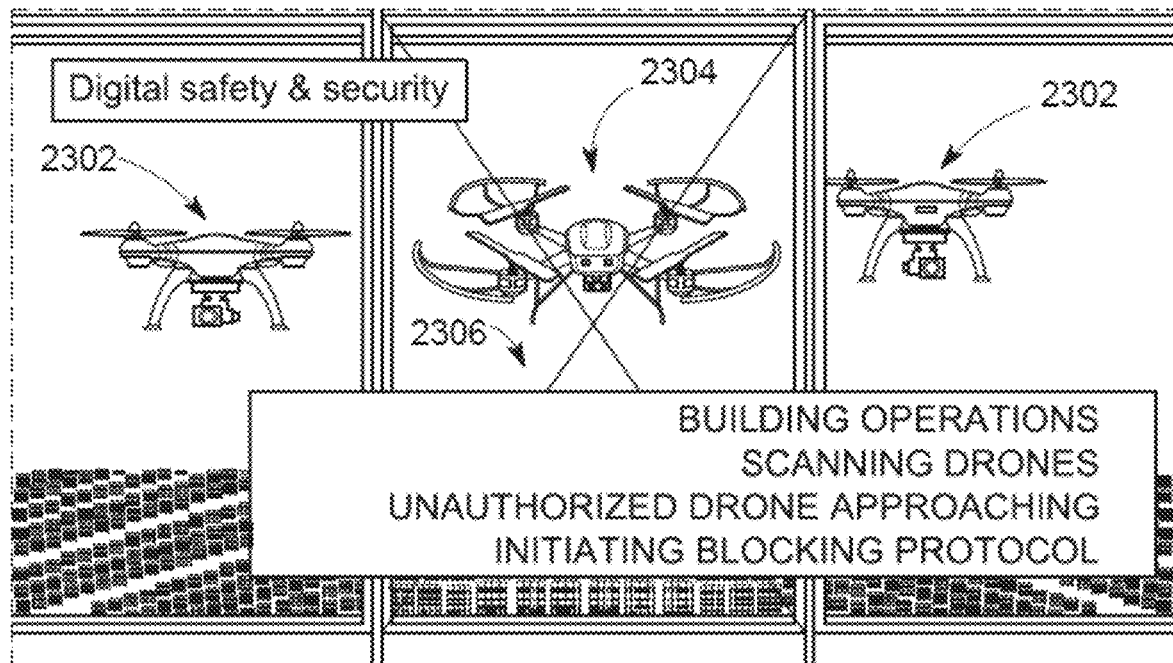
Figure 23C:
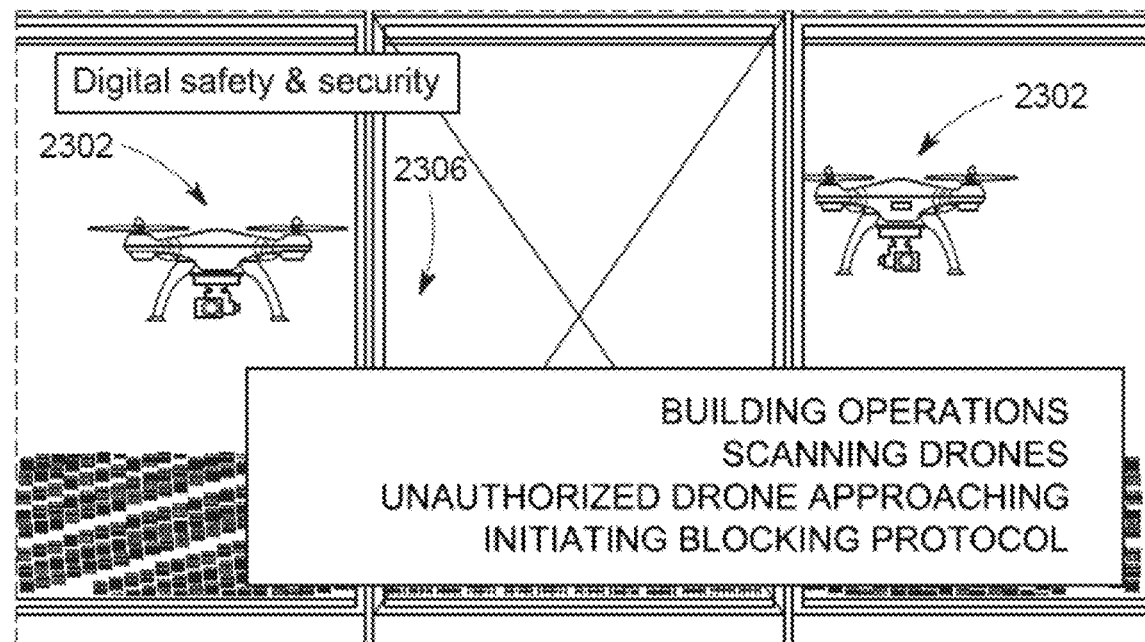

Glass Mesh Network:

The glass surface will serve multiple functions. In one embodiment the glass acts as a power generating membrane, e.g., transparent solar cells and/or photovoltaic cells convert sunlight into electricity for powering the glass. In another example, the glass serves as an RF grid, capable of receiving and transmitting omnidirectional RF signals based on configured policies. If photon cells are used, they can store information and/or power enabling a number of embodiments (e.g., self-powered windows, and wireless communication and power distribution networks). In some cases, digital security can be enabled via transmission of high-frequency RF waves around the building skin to protect against unwanted RF signals leaving the building (and hence data leakage) to any receiver outside building as well as seizing RF communication for external RF communication driven by drones and other UAVs. The glass can also trigger the blocking action via an automated drone gun integrated into the glass or, e.g. in a rooftop sensor of the building. FIGS. 23*a*-23*c* depict an interaction between glass and friendly drones 2302 and a non-friendly drone 2304. In FIG. 23*a* drones 2302 and 2304 approach the glass and drone 2304 is identified as hostile. This could be, e.g., because the drone is trying to transmit signals into the building and/or take pictures of the interior of the building. As depicted in FIG. 23*b*, the glass 2306 can darken to block visual penetration into the building and/or it can transmit RF signals to jam the drone's operation and knock it out of the sky. This drone defeating mechanism can be done selectively, as each window may have this capability. The glass can thus remove the offending drone while leaving the friendly drones to go about their work as shown in FIG. 23*c*.

Figure 24A:
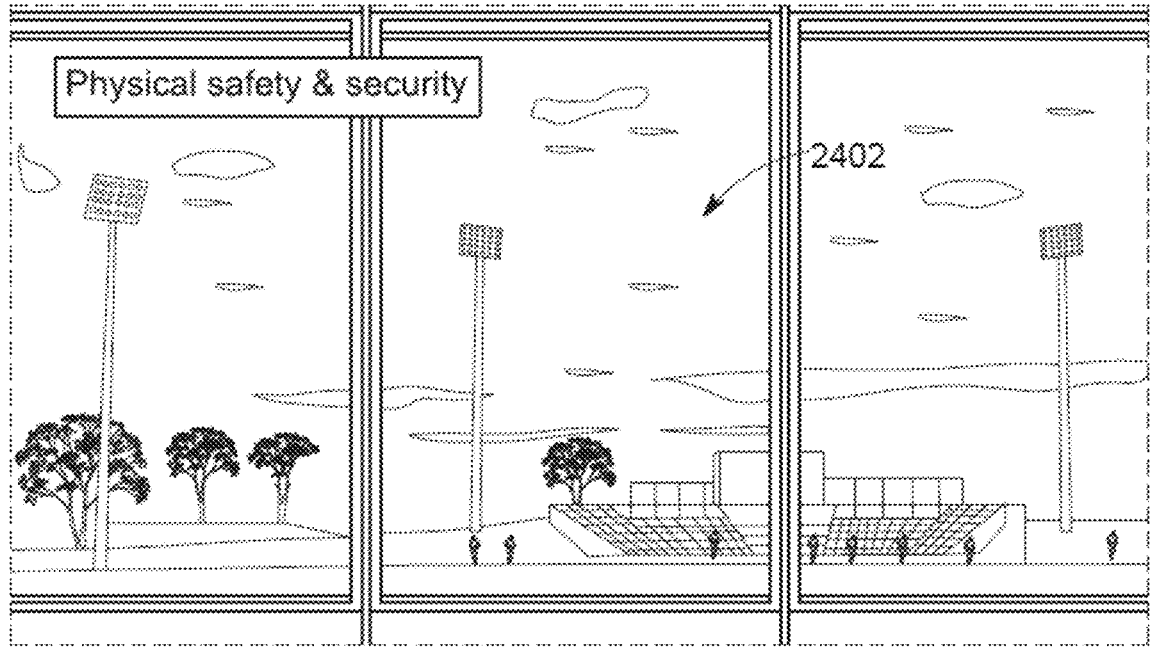
FIGS. 24a and 24b depict windows configured to detect security and/or safety threats.
Figure 24B:
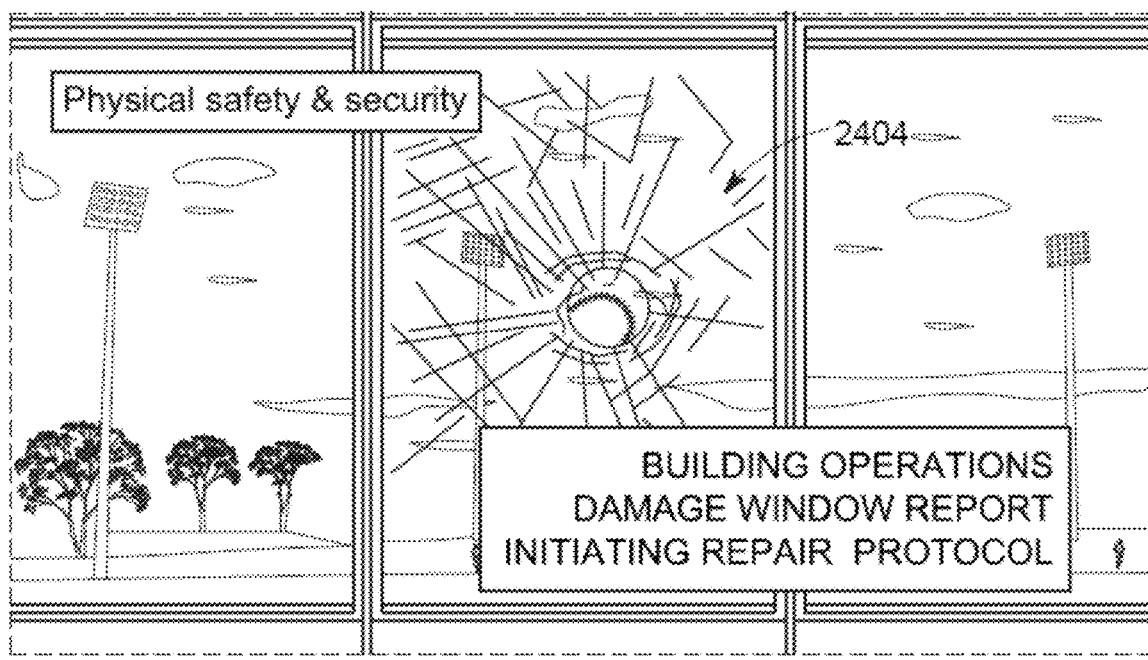

In some embodiments, the glass can also detect potential intruders outside the building. For example, at 3 am a sensor may detect one or more individuals outside a first-floor glass façade and alerts security personnel as to their presence, potentially averting an intrusion into the building. In another example, the glass automatically senses breakage and alerts a service technician that repairs are needed. This is illustrated in FIGS. 24*a* and 24*b*. In FIG. 24*a* an unbroken window 2402 monitors for a security or safety threat. In FIG. 24*b*, the now broken window 2404 is detected, and appropriate action is taken—in this case, a notification may be sent to a repair technician. Breakage may be detected by changes in current or voltage profiles of the electrochromic lite and/or the transparent display lite.

Figure 25:
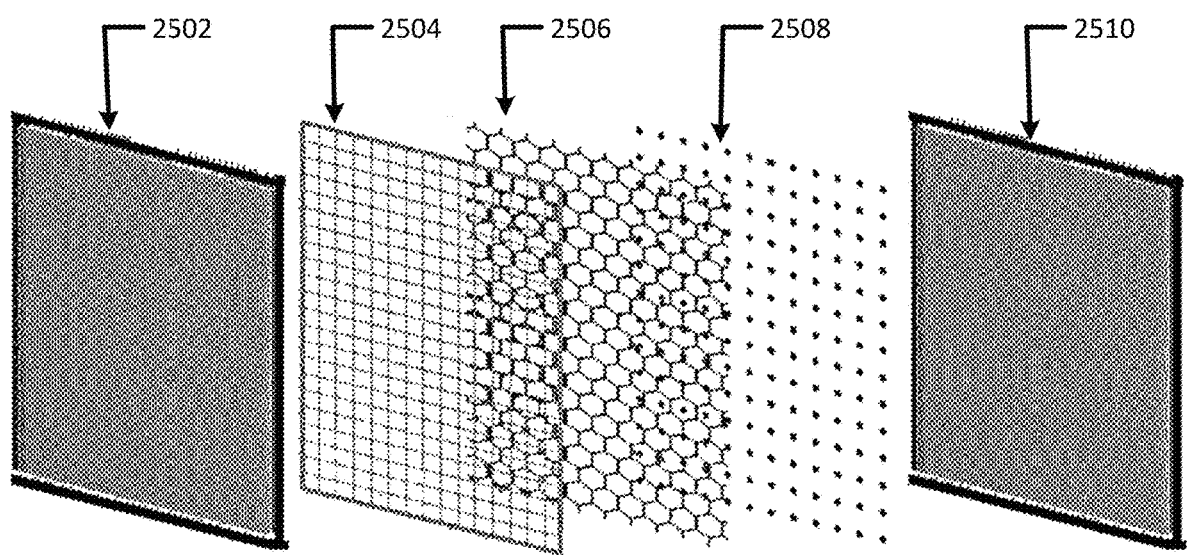
FIG. 25 depicts an exploded view of a window configured for RF communication and receiving solar power.

As described, the glass surface may serve multiple functions. In some embodiments, the glass acts as a mesh network that may be self-powered. In certain embodiments, a network of IGUs (windows) are powered by conventional wired power. In other embodiments, a network of IGUs is powered wirelessly, e.g., using RF powering. In yet other embodiments, a network of IGUs is self-powered, using PV and/or photon cells. FIG. 25 depicts an exploded view of an IGU having a first lite 2502 (e.g., having an EC device coating), a solar panel grid (PV) 2504, an RF antenna grid 2506, a grid or layer of photon cells 2508, and second lite 2510 (e.g., having a transparent display thereon). Some embodiments may not include transparent display technology. Layers 2504, 2506, and 2508 can be located on separate substrates within an IGU, or can be deposited on the interior or exterior surface of lite 2502 or lite 2510. A photon cell array or grid is used as a memory device. A network of photon cells can enable onboard control where the window controller logic circuit is configured as a transparent grid, thus allowing for "sensor glass." Thus with photon cells, a transparent grid window controller is realized. In this embodiment, the transparent grid window controller is self-powered and meshes with other windows in the network of IGUs. A transparent window controller may or may not be integrated or part of a transparent display component. In some embodiments, the photon cell grid supplies sufficient power for the control functions of the electrochromic glass, but in other embodiments, as depicted, a PV array augments the photon cell grid. The RF antenna grid, capable of receiving and transmitting omnidirectional RF signals based on configured policies, allows for communication between IGUs and meshing functions.

Figure 26A:
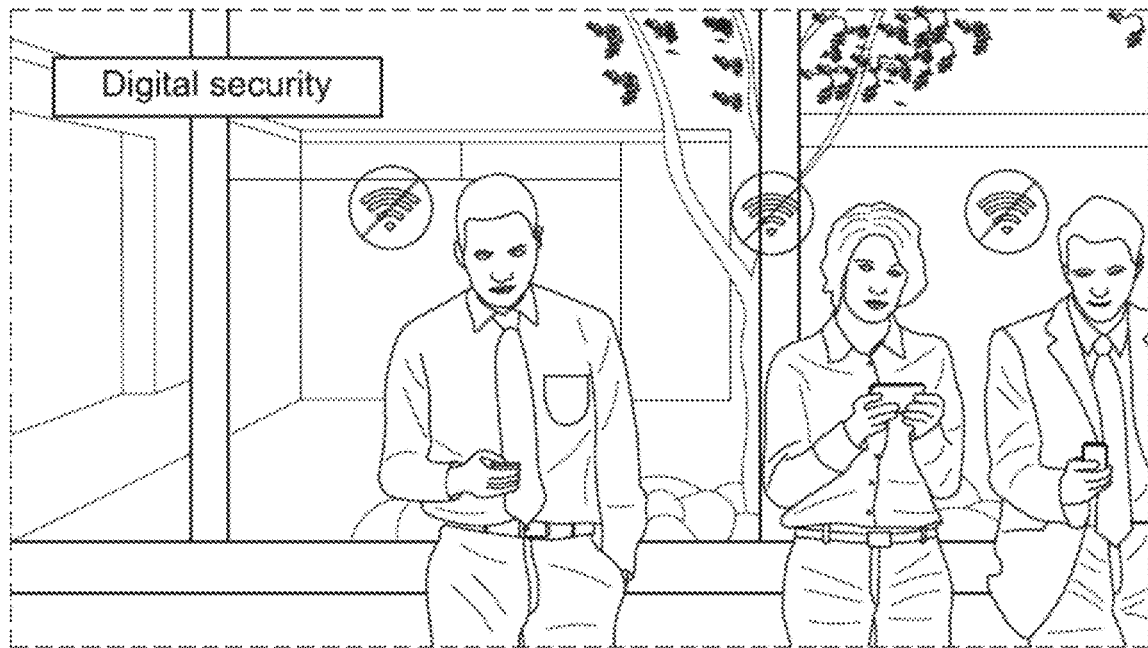
FIGS. 26a and 26b illustrate how windows can be configured to provide or block RF communication.
Figure 26B:
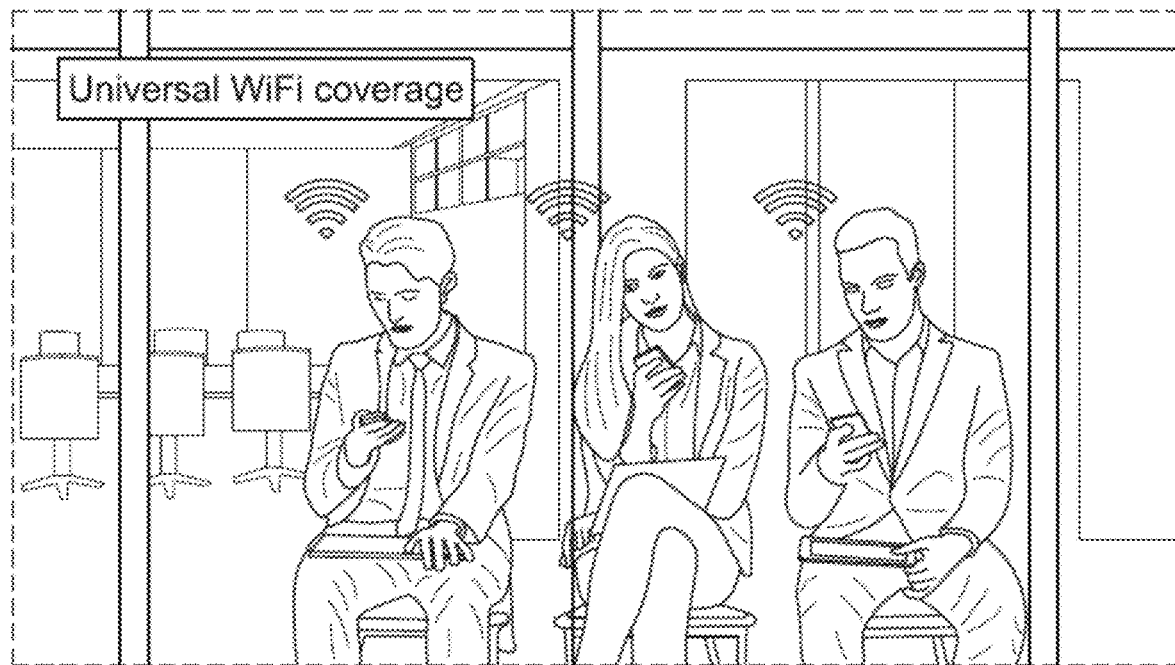

Radio Transmission & Receiver:

Policy and event-driven firewalling allowing and blocking of RF signals between exterior and internal building environments. For example, the glass can provide a full GSM, Wi-Fi spectrum coverage for building occupants. Blocking internal Wi-Fi network coverage outside the building. This is illustrated in FIGS. 26a and 26b. In FIG. 26a the windows of a building are used to block devices located outside the building from being able to connect to the buildings Wi-Fi network. In FIG. 26b, the glass of a building is used to provide a wireless network within a building.

The table provided in FIG. 27 shows a number of configurations where an electrochromic window, with or without transparent display technology, can serve as a signal blocking device and/or transmitter, e.g., a wireless communication repeater that optionally can also block signals from entering the interior of a building with IGUs so configured. The asterisk in the table indicates alternative positions for a ground plane.

Figure 28:
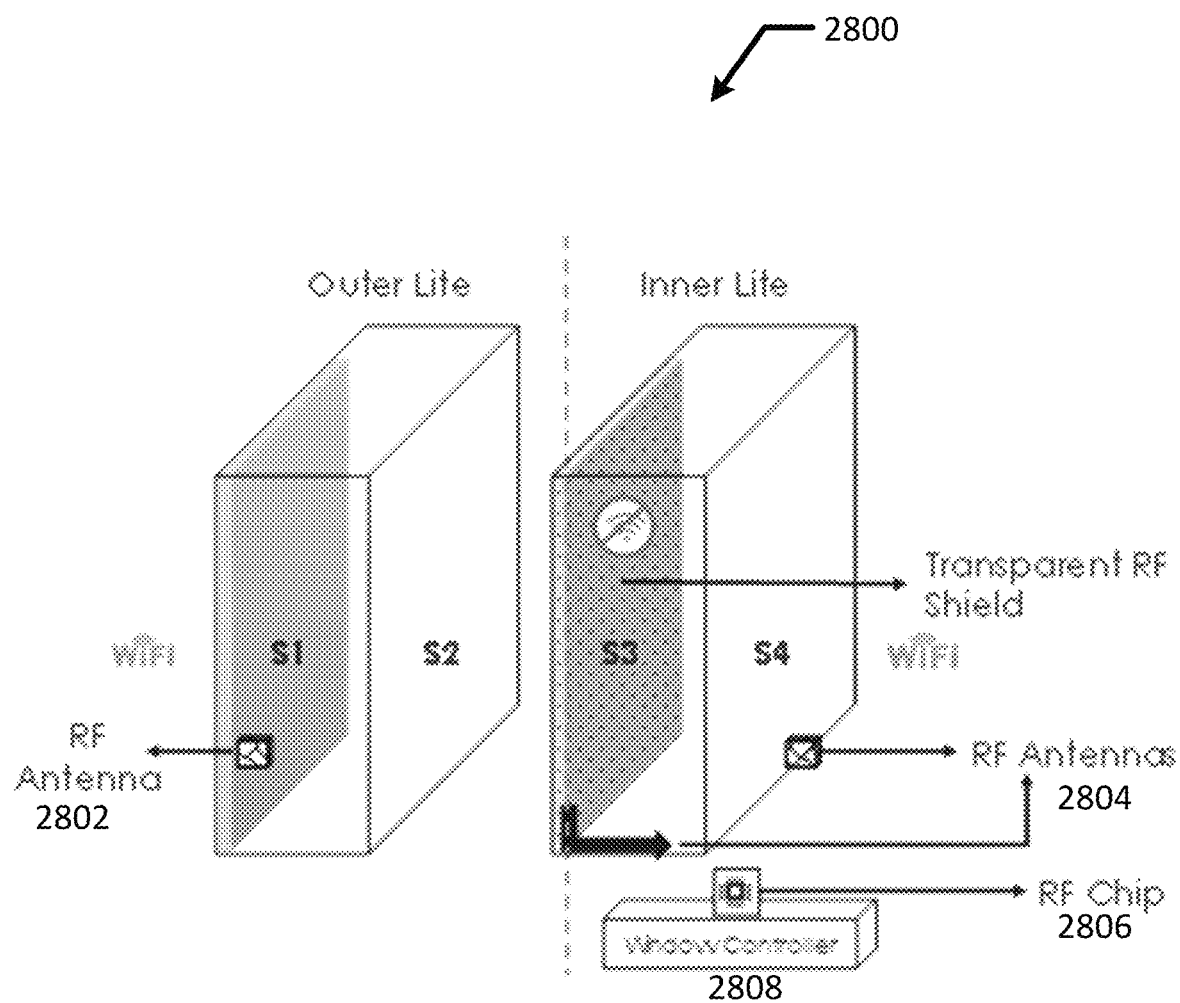
FIG. 28 illustrates a window that acts as Wi-Fi passive signal blocking apparatus as well as a Wi-Fi repeater.

FIG. 28 depicts an electrochromic IGU 2800 (or laminate) that may act as a Wi-Fi passive signal blocking apparatus as well as a repeater Surface 2 of the IGU 2800 has an EC device coating thereon (not shown). Selective exterior and interior radiating antennas (2802 and 2804) are patterned on S1 and S4, with a Wi-Fi signal processing RF chip 2806 as part of the window controller 2808. Surface 3 has a transparent RF shield (e.g., a ground plane that can be selectively grounded by the window controller). Therefore, this configuration can transmit and receive Wi-Fi communications and block incoming communications if desired.

In certain embodiments, the EC window controller also serves as an RF spectrum master configurator, i.e., controlling incoming and outgoing RF communications as well as meshing functions with other IGU controllers and/or network and master controllers. Antennas may be etched on transparent conductive coatings on one or more of the IGU's glass surfaces. For example, omnidirectional antenna(s) etched on S1 for exterior network coverage to transmit internally into a building, omnidirectional antenna(s) etched on S4 for internal network coverage transmitted to the external environment, and/or antenna(s) in and/or on mullions (window framing) providing full 360-degree coverage around glass of 'configured' spectrum & RF networks. Monopole or other RF antenna(s) can also be used in one or more of the aforementioned configurations. Such configurations provide blocking and repeater functions and optionally for selected spectrum channels. Window antennas are further described in PCT patent application PCT/US17/31106, filed May 4, 2017, and titled "WINDOW ANTENNAS," which is herein incorporated in its entirety.

Power Transmissions to Devices:

The glass' RF transmitter transmits high power beacon frames to authorized receivers providing continuous power over RF radio spectrum.

Asset Tracking:

The glass' sensors detect movement of radio powered devices within the vicinity of the skin of the building providing real-time location tracking mapped to access control or location policies ensuring un-authorized detection triggers an alert for remediation. As illustrated in FIG. 21, asset tracking can be useful in situations such as helping a doctor locate a patient or medical equipment. In some cases, on-demand asset location mapping clouds, such as the Oracle IoT asset tracking cloud, will now have enhanced visibility of asset movements with-in the perimeter of the building, because the skin of the building is now digitized with the glass. Additional method and examples of asset tracking are described in PCT patent application PCT/US17/31106, filed May 4, 2017, and titled "WINDOW ANTENNAS," which has previously been incorporated by reference.

Transparent Display on Glass:

A transparent light emitting diode screen can be etched on the exterior and/or interior surface of the glass powered by a remote display bus illuminating diodes for content getting served from cloud stored locally at CDN controller for smooth rendering and also providing local grid control for glass mesh network. This enables a number of capabilities for windows described herein. In some cases, transparent displays can provide on-glass tint control for the window as well as nearby zone panels, as well as ambient environment sensor readings and status of glass panel tint or other functions.

Figure 29:
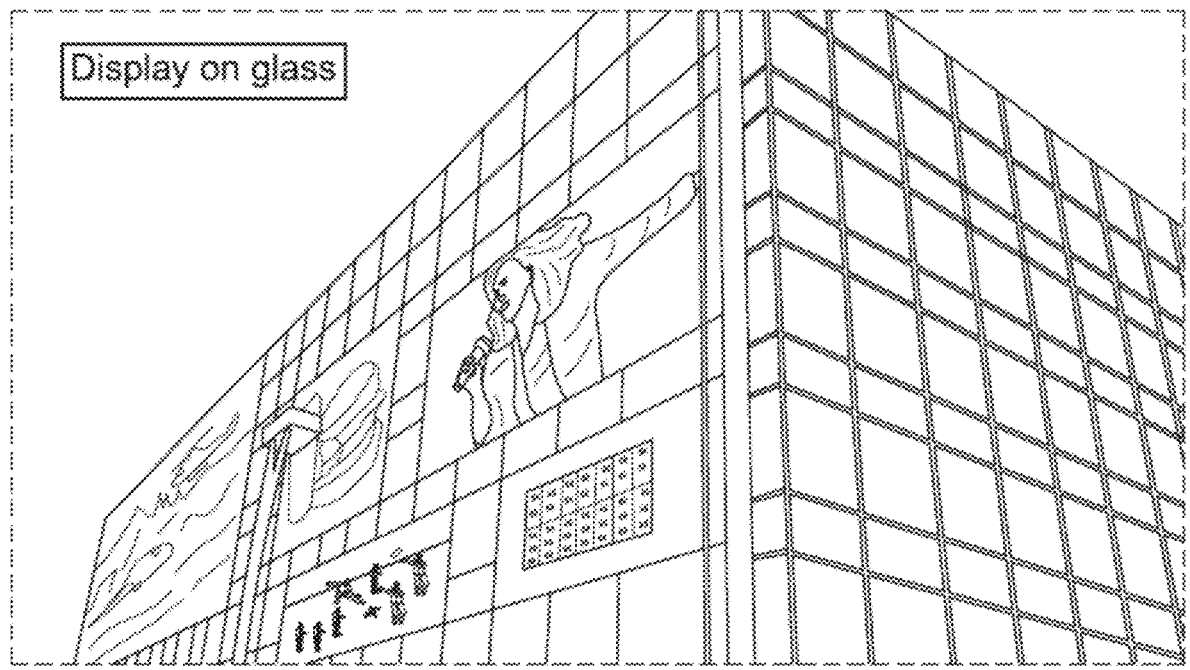
FIG. 29 depicts a building having windows with exterior facing transparent displays.

In some embodiments, external facing transparent displays, enable the exterior of the building to be converted into a building-size digital canvas. The exterior digital canvas can be used for displaying advertisements and other digital content as depicted in FIG. 29. In certain embodiments, the occupant's view of the outside is maintained even when the outside of the glass is used as a display. The occupant may also use the inside surface of the glass as a display. In some embodiments, an HD transparent display on or as the inboard lite is equipped with touch and gesture sensors or microphones for receiving user inputs—converting the surface of the glass into a digital whiteboard for impromptu ideation sessions, meetings, and other collaborative efforts. In some cases, a transparent display may be used a video conference pane, may display information from connected applications, or may provide entertainment (e.g., by pairing with and providing information from a user's personal device enabling over-the-air casting to the glass surface).

Glass Digital Twin:

Programmatic representation of the glass for applications to utilize the glass as a programmable surface allows various automated workflows. In some cases, content may be auto-scaled for best rendering on the glass based on the window's tint level. For example, a dynamic content management system can determine the best pixel transparency, depth, and color contrast for the content based on the ambiance surroundings of the glass panel. If, e.g., a car is parked outside the panel and reflects sunlight on the panel, the panel will need darker tinting to provide sufficient contrast to the transparent display. In some cases, standard programming constructs can be used for modeling glass into digital systems. This may be, e.g., based on the availability of standard models within application transport protocol headers. For example, HTTP/S allows for auto-detection of glass as the edge of the digital network thereby mapping the edge to standard templated operations allowed on the glass. An example is listed below.

```
<viewglass>
    <type:standard-panel>
        <function: tint>
        <level: 1-4>
        <default-state: 1>
    <type:display-panel>
        <function: external-led>
        <content-src: URL>
```

```
<display-resolution: UHD>
<tint-level: 1-4>
<brightness: 0-100>
<transparency: 0-100>
<default-state: display-logo>
<surface: 1 or 4>
<gesture: yes | no>
<gesture-type: touch | motion>
<sensors: yes | no>
    <type: temp | proximity | light | RF>
    <per-sensor-data-values>
</viewglass>
```

Figure 30A:
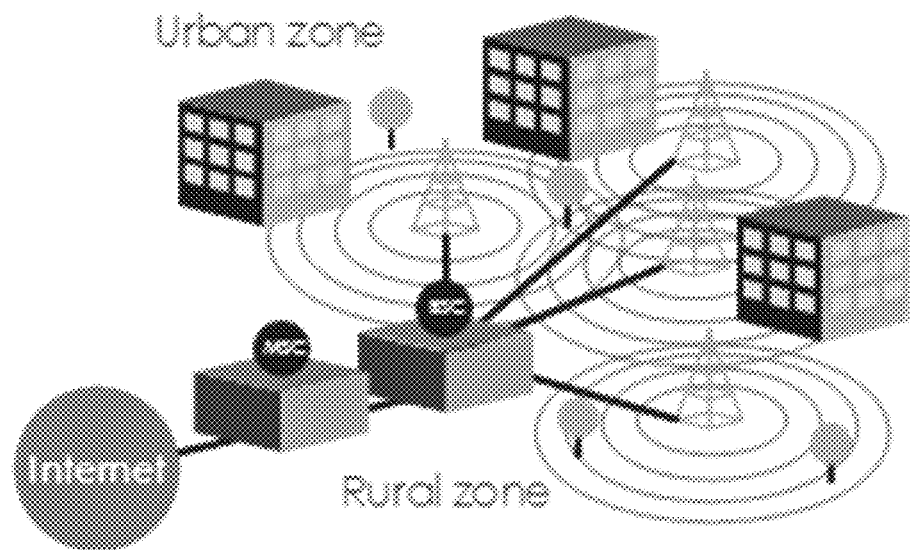
FIGS. 30a and 30b cellular infrastructures without and with the use of buildings equipped with windows for cellular communication.
Figure 30B:
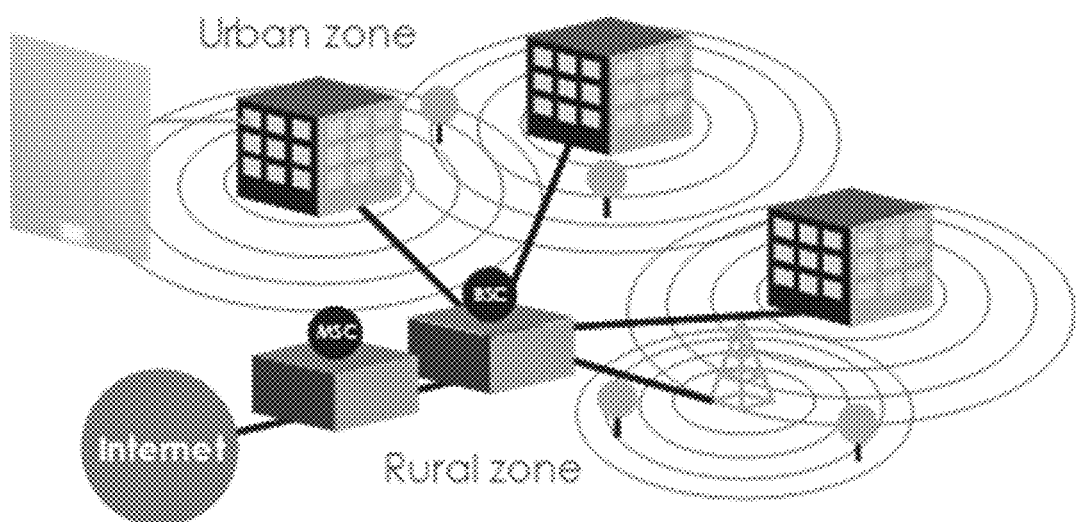

Cellular Communications:

As discussed, antennas with windows allow the glass to be used as a cell repeater, making buildings into cell towers (as well as boosters for cell traffic internal to the building). This, along with 5G capabilities as described, obviates the need for obtrusive cell towers, especially in urban areas. FIG. 30a depicts current cellular infrastructure. FIG. 30b depicts an improved cellular infrastructure that makes use of buildings having windows with antennas that can replace or work in conjunction with existing cell towers. Buildings equipped with such windows have the potential to greatly expand the coverage of cellular network in dense urban areas.

Glass Cleaning and Maintenance:

Sensors in or on the glass can, in some cases, detect dust level on glass and/or graffiti. In some cases, a window control system can inform a cleaning scheduling system to schedule cleaning once dust level has reached a threshold value, or when graffiti is detected. Windows described herein may have self-cleaning type coatings on the outboard lite to aid in maintaining clear views, such as titanium dioxide coatings that catalyze breakdown of organic contaminants and allow the rain to remove debris.

Figure 31:
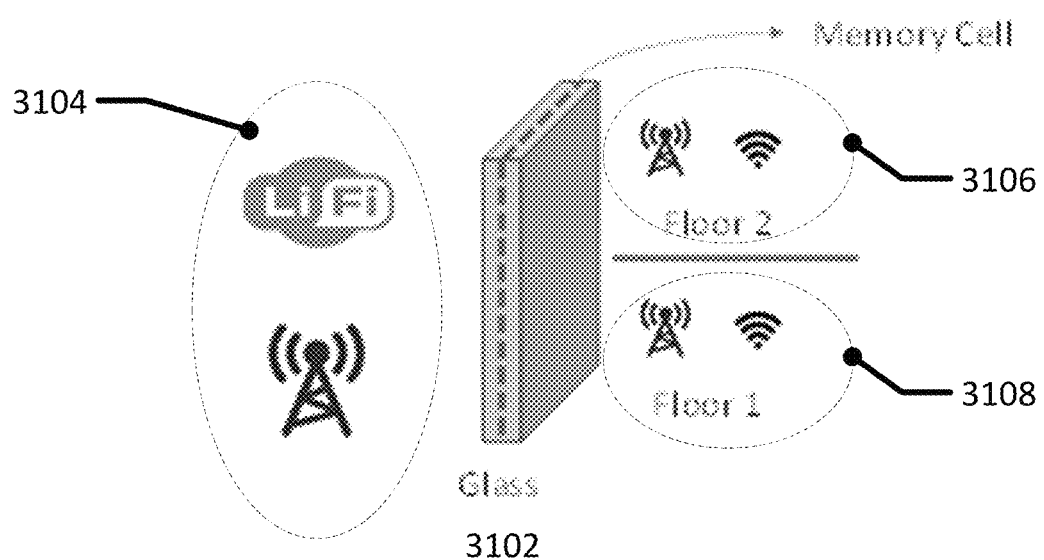
FIG. 31 depicts an optically switchable window configured as a bridge between one or more networks exterior to a building and one or more networks within a building.

Glass Façade for Data Storage (Memory) and Networks:

Since photon cells (sometimes called photon sensors) can store energy and data, and onboard window controllers or associated network or master controllers may have significant storage and computing horsepower, the building skin, the glass itself in the former example, can be used as data storage cells. Since large buildings may have tens or hundreds of thousands of square feet of glass on the façade, this can account for significant storage and/or computational power that can be used for purposes other than tinting the windows and displaying information. For example, besides data storage for a building occupant, the glass can be used as an external network providing connectivity to the internet or forming in-building intranets (e.g., on the side of the building, floor of the building, rooms in the building, etc.). This is illustrated in FIG. 31. The glass, 3102 can act as a bridge between an ultra-high speed external network 3104 to many intra-building high-speed networks 3106 and 3108 for voice, video and data communication. Moreover, by virtue of piezoelectric elements and/or PV cells, the glass can generate energy from the wind and or solar energy and supply power to the memory and/or network transmission infrastructure. In some cases, a window controller may have a battery for storing generated energy.

CONCLUSION

It should be understood that the certain embodiments described herein can be implemented in the form of control logic using computer software in a modular or integrated manner. Based on the disclosure and teachings provided herein, a person of ordinary skill in the art will know and appreciate other ways and/or methods to implement the present invention using hardware and a combination of hardware and software.

Any of the software components or functions described in this application, may be implemented as software code to be executed by a processor using any suitable computer language such as, for example, Java, C++ or Python using, for example, conventional or object-oriented techniques. The software code may be stored as a series of instructions, or commands on a computer-readable medium, such as a random-access memory (RAM), a read-only memory (ROM), a magnetic medium such as a hard-drive or a floppy disk, or an optical medium such as a CD-ROM. Any such computer readable medium may reside on or within a single computational apparatus, and may be present on or within different computational apparatuses within a system or network.

Although the foregoing disclosed embodiments have been described in some detail to facilitate understanding, the described embodiments are to be considered illustrative and not limiting. One or more features from any embodiment may be combined with one or more features of any other embodiment without departing from the scope of the disclosure. Further, modifications, additions, or omissions may be made to any embodiment without departing from the scope of the disclosure. The components of any embodiment may be integrated or separated according to particular needs without departing from the scope of the disclosure.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A system comprising:
    a transparent display configured to display information and/or images; and
    a tintable window, wherein:
        the tintable window comprises an electrochromic (EC) device including at least one layer of EC material that exhibits a change from one optical state to another as a result of reversible ion insertion into the EC material when an electric potential is applied across the EC device; and
        the transparent display is laminated to the tintable window and is disposed fully or partially coextensively with the tintable window.

2. The system of claim 1, wherein the transparent display comprises a transparent organic light emitting diode (TOLED) array.

3. The system of claim 1, wherein the tintable window comprises an insulated glass unit (IGU), the IGU comprising a first lite and a second lite.

4. The system of claim 3, wherein the first lite includes the electrochromic device and the transparent display is laminated to the second lite.

5. The system of claim 4, wherein the IGU is coupled with a framing system configured to support the IGU.

6. The system of claim 5, wherein the framing system is configured to facilitate disconnection of the transparent display from an electrical connection.

7. The system of claim 6, wherein the electrical connection includes a connection to a power source, a control system, a local controller, a controller of the tintable window, a controller of the transparent display, and/or a controller of the electrochromic device.

8. The system of claim 6, wherein the electrical connection includes a connection to the controller of the tintable window and a controller of the transparent display.

9. The system of claim 1, wherein the electrochromic device is all solid state and inorganic.

10. The system of claim 9, wherein the electrochromic device comprises tungsten oxide and nickel oxide electrode materials.

11. A method comprising:
displaying information and/or images on a transparent display, the transparent display being laminated to a tintable window having an electrochromic device, wherein:
the tintable window comprises an electrochromic (EC) device that exhibits a change from one optical state to another as a result of reversible ion insertion into the EC material when an electric potential is applied across the EC device; and
the transparent display is disposed fully or partially coextensively with the tintable window.

12. The method of claim 11, wherein the transparent display comprises a transparent organic light emitting diode (TOLED) array.

13. The method of claim 11, wherein the tintable window comprises an insulated glass unit (IGU), the IGU comprising a first lite and a second lite.

14. The method of claim 13, wherein the first lite includes the electrochromic device and the transparent display is laminated to the second lite.

15. The method of claim 14, wherein the IGU is coupled with a framing system configured to support the IGU.

16. The method of claim 15, wherein the framing system is configured to facilitate disconnection of the transparent display from an electrical connection.

17. The method of claim 16, wherein the electrical connection includes a connection to a power source, a control system, a local controller, a controller of the tintable window, a controller of the transparent display, and/or a controller of the electrochromic device.

18. An apparatus comprising at least one controller configured to:
display information and/or images on a transparent display, the transparent display being laminated to a tintable window having an electrochromic device, wherein:
the tintable window comprises an electrochromic (EC) device including at least one layer of EC material that exhibits a change from one optical state to another as a result of reversible ion insertion into the EC material when an electric potential is applied across the EC device; and
the transparent display is disposed fully or partially coextensively with the tintable window.

19. The apparatus of claim 18, wherein the transparent display comprises a transparent organic light emitting diode (TOLED) array.

20. The apparatus of claim 18, wherein the tintable window comprises an insulated glass unit (IGU), the IGU comprising a first lite and a second lite.

21. The apparatus of claim 20, wherein the first lite includes the electrochromic device and the transparent display is laminated to the second lite.

22. A building comprising:
a tintable window having an electrochromic device; and
a transparent display configured to display information and/or images, wherein:
the tintable window comprises an electrochromic (EC) device including at least one layer of EC material that exhibits a change from one optical state to another as a result of reversible ion insertion into the EC material when an electric potential is applied across the EC device; and
the transparent display is laminated to the tintable window and is disposed fully or partially coextensively with the tintable window.

23. The building of claim 22, wherein the transparent display comprises a transparent organic light emitting diode (TOLED) array.

24. The building of claim 22, wherein the tintable window comprises an insulated glass unit (IGU), the IGU comprising a first lite and a second lite.

25. The building of claim 24, wherein the first lite includes the electrochromic device and the transparent display is laminated to the second lite.

26. The building of claim 25, wherein the IGU is coupled with a framing system configured to support the IGU.

27. The building of claim 26, wherein the framing system is configured to facilitate disconnection of the transparent display from an electrical connection.

28. The building of claim 27, wherein the electrical connection includes a connection to a power source, a control system, a local controller, a controller of the tintable window, a controller of the transparent display, and/or a controller of the electrochromic device.

29. The building of claim 27, wherein the electrical connection includes a connection to the controller of the tintable window and a controller of the transparent display.

* * * * *